United States Patent
Maeda et al.

(10) Patent No.: US 11,652,198 B2
(45) Date of Patent: May 16, 2023

(54) LIGHT-EMITTING DEVICE INCLUDING WIRINGS IN GROOVE STRUCTURE

(71) Applicant: NICHIA CORPORATION, Anan (JP)

(72) Inventors: Rie Maeda, Katsuura-gun (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/589,896

(22) Filed: Feb. 1, 2022

(65) Prior Publication Data
US 2022/0158063 A1 May 19, 2022

Related U.S. Application Data

(62) Division of application No. 16/581,627, filed on Sep. 24, 2019, now Pat. No. 11,276,807.

(30) Foreign Application Priority Data

Sep. 25, 2018 (JP) .............................. JP2018-179258

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/36* (2013.01);
(Continued)

(58) Field of Classification Search
CPC ......... H01L 33/36; H01L 33/56; H01L 33/62; H01L 25/0753; H01L 2933/0016
(Continued)

(56) References Cited

U.S. PATENT DOCUMENTS

| 2001/0004134 A1 | 6/2001 | Saitoh |
| 2002/0050489 A1 | 5/2002 | Ikegami et al. |

(Continued)

FOREIGN PATENT DOCUMENTS

| JP | 2001-144035 | 5/2001 |
| JP | 2001-185845 | 7/2001 |

(Continued)

OTHER PUBLICATIONS

Requirement for Restriction and Election of Species issued by the U.S. Patent and Trademark Office for the parent U.S. Appl. No. 16/581,627, filed Jun. 28, 2021.

(Continued)

*Primary Examiner* — Matthew E. Gordon
(74) *Attorney, Agent, or Firm* — Mori & Ward, LLP

(57) ABSTRACT

A light-emitting device including a light-emitting module, a first wiring and a second wiring. The light-emitting module includes one or more light-emitting elements and a package covering the one or more light-emitting elements. Each of the one or more light-emitting elements has a first electrode and a second electrode. The light-emitting module has a groove structure on a lower surface side. The first wiring and the second wiring are partially or entirely present in the groove structure. At least part of the first electrode and at least part of the second electrode are exposed to an inside of the groove structure. The first wiring is electrically connected with the first electrode, and the second wiring is electrically connected with the second electrode.

7 Claims, 36 Drawing Sheets

(51) Int. Cl.
*H01L 33/56* (2010.01)
*H01L 33/36* (2010.01)
*G02F 1/13357* (2006.01)

(52) U.S. Cl.
CPC ........ *H01L 33/56* (2013.01); *G02F 1/133603* (2013.01); *H01L 2933/0016* (2013.01); *H01L 2933/0066* (2013.01)

(58) Field of Classification Search
USPC .......................................................... 257/79
See application file for complete search history.

(56) References Cited

U.S. PATENT DOCUMENTS

| | | | |
|---|---|---|---|
| 2012/0110839 | A1 | 5/2012 | Nishio et al. |
| 2015/0008019 | A1 | 1/2015 | Miura et al. |
| 2015/0008589 | A1 | 1/2015 | Suzuki et al. |
| 2015/0036317 | A1 | 2/2015 | Yamamoto et al. |
| 2015/0041181 | A1 | 2/2015 | Chujo et al. |
| 2015/0249069 | A1* | 9/2015 | Yoshida ................ H01L 33/505 257/89 |
| 2016/0366768 | A1 | 12/2016 | Matsuda |
| 2017/0316998 | A1 | 11/2017 | Marutani et al. |
| 2020/0135997 | A1* | 4/2020 | Hu .......................... H01L 33/10 |

FOREIGN PATENT DOCUMENTS

| | | | |
|---|---|---|---|
| JP | 2002-224878 | 8/2002 | |
| JP | 2005-093945 | 4/2005 | |
| JP | 2006-060150 | 3/2006 | |
| JP | 2012-099768 | 5/2012 | |
| JP | 5443334 B2 | 7/2012 | |
| JP | 2014-131072 | 7/2014 | |
| JP | 2015-015378 | 1/2015 | |
| JP | 2015-029031 | 2/2015 | |
| JP | 2015-032373 | 2/2015 | |
| JP | 2015-050369 | 3/2015 | |
| JP | 2015-057812 | 3/2015 | |
| JP | 2017-199834 | 11/2017 | |
| JP | 2018-107258 | 7/2018 | |
| JP | 2018107258 A * | 7/2018 | ............. H01L 33/62 |
| WO | 2016/132424 | 8/2016 | |

OTHER PUBLICATIONS

Office Action with Form PTO-892 Notice of References Cited issued by the U.S. Patent and Trademark Office for the parent U.S. Appl. No. 16/581,627, filed Sep. 22, 2021.
Notice of Allowance issued by the United States Patent and Trademark Office for the parent U.S. Appl. No. 16/581,627, filed Dec. 8, 2021.

* cited by examiner

*FIG.31*

```
┌─────────────────────────────────────────────────────────────┐
│ PROVIDE A LIGHT-EMITTING STRUCTURE INCLUDING A LIGHT-EMITTING│ ─── S11
│ ELEMENT WHICH HAS THE FIRST ELECTRODE AND THE SECOND ELECTRODE│
│ AND A COVERING MEMBER WHICH COVERS THE LIGHT-EMITTING ELEMENT │
└─────────────────────────────────────────────────────────────┘
                              │
┌─────────────────────────────────────────────────────────────┐
│    PLACE A MASK IN THE FORM OF A SHEET ABOVE THE LOWER      │ ─── S12
│    SURFACE OF THE ELECTRODES OF THE LIGHT-EMITTING ELEMENT  │
└─────────────────────────────────────────────────────────────┘
                              │
┌─────────────────────────────────────────────────────────────┐
│ REMOVE AT LEAST PART OF THE MASK BY LASER LIGHT IRRADIATION │ ─── S13
│ SUCH THAT AT LEAST PART OF THE FIRST ELECTRODE AND AT LEAST │
│      PART OF THE SECOND ELECTRODE ARE EXPOSED               │
└─────────────────────────────────────────────────────────────┘
                              │
┌─────────────────────────────────────────────────────────────┐
│        FILL A PORTION FROM WHICH THE MASK HAS BEEN REMOVED  │ ─── S14
│              WITH AN ELECTRICALLY-CONDUCTIVE MATERIAL,       │
│               THEREBY FORMING A PLURALITY OF WIRES           │
└─────────────────────────────────────────────────────────────┘
```

*FIG.67*
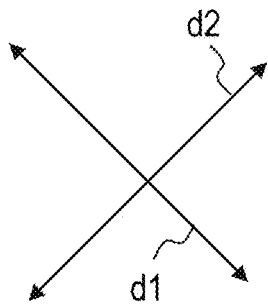
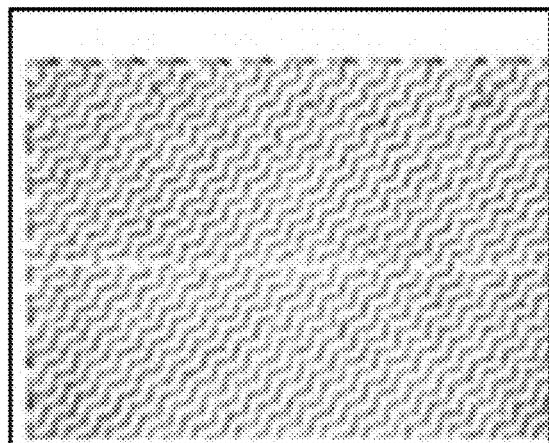
*FIG.68*
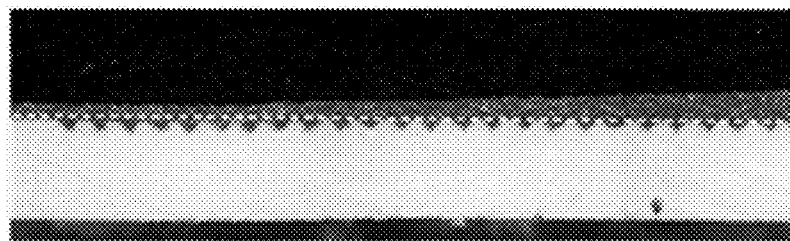
*FIG.69*
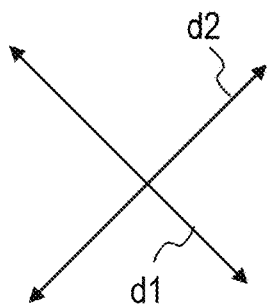
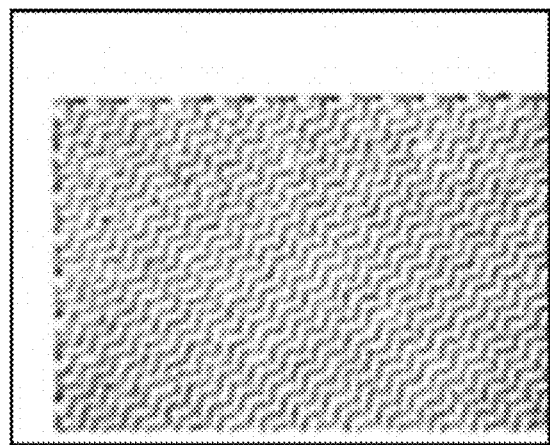
*FIG.70*
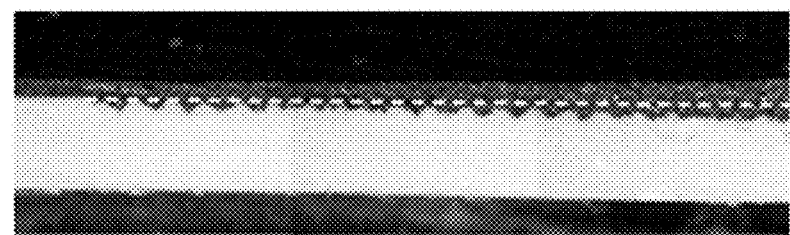

LIGHT-EMITTING DEVICE INCLUDING WIRINGS IN GROOVE STRUCTURE

CROSS REFERENCE TO RELATED APPLICATION

This application claims priority to Japanese Patent Application No. 2018-179258, filed on Sep. 25, 2018, and is a divisional of U.S. application Ser. No. 16/581,627, filed on Sep. 24, 2019, the disclosures of which are hereby incorporated by reference in their entirety.

BACKGROUND

The present disclosure relates to a light-emitting device manufacturing method and a light-emitting device.

Semiconductor light-emitting elements, typically light emitting diodes (LEDs), have been broadly used in backlight units of liquid crystal display devices or the like. For example, Japanese Patent Publication No. 2015-032373 describes a backlight unit which includes a plurality of light sources and an optical sheet.

The backlight unit described in Japanese Patent Publication No. 2015-032373 is a so-called direct-lit backlight unit in which light sources are two-dimensionally arrayed on a substrate at the rear side of a liquid crystal panel. As shown in FIG. 3 of Japanese Patent Publication No. 2015-032373, each of the light sources on the substrate includes a package with a cavity in which a LED chip is to be placed, a LED chip placed in the cavity of the package, and an encapsulant covering the LED chip. The package includes an external electrode in part thereof. By connecting the external electrode of the package to the substrate, for example, by soldering, the light sources can be mounted onto the substrate.

SUMMARY

However, there is a case where a large number of light sources are mounted to the substrate, particularly where the light sources are more densely mounted to the substrate. In such a case, formation of finer and more complicated wiring (e.g., circuit traces) is sometimes required in the substrate that supports the light sources.

A light-emitting device manufacturing method of an embodiment of the present disclosure includes: providing a light-emitting structure, the light-emitting structure having a first surface and a second surface opposite to the first surface, the light-emitting structure including one or more light-emitting elements and a covering member covering the one or more light-emitting elements, each of the one or more light-emitting elements having a first electrode and a second electrode each having a lower surface, a lower surface of the first electrode and a lower surface of the second electrode each being closer to the first surface than the second surface; removing part of the covering member, part of the first electrode and part of the second electrode by irradiation with laser light from a first surface side to form a groove structure on the first surface side of the light-emitting structure such that at least part of the first electrode and at least part of the second electrode are exposed to an inside of the groove structure; and filling the inside of the groove structure with an electrically-conductive material to form a plurality of wirings.

A light-emitting device manufacturing method of another embodiment of the present disclosure includes: providing a light-emitting structure, the light-emitting structure including one or more light-emitting elements and a covering member covering the one or more light-emitting elements, each of the one or more light-emitting elements including a first electrode and a second electrode, each of the first electrode and the second electrode having a lower surface; placing a mask having a sheet shape above the lower surface of the first electrode and the lower surface of the second electrode; irradiating with laser light to remove at least part of the mask such that at least part of the first electrode and at least part of the second electrode are exposed; and forming a plurality of wirings by filling a portion from which the mask is removed with an electrically-conductive material.

A light-emitting device of an embodiment of the present disclosure includes: a light-emitting module including one or more light-emitting elements and a package covering the one or more light-emitting elements, each of the one or more light-emitting elements having a first electrode and a second electrode, the light-emitting module having a groove structure on a lower surface side; and a first wiring and a second wiring which are partially or entirely present in the groove structure, wherein at least part of the first electrode and at least part of the second electrode are exposed to an inside of the groove structure, the first wiring is electrically connected with the first electrode, and the second wiring is electrically connected with the second electrode.

Certain embodiment of the present disclosure can provide a light-emitting device with which complication of wiring on the substrate side can be avoided, for example, after electrically connecting a plurality of light-emitting elements with one another, and a manufacturing method thereof.

BRIEF DESCRIPTION OF THE DRAWINGS

FIG. 31 is a flowchart illustrating an exemplary light-emitting device manufacturing method of the second embodiment of the present disclosure.

FIG. 67 shows a microscopic image of the eighth portion before being filled with an electrically-conductive paste.

FIG. 68 shows a microscopic image of a cross section after the eighth portion was filled with an electrically-conductive paste and the electrically-conductive paste was cured.

FIG. 69 shows a microscopic image of the ninth portion before being filled with an electrically-conductive paste.

FIG. 70 shows a microscopic image of a cross section after the ninth portion was filled with an electrically-conductive paste and the electrically-conductive paste was cured.

DETAILED DESCRIPTION

Figure 1:
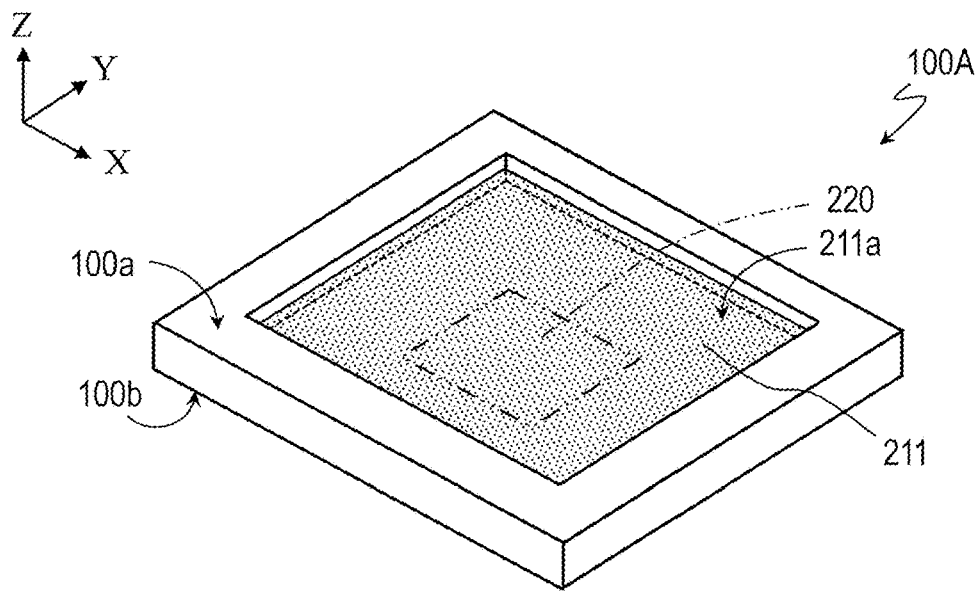
FIG. 1 is a schematic perspective view showing an example of the external appearance of a light-emitting device of the first embodiment of the present disclosure.

Hereinafter, embodiments of the present disclosure will be described in detail with reference to the drawings. The embodiments which will be described below are merely exemplary. A light-emitting device and light-emitting device manufacturing method of the present disclosure are not limited to the embodiments which will be described below. For example, values, shapes, materials, steps and the order of steps which, will be specified in the embodiments described below are merely exemplary, and various modifications thereto are possible so long as no technical inconsistency occurs.

The dimensions and sizes of components shown in the drawings are sometimes exaggerated for clear understanding. The dimensions, shapes, and relative sizes of components in an actual light-emitting device and manufacturing apparatus are sometimes not reflected in the drawings. To avoid excessively complicated drawings, some components are sometimes not shown in the drawings.

In the following description, components which have substantially the same function are designated by a common reference numeral, and the description thereof is sometimes omitted. In the following description, the terms which designate specific directions or positions (e.g., "upper", "lower", "right", "left", and other terms including such terms) are sometimes used. Such terms are used merely for clear understanding of relative directions or positions in the referred drawings. So long as the relationship of relative directions or positions designated by terms such as "upper", "lower", etc., in the referred drawings is identical, drawings other than those provided in the present disclosure or actual products and manufacturing equipment may not have identical arrangements to those shown in the referred drawings. In the present disclosure, "parallel" includes the cases where two lines, sides or planes are in the range of about ±5° from 0° unless otherwise specified. In the present disclosure, "perpendicular" or "intersection" includes the cases where two lines, sides or planes are in the range of about ±5° from 90° unless otherwise specified.

First Embodiment

FIG. 1 shows an exemplary light-emitting device of the first embodiment of the present disclosure. FIG. 1 shows an example of the external appearance of a light-emitting device 100A according to the first embodiment of the present disclosure as viewed from the upper surface 100a side. In FIG. 1, arrows indicative of X-direction, Y-direction and Z-direction, which are perpendicular to one another, are also shown some of the other drawings of the present disclosure, arrows indicative of these directions are shown.

In the configuration illustrated in FIG. 1, the light-emitting device 100A has the shape of a substantially rectangular parallelepiped. In this example, the outline of the upper surface 100a of the light-emitting device 100A as viewed from the top is substantially square. In FIG. 1, the sides of the square shape of the upper surface 100a are coincident with the X-direction and the Y-direction illustrated in the drawing. In the embodiments of the present disclosure, the shape of the light-emitting device as viewed from the top is not required to be square. Also, the shape of the light-emitting device as viewed from the top is not required to be rectangular including square.

Figure 2:
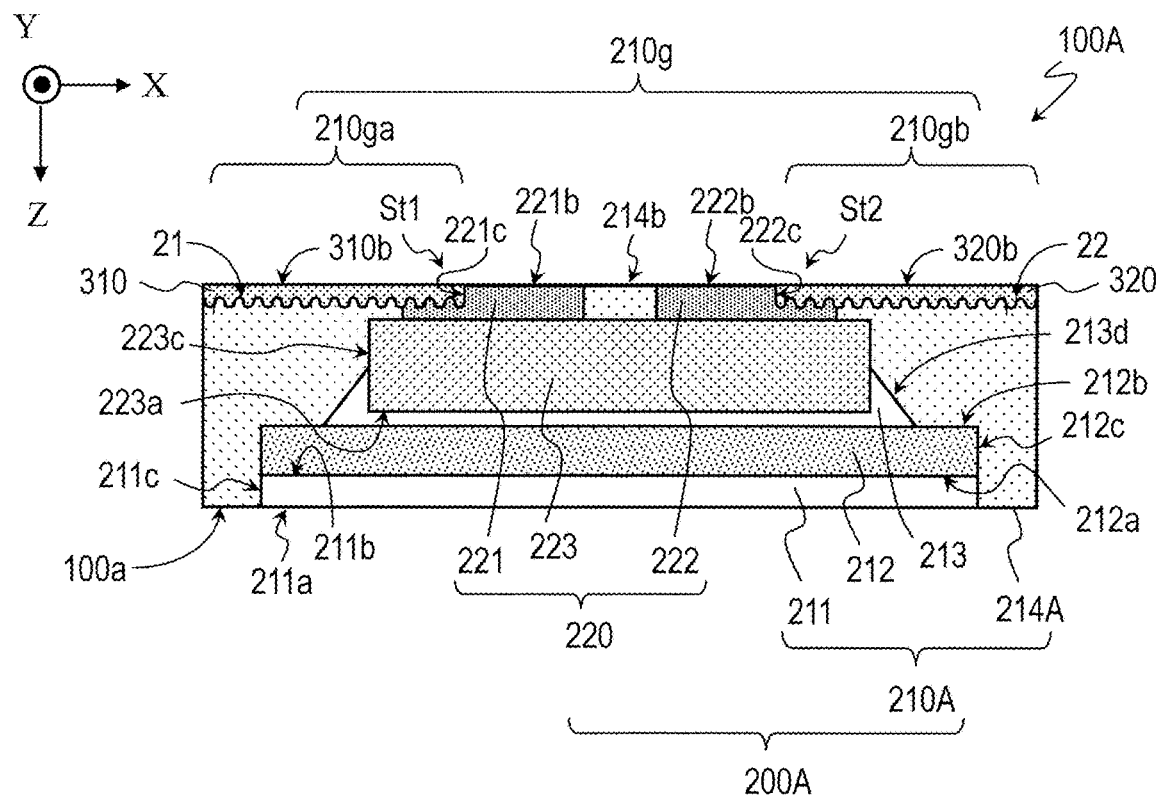
FIG. 2 is a schematic cross-sectional view of the light-emitting device 100A shown in FIG. 1 taken along a plane parallel to the Z-X plane of FIG. 1 in the center of its vicinity of the light-emitting device 100A.
Figure 3:
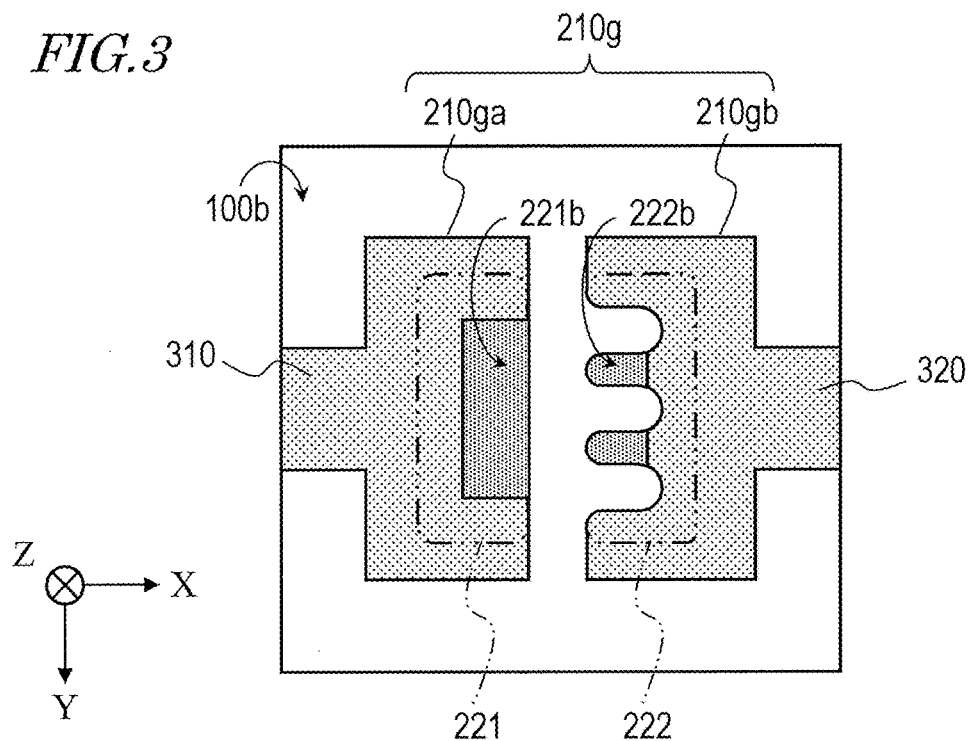
FIG. 3 is a schematic bottom view of the light-emitting device 100A shown in FIG. 1 as viewed from the lower surface 100b side.

FIG. 2 schematically shows a cross section of the light-emitting device 100A taken along a plane parallel to the Z-X plane of FIG. 1 in the center or its vicinity of the light-emitting device 100A. FIG. 3 shows an example of the external appearance of the light-emitting device 100A shown in FIG. 1 as viewed from the lower surface 100b side that is opposite to the upper surface 100a. As schematically shown in FIG. 2, the light-emitting device 100A generally includes at least one light-emitting module 200A which includes at least one light-emitting element 220 and a first wiring 310 and a second wiring 320 which are provided on the lower surface 100b side (i.e., opposite to the upper surface 100a). As illustrated in the drawings, a groove structure 210g is provided on the lower surface side of the light-emitting module 200A (i.e., opposite to the upper surface 100a of the light-emitting device 100A). In this example, the groove structure 210g includes two portions, the first portion 210ga and the second portion 210gb. The first wiring 310 and the second wiring 320 described above are positioned in this groove structure 210g.

The light-emitting module 200A further includes a package 210A encapsulating the light-emitting element 220. The package 210A covers the light-emitting element 220. The configuration illustrated in FIG. 1, FIG. 2 and FIG. 3 includes a protecting member 211, a wavelength converting member 212, a light guiding member 213 and a light reflecting member 214A. Hereinafter, respective components of the light-emitting device 100A will be described in detail.

Light-Emitting Element 220

A typical example of the light-emitting element 220 is a light emitting diode (LED). In the configuration illustrated in FIG. 2, the light-emitting element 220 includes an element body 223 which has an upper surface 223a and lateral surfaces 223c. In this example, the upper surface 223a of the element body 223 configures the upper surface of the light-emitting element 220.

The element body 223 includes, for example, a supporting substrate of sapphire, gallium nitride or the like, and a semiconductor multilayer structure on the supporting substrate: The semiconductor multilayer structure includes an active layer, an n-type semiconductor layer and a p-type semiconductor layer. The active layer is interposed between the n-type semiconductor layer and the p-type semiconductor layer. The semiconductor multilayer structure can include a nitride semiconductor ($In_xAl_yGa_{1-x-y}N$, $0 \leq x$, $0 \leq y$, $x+y \leq 1$) which is capable of emitting light in the range of ultraviolet to visible light. Herein, an LED capable of emitting blue light is illustrated as the light-emitting element 220.

The light-emitting element 220 further includes a first electrode 221 and a second electrode 222 which are present on the lower surface 100b side of the light-emitting device 100A. The first electrode 221 and the second electrode 222 are a pair of a cathode and an anode and have the function of supplying a predetermined electric current to the semiconductor multilayer structure. The first electrode 221 and the second electrode 222 are, typically, Cu electrodes.

The first electrode 221 has a lower surface 221b. The second electrode 222 has a lower surface 222b. The lower surface 221b of the first electrode 221 and the lower surface 222b of the second electrode 222 are exposed out of the light reflecting member 214A which will be described later. As illustrated in the drawing, the positions of these lower surfaces' 221b, 222b are substantially coplanar with the position of the lower surface 214b of the light reflecting member 214A.

Protecting Member 211

The protecting member 211 is a plate-like member which is present above the upper surface of the light-emitting element 220 in the package 210A. The protecting member 211 has an upper surface 211a, a lower surface 211b, and lateral surfaces 211c extending between the upper surface 211a and the lower surface 211b. In this example, the upper surface 211a of the protecting member 211 is surrounded by the light reflecting member 214A and is part of the emission region of the upper surface 100a of the light-emitting device 100A from which light from the light-emitting element 220 exits.

The protecting member 211 is, typically, light-transmitting layer which contains a resin as a base material. Examples of the material of the protecting member 211 include silicone resin, modified silicone resin, epoxy resin, phenolic resin, polycarbonate resin, acrylic resin, trimethylpentene resin, polynorbornene resin, and a resin composition containing two or more of these resins. Alternatively, the protecting member 211 can be a layer which is made of glass. In this specification, the term "light-transmitting" is interpreted so as to include being diffusive for incident light and is not limited to being "transparent".

Wavelength Converting Member 212

The wavelength converting member 212 is present between the lower surface 211b of the protecting member 211 and the upper surface of the light-emitting element 220. The wavelength converting member 212 has an upper surface 212a, a lower surface 212b, and lateral surfaces 212c. In the example shown in FIG. 2, the lateral surfaces 212c of the wavelength converting member 212 are coplanar with the lateral surfaces 211c of the protecting member 211.

The wavelength converting member 212 is, typically, a resin member in which particles of a phosphor are dispersed. The wavelength converting member 212 absorbs at least part of light emitted from the light-emitting element 220, and emits light of a different wavelength from that of the light emitted from the light-emitting element 220. For example, the wavelength converting member 212 converts the wavelength of part of blue light from the light-emitting element 220, and emits yellow light. With such a configuration, blue light which has passed through the wavelength converting member 212 and the yellow light emitted from the wavelength converting member 212 are mixed together, whereby white light is produced.

The phosphor can be a known material. Examples of the phosphor include YAG-based phosphors, fluoride-based phosphors, and nitride-based phosphors. The YAG-based phosphors are examples of a wavelength conversion substance capable of converting blue light to yellow light. A KSF-based phosphor which is one of the fluoride-based phosphors and a CASN phosphor and a SCASN phosphor which are nitride phosphors are examples of a wavelength conversion substance capable of converting blue light to red light. A β-sialon phosphor which is another example of the nitride phosphors is an example of a wavelength conversion substance capable of converting blue light to green light. The phosphor can be a quantum dot phosphor. Examples of the base material in which the phosphor particles are to be dispersed include silicone resin, modified silicone resin, epoxy resin, modified epoxy resin, urea resin, phenolic resin, acrylic resin, urethane resin, fluoric resin, and a resin containing two or more of these resins.

Light Guiding Member 213

The light guiding member 213 is a light-transmitting structure which mechanically and optically connects the light-emitting element 220 with the lower surface 212b of the wavelength converting member 212. As shown in FIG. 2, part of the light guiding member 213 covers at least part of the lateral surfaces 223c of the element body 223 of the light-emitting element 220 The light guiding member 213 typically includes a portion which is present between the upper surface of the light-emitting element 220 and the lower surface 212b of the wavelength converting member 212.

As schematically shown in FIG. 2, the outer surface 213d of the light guiding member 213 is covered with the light reflecting member 214A. Therefore, light emitted from the lateral surfaces 223c of the element body 223 so as to enter the light guiding member 213 is reflected at the outer surface 213d of the light guiding member 213, in other words, at the position of the interface between the light guiding member 213 and the light reflecting member 214A, toward a region above the light-emitting element 220 so as to enter the wavelength converting member 212. Thus, the light guiding member 213 contributes to increasing the amount of light extracted from the upper surface 100a of the light-emitting device 100A via the wavelength converting member 212 and the protecting member 211. Providing the light guiding member 213 improves the light extraction efficiency.

The light guiding member 213 transmits not less than 60% of light with respect to light having the emission peak wavelength which is emitted from the light-emitting element 220. From the viewpoint of effectively utilizing light, the transmittance of the light guiding member 213 at the emission peak wavelength of the light-emitting element 220 is preferably not less than 70%, more preferably not less than 80%. The material of the light guiding member 213 can be a resin composition which contains a transparent resin as the base material. A typical example of the base material of the light guiding member 213 is a thermosetting resin, such as epoxy resin, silicone resin, etc. As the base material of the light guiding member 213, a silicone resin, a modified silicone resin, an epoxy resin, a phenolic resin, a polycarbonate resin, an acrylic resin, a polymethylpentene resin, a polynorbornene resin, or a material containing two or more of these resins can be used. For example, a material whose refractive index is different from that of the base material can be dispersed in the material of the light guiding member 213 such that the light guiding member 213 has a light diffusing function.

When the light guiding member 213 covers a larger region of the lateral surfaces of the light-emitting element 220, a larger amount of light can be guided to a region above the light-emitting element 220. From this viewpoint, the light guiding member 213 can entirely cover the lateral surfaces 223c of the element body 223, from the lower end to the upper end. The cross-sectional shape of the outer surface 213d of the light guiding member 213 is not required to be a linear shape such as shown in FIG. 2. The cross-sectional, shape of the outer surface 213d can be a shape consisting of lines, a curved line that protrudes toward the light emitting element 220, or a curved line that protrudes away from the light emitting element 220.

Light Reflecting Member 214A

The light reflecting member 214A is a light-reflective structure surrounding the above-described light-emitting element 220 and other components. In this specification, the term "light-reflective" or "light reflecting" means that the reflectance at the emission peak wavelength of the light-emitting element 220 is not less than 60%. The reflectance of the light reflecting member 214A at the emission peak wavelength of the light-emitting element 220 is more preferably not less than 70%, still more preferably not less than 80%.

The light reflecting member 214A covers the outer surface 213d of the light guiding member 213 and part of the lateral surfaces of the light-emitting element 220 which is not covered with the light guiding member 213. Also, the light reflecting member 214A covers the lower surface of the element body 223 of the light-emitting element 220 excluding regions in which the first electrode 221 and the second electrode. 222 are provided. The light reflecting member 214A covering the lower surface of the element body 223 of the light-emitting element 220 excluding regions in which the first electrode 221 and the second electrode 222 are provided can reflect light traveling toward the lower surface 100b side to direct it toward the upper surface 100a side of the light-emitting device 100A, so that the light extraction efficiency can improve.

As the material of the light reflecting member 214A, for example, a resin composition in which a light-reflective filler is dispersed can be used. As the base material of the light reflecting member 214A, a silicone resin, a phenolic resin, an epoxy resin, a BT resin, polyphthalamide (PPA), or the like, can be used. As the light-reflective filler, metal particles or particles of an inorganic or organic material which has a higher refractive index than the base material can be used. Examples of the reflective filler include particles of titanium dioxide, silicon oxide, zirconium dioxide, potassium titanate, aluminum oxide, aluminum nitride, boron nitride, mullite, niobium oxide or barium sulfate, or particles of rare-earth oxides, such as yttrium oxide, gadolinium oxide, etc. From the viewpoint of achieving high reflectance, the color of the light reflecting member 214A is advantageously white. Alternatively, as the material of the light reflecting member 214A, a fiberglass-reinforced plastic_(e.g., glass epoxy resin) or a ceramic material of aluminum nitride, aluminum oxide, zirconium oxide, or the like, can be used.

First Wiring 310 and Second Wiring 320

The first wiring 310 and the second wiring. 320 are electrically-conductive structures provided inside the groove structure 210g that is formed in the lower surface of the light-emitting module 200A, in other words, in a surface opposite to the upper surface 211a of the protecting member 211. In this example, as shown in FIG. 2 and FIG. 3, the first wiring 310 is provided inside the first portion 210ga of the groove structure 210g, while the second wiring 320 is provided inside the second portion 210gb of the groove structure 210g which is separate from the first portion 210ga. That is, the second wiring 320 is provided inside the second portion 210gb, whereby the second wiring 320 is electrically separated from the first wiring 310. The shape of the groove structure 210g shown in FIG. 3 is merely exemplary. The shape of the groove structure 210g as viewed from the bottom can be appropriately determined.

The first wiring 310 has a lower surface 310b which is exposed out of the lower surface 214b of the light reflecting member 214A. Likewise, the second wiring 320 has a lower surface 320b which is exposed out of the lower surface 214b of the light reflecting member 214A. As shown in FIG. 2, in this example, the lower surface 310b of the first wiring 310 and the lower surface 320b of the second wiring 320 are substantially coplanar with the lower surface 214b of the light reflecting member 214A, which corresponds to the lower surface of the package 210A, and with the lower surface 221b of the first electrode 221 and the lower surface 222b of the second electrode 222. That is, herein, it can be said that the lower surface 100b of the light-emitting device 100A is formed by the lower surface 221b of the first electrode 221 and the lower surface 222b of the second electrode 222, the lower surface 214b of the light reflecting member 214A, and the lower surface 310b of the first wiring 310 and the lower surface 320b of the second wiring 320.

As schematically shown in FIG. 2, the bottom portion of the first portion 210ga of the groove structure 210g and the bottom portion of the second portion 210gb of the groove structure 210g are not required to be a flat surface but can have surface unevenness. In the configuration illustrated in FIG. 2, the first wiring 310 and the second wiring 320 respectively have a shape matched with the shape of the bottom portion of the first portion 210ga and the bottom portion of the second portion 210gb of the groove structure 210g according to the surface unevenness at the bottom portion of the first portion 210ga and the bottom portion of the second portion 210gb of the groove structure 210g. With the structure in which the bottom portion of the first portion 210ga and the bottom portion of the second portion 210gb have surface unevenness and each of the first wiring 310 and the second wiring 320 has a shape matched with the shape of the surface unevenness, a greater anchoring effect can be produced. That is, the effect of alleviating separation of the first wiring 310 or the second wiring 320 from the light-emitting module 200A can be achieved. As will be described later, the bottom surface of the first portion 210ga and the bottom surface of the second portion 210gb can be formed by a structure such as a plurality of grooves. Hereinafter, the bottom surface of the first portion 210ga is also referred to as "first bottom surface 21", and the bottom surface of the second portion 210gb is also referred to as "second bottom surface 22".

As will be specifically described later the first wiring 310 and the second wiring 320 are formed by supplying an electrically-conductive material inside the first portion 210ga and the second portion 210gb of the groove structure 210g, and thereafter curing the electrically-conductive material. The first portion 210ga of the groove structure 210g has a depth of, for example, not less than 5 μm and not more than 50 μm. Likewise, the second portion 210gb of the groove structure 210g has a depth of, for example, not less than 5 μm and not more than 50 μm. Therefore, the first wiring 310 and the second wiring 320 also have a depth (i.e., thickness) of, approximately, not less than 5 μm and not more than 50 μm.

As schematically shown in FIG. 2, part of the first electrode 221 and part of the second electrode 222 of the light-emitting element 220 are recessed relative to the lower surface 214b of the light reflecting member 214A. That is, in this example, part of the surface of the first electrode 221 forms part of the first bottom surface 21 of the first portion 210ga. In other words, part of the first electrode 221 is exposed to an inside of the first portion 210ga of the groove structure 210g. The part of the first electrode 221 exposed inside the groove structure 210g includes a stepped portion St1 which has a lateral surface 221c. The first wiring 310 is connected with the part of the first electrode 221 exposed inside the first portion 210ga of the groove structure 210g, and is hence electrically connected with the first electrode 221.

Likewise, part of the surface of the second electrode 222 forms part of the second bottom surface 22 of the second portion 210gb. That is, part of the second electrode 222 is exposed to an inside of the second portion 210gb of the groove structure 210g. The part of the second electrode 222 exposed inside the groove structure 210g includes a stepped portion St2 which has a lateral surface 222c. The second wiring 320 is connected with the part of the second electrode 222 exposed inside the second portion 210gb of the groove structure 210g, and is hence electrically connected with the second electrode 222.

Figure 4:
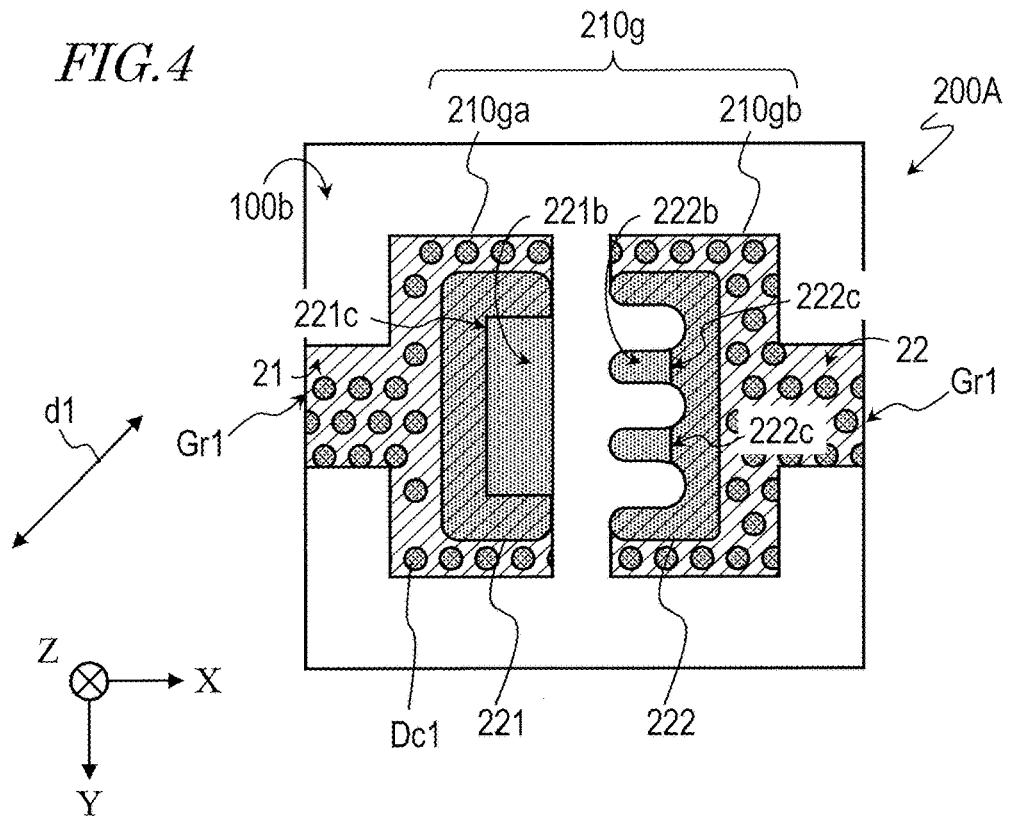
FIG. 4 is a schematic bottom view showing a resultant structure after a first wiring 310 and a second wiring 320 are removed from FIG. 3.

FIG. 4 schematically shows a structure without supplying the first wiring 310 and the second wiring 320 shown as the structure in FIG. 3. It can be said that FIG. 4 shows the light-emitting module 200A of the light-emitting device 100A. In the example shown in FIG. 4, the first bottom surface 21 of the first portion 210ga and the second bottom surface 22 of the second portion 210gb of the groove structure 210g include a set of a plurality of first grooves Gr1 extending in the first direction. Particularly, in this example, the first bottom surface 21 of the first portion 210ga and the second bottom surface 22 of the second portion 210gb are formed by a set of the plurality of first grooves Gr1.

As will be specifically described later, the first grooves Gr1 can be formed by scanning with a laser light beam in the first direction. By irradiating the lower surface of the package 210A and the lower surface 221b of the first electrode 221 and the lower surface 222b of the second electrode 222 with laser light at a predetermined pitch in the first direction, part of the light reflecting member 214A, part of the first electrode 221 and part of the second electrode 222 are removed. Thereby, the plurality of first grooves Gr1 are formed, and a set of the plurality of first grooves Gr1 can form the above-described groove structure 210g.

In FIG. 4, the first direction is designated by double-headed arrow d1. In the example shown in FIG. 4, the first direction is different from each of the X-direction and the Y-direction in the drawing. However, the scanning direction of the laser light beam can be appropriately determined, and the first direction can be identical with the X-direction or the Y-direction. Each of the first grooves Gr1 is typically formed by pulsed irradiation of laser light in the first direction such that laser spots partially overlap. Therefore, the extending direction of the first portion 210ga of the groove structure 210g and the extending direction of the second portion 210gb of the groove structure 210g are not restricted by the first direction (i.e., the extending direction of the first grooves Gr1). The shape of the groove structure 210g as viewed from the bottom can be appropriately determined.

In the example shown in FIG. 4, the first bottom surface 21 of the first portion 210ga and the second bottom surface 22 of the second portion 210gb further have a plurality of first recesses Dc1 in the dot shapes. As schematically shown in FIG. 4, the diameters of the first recesses Dc1 are typically greater than the width of the first grooves Gr1. In FIG. 4, the first recesses Dc1 are shown larger with some exaggeration for convenience in description. In some of the other drawings, the first recesses Dc1 and other elements are shown with some exaggeration.

As will be described later, the plurality of first recesses Dc1 can also be formed by laser light irradiation. However, the irradiation pattern of the laser light in formation of the plurality of first recesses Dc1 is different from that in formation of the first grooves Gr1. In this specification, "different irradiation pattern" is not limited to such an operation that the trace of movement of the laser spot is different, but broadly interpreted so as to include such an operation that the traces of movements of the laser spots (or the traces of movements of the laser heads relative to the stages) are identical but the laser powers, the pulse intervals and the like are different between the first laser light irradiation step and the second laser light irradiation step.

Herein, the plurality of first recesses Del are in a triangular lattice arrangement. As a matter of course, the arrangement of the plurality of first recesses Dc1 can be appropriately determined. The first recesses Dc1 can be formed across the bottom portion of the groove structure 210g with a uniform density. With respect to the distance between the centers of two of the first recesses Dc1, the plurality of first grooves Gr1 can have a pitch in the range of, for example, not less than 10% and not more than 100%.

Part of the above-described first wiring 310 and part of the above-described second wiring 320 are present inside the first grooves Gr1. That is, the inside of the first grooves Gr1 is filled with the first wiring 310 or the second wiring 320 as schematically shown in FIG. 2. The inside of the plurality of first recesses Dal is also filled with the first wiring 310 or the second wiring 320.

As previously described, the first wiring 310 and the second wiring 320 which are provided on the lower surface 100b side of the light-emitting device 100A are respectively electrically connected with the first electrode 221 and the second electrode 222 of the light-emitting element 220. Therefore, a pair of the first wiring 310 and the second wiring 320 can function as a pair of the cathode and the anode of the light-emitting device 100A. That is, by connecting a driver, a power supply circuit, etc., to the first wiring 310 and the second wiring 320, the light-emitting device 100A can be driven.

For example, as understood from FIG. 3, by providing the first wiring 310 and the second wiring 320, the distance between the contact portion on the cathode side and the contact portion on the anode side in the light-emitting device 100A can be made greater than the space between the first electrode 221 and the second electrode 222. That is, this can achieve a substantially equivalent effect in the case where enlarging the distance between the electrodes by an interposer. Thus, according to an embodiment of the present disclosure, a wiring pattern for power supply is included in the light-emitting device side. For example, it is not necessary to use a wiring board having complicated wiring patterns, and mounting of light-emitting devices becomes easier.

Further, according to an embodiment of the present disclosure, the distance from the surface of the substrate which supports the light-emitting device 100A to the upper surface 100a of the light-emitting device 100A does not increase unlike the case where an interposer is provided. As shown in FIG. 2, in a configuration where the lower surface 310b of the first wiring 310 and the lower surface 320b of the second wiring 320 are substantially coplanar with the lower surface of the package 210A, these wirings do not protrude from the lower surface of the package 210A. Therefore, it is advantageous in providing thinner light-emitting devices.

The groove structure 210g for holding the first wiring 310 and the second wiring 320 can have a bottom surface which has surface unevenness (e.g., microscopic concave and convex pattern) as previously described with reference to FIG. and FIG. 4. When the groove structure 210g has surface unevenness in the bottom portion, the area of the interface between the first wiring 310 or the second wiring 320 and the groove structure 210g increases so that a higher anchoring effect can be achieved. Therefore, separation of the first wiring 310 and the second wiring 320 can be alleviated, and a light-emitting device with improved reliability can be provided. Particularly in the example shown in FIG. 2, the first electrode 221 includes the stepped portion St1 which is exposed inside the groove structure 210g, and the second electrode 222 includes the stepped portion St2 which is exposed inside the groove structure 210g. Because the first electrode 221 includes the stepped portion St1, the area of the interface between the first electrode 221 and the first wiring 310 increases, and separation of the first wiring 310 can be alleviated more effectively. Likewise, because the second electrode 222 includes the stepped portion St2, the area of the interface between the second electrode 222 and the second wiring 320 increases, and separation of the second wiring 320 is suppressed.

First Variation

Figure 5:
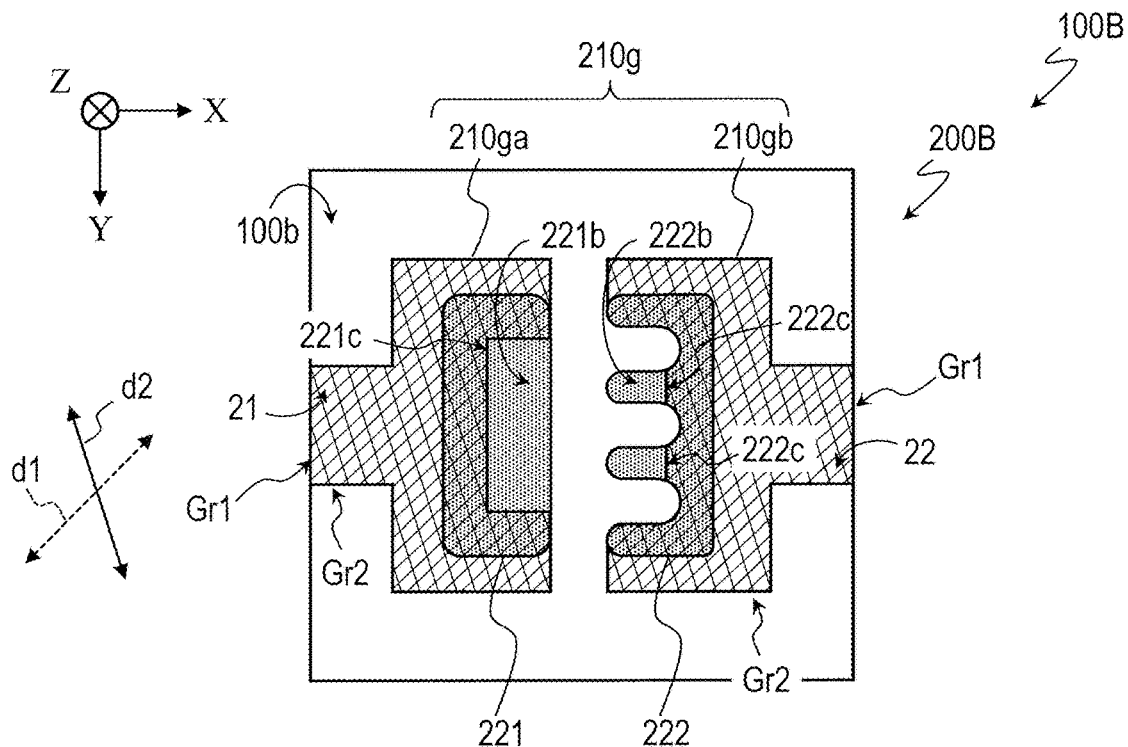
FIG. 5 is a schematic bottom view showing a light-emitting device of a first variation of the first embodiment.

FIG. 5 shows a light-emitting device of the first variation of the first embodiment. FIG. 5 shows a structure in which the first wiring 310 and the second wiring 320 are omitted from the light-emitting device likewise as in FIG. 4 for convenience of description. That is, in FIG. 5, the light-emitting module 200B is taken out from the light-emitting device 100B of the first variation of the first embodiment. The external appearance of the light-emitting device 100B shown in FIG. 5 as viewed from the upper surface 100a side and the external appearance of the light-emitting device 100B as viewed from the lower surface 100b side can respectively be the same as those shown in FIG. 1 and FIG. 3.

Likewise as in the example described with reference to FIG. 4, the light-emitting module 200B of the light-emitting device 100B has a groove structure 210g in a lower surface corresponding to the lower surface 100b of the light-emitting device 100B. The groove structure 210g of the light-emitting module 200B has a plurality of first grooves Gr1 in its bottom portion and is, in this respect, equal to the groove structure 210g of the light-emitting module 200A shown in FIG. 4. However, the groove structure 210g of the light-emitting module 200B has a plurality of second grooves Gr2 which are formed so as to overlap the plurality of first grooves Gr1 instead of the plurality of first recessed portions Dc1.

As schematically shown in FIG. 5, the plurality of second grooves Gr2 extend in the second direction that is different from the first direction in which the plurality of first grooves Gr1 extend. In FIG. 5, the second direction is designated by double-headed arrow d2. The second grooves Gr2 can be formed by scanning with a laser light beam in the second direction in the same manner as the first grooves Gr1 after the plurality of first grooves Gr1 are formed. The second direction can be an appropriately selected direction so long as it meets the first direction. In this sense, the irradiation pattern of the laser light in formation of the second grooves Gr2 is different from the irradiation pattern of the laser light in formation of the first grooves Gr1. The depth and width of the second grooves Gr2 and the pitch between the second grooves Gr2 can be equal to, or can be different from, those of the first grooves Gr1.

By forming the plurality of second grooves Gr2 so as to overlap the plurality of first grooves Gr1, portions which are deeper than the first grooves Gr1 and the second grooves Gr2 can be formed at the meeting position of the first grooves Gr1 and the second grooves Gr2. Such deeper portions formed in the light reflecting member 214A, the first electrode 221 or the second electrode 222 can be referred to as "second recessed portions". Likewise as in the above-described light-emitting device 100A, the inside of the first grooves Gr1 and the inside of the second grooves Gr2 can be filled with the first wiring 310 or the second wiring 320. Likewise, the first wiring 310 or the second wiring 320 can also be present inside the second recessed portions. As in this example, also by forming a plurality of grooves in the form of a grid, the area of the interface between the first wiring 310 or the second wiring 320 and the bottom portion of the groove structure 210g increases, and as a result, increase of the anchoring effect can be expected.

Second Variation

Figure 6:
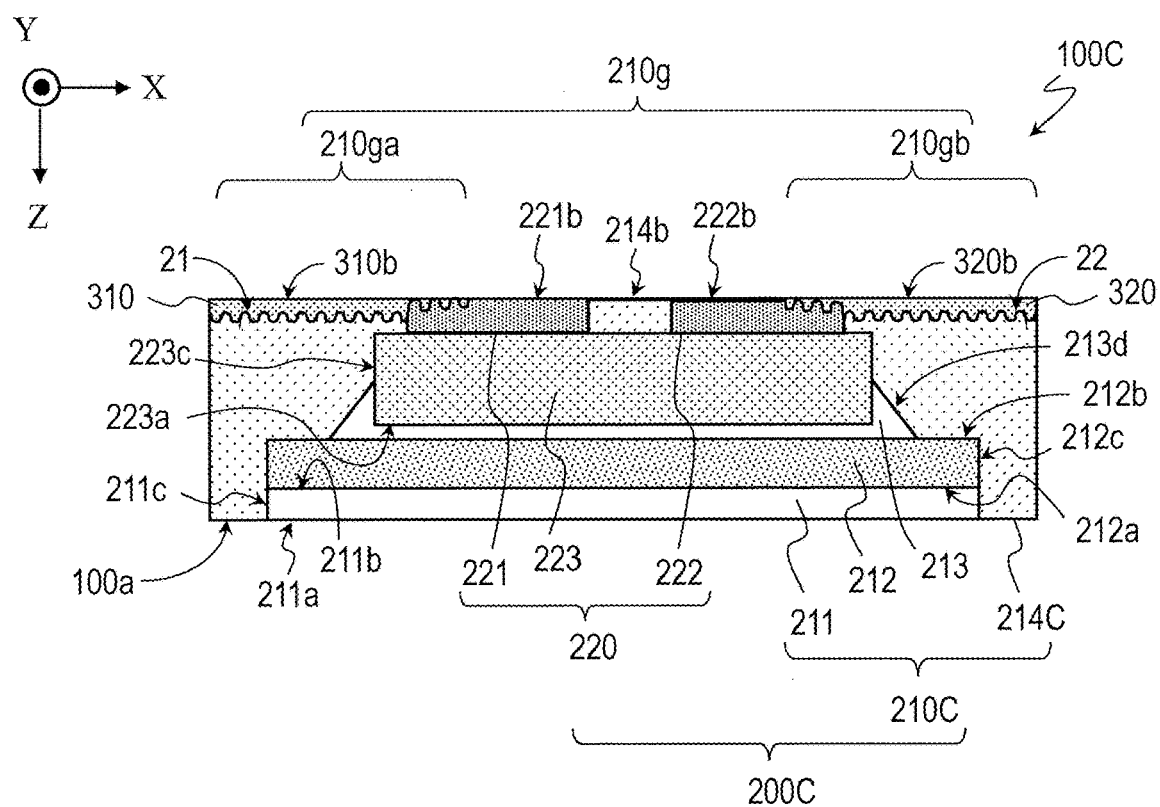
FIG. 6 is a schematic cross-sectional view showing a light-emitting device of a second variation of the first embodiment.

FIG. 6 shows a light-emitting device of the second variation of the first embodiment. FIG. 6 schematically shows a cross section of the light-emitting device of the second variation taken along a plane perpendicular to the upper surface in the center or its vicinity of the light-emitting device as does FIG. 2. The light-emitting device 100C shown in FIG. 6 is different from the light-emitting device 100A shown in FIG. 1 in that the light-emitting device 100C includes a light-emitting module 200C instead of the light-emitting module 200A. The light-emitting module 200C includes a light-emitting element 220 and a package 210C.

As schematically shown in FIG. 6, in this example, a part of the first bottom surface 21 of the first portion 210ga of the groove structure 210g which is formed in the first electrode 221 of the light-emitting element 220 has a smaller depth (i.e., shallower) than another part of the first bottom surface 21 which is formed in a region outside the first electrode 221 of the light-emitting element 220, in other words, another part of the first bottom surface 21 which is formed in a light-reflective member 214C of the package 210C. Likewise, a part of the second bottom surface 22 of the second portion 210gb which is formed in the second electrode 222 of the light-emitting element 220 is shallower than another part of the second bottom surface 22 which is formed in the light-reflective member 214C of the package 210C. That is, in this example, a part of the first wiring 310 overlapping the light-reflective member 214C is thicker than another part of the first wiring 310 overlapping the first electrode 221, and a part of the second wiring 320 overlapping the light-reflective member 214C is thicker than another part of the second wiring 320 overlapping the second electrode 222.

By making a part of the groove structure not overlapping an electrode of a light-emitting element relatively deep, a larger part of the surface of the electrode (e.g., the lateral surfaces of the electrode) can be exposed inside the groove structure than in a configuration where a part of the groove structure overlapping the electrode of the light-emitting element and the other part of the groove structure have substantially equal depths as in the example shown in FIG. 2. Therefore, the contact area between the first wiring 310 and the first electrode 221 and the contact area between the second wiring 320 and the second electrode 222 increase, and the contact resistance between the first wiring 310 and the first electrode 221 and the contact resistance between the second wiring 320 and the second electrode 222 decrease, thereby achieving the effect of reducing the power consumption.

Alternatively, a part of the groove structure overlapping the electrode of the light-emitting element can be made relatively deep by repeatedly scanning of the first electrode 221 and the second electrode 222 with a laser light beam. The contact area between the first wiring 310 and the first electrode 221 and the contact area between the second wiring 320 and the second electrode 222 increase. Due to the increase of the anchoring effect, the probability of separation of the first wiring 310 and the second wiring 320 from the first electrode 221 or the second electrode 222 can be reduced.

Third Variation

Figure 7:
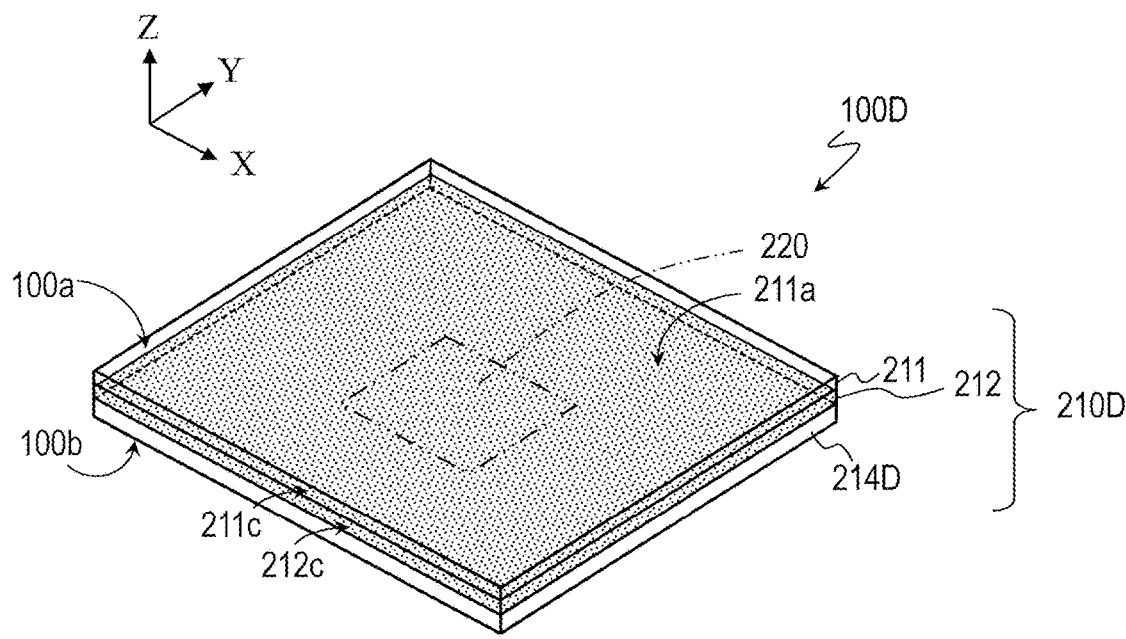
FIG. 7 is a schematic perspective view showing an example of the external appearance of a light-emitting device of a third variation of the first embodiment.
Figure 8:
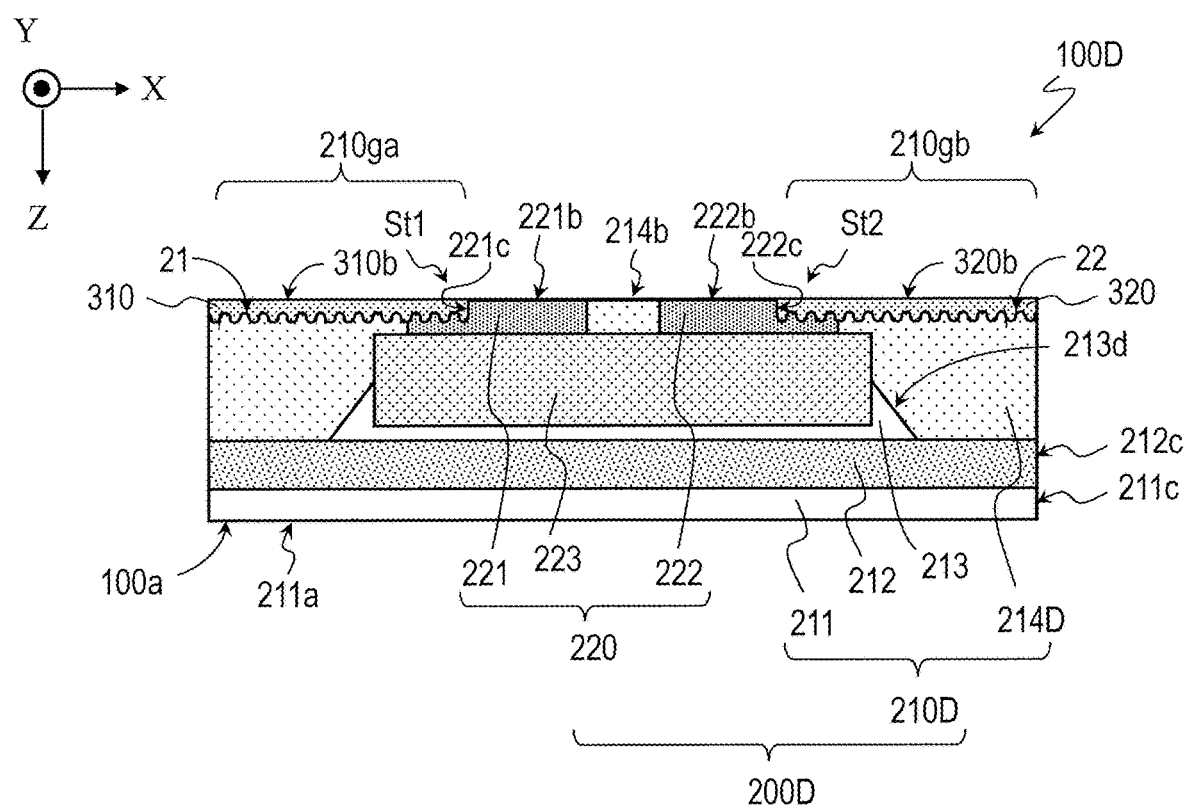
FIG. 8 is a schematic cross-sectional view of the light-emitting device 100D shown in FIG. 7 taken along a plane parallel to the Z-X plane of FIG. 7 in the center or its vicinity of the light-emitting device 100D.

FIG. 7 and FIG. 8 show a light-emitting device of the third variation of the first embodiment. FIG. 7 shows an example as the external appearance of the light-emitting device 100D of the third variation according to the first embodiment as viewed from the upper surface 100a side. FIG. 8 schematically shows a cross section of the light-emitting device 100D shown in FIG. 7 taken along a plane parallel to the Z-X plane of FIG. 7 in the center or its vicinity of the light-emitting device 100D.

The light-emitting device 100D shown in FIG. 7 and FIG. 8 is different from the light-emitting device 100A shown in FIG. 1 in that the light-emitting device 100D includes a package 210D instead of the package 210A. The package 210D includes a light-reflective member 214D. As shown in FIG. 8, the light-emitting device 100D generally includes a light-emitting module 200D, a first wiring 310 and a second wiring 320. The light-emitting module 200D includes a package 210A. The following features are the same as those of the previously-described examples: the light-emitting module 200D has on the lower surface side the groove structure 210g which includes the first portion 210ga and the second portion 210gb; and the first wiring 310 and the second wiring 320 are respectively provided inside the first portion 210ga and the second portion 210gb of the groove structure 210g.

In the configuration illustrated in FIG. 7 and FIG. 8, the lateral surfaces 211c of the protecting member 211 and the lateral surfaces 212c of the wavelength converting member 212 are not covered with the light-reflective member 214D but exposed out of the package 210D. Thus, in this example, light is extracted not only from the upper surface 211a of the protecting member 211 but also from the lateral surfaces 211c of the protecting member 211 and the lateral surfaces 212c of the wavelength converting member 212 and, therefore, an expanded light distribution characteristic can be achieved, in contrast to the above-described light-emitting devices 100A, 100B achieving improved directivity of a light distribution.

Fourth Variation

Figure 9:
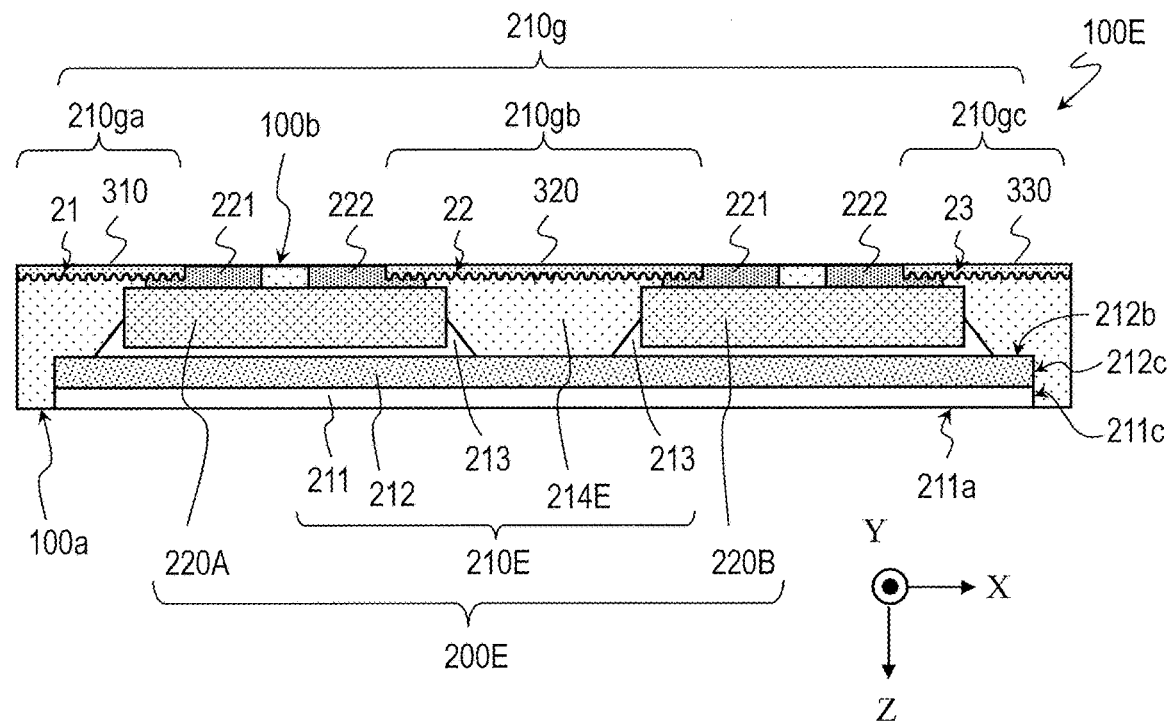
FIG. 9 is a schematic cross-sectional view showing a light-emitting device of a fourth variation of the first embodiment.

FIG. 9 shows a light-emitting device of the fourth variation of the first embodiment. FIG. 9 schematically shows a cross section of the light-emitting device of the fourth variation taken along a plane perpendicular to the upper surface in the center or its vicinity of the light-emitting device as do FIG. 2, FIG. 6 and FIG. 8.

The light-emitting module 200E of the light-emitting device 100E shown in FIG. 9 includes a first light-emitting element 220A and a second light-emitting element 220B in part thereof. In the configuration illustrated in FIG. 9, each of the first light-emitting element 220A and the second light-emitting element 220B is fixed to the lower surface 212*b* of the wavelength converting member 212 by the light guiding member 213. A package 210E of the light-emitting module 200E includes a light-reflective member 214E in part thereof. The light-reflective member 214E covers the first light-emitting element 220A and the second light-emitting element 220B.

Also in this example, the light-emitting module 200E has a groove structure 210*g* which is provided on the lower surface 100*b* side of the light-emitting device 100E. However, in this example, the groove structure 210*g* includes three portions, which are the first portion 210*ga*, the second portion 210*gb* and the third portion 210*gc*. As schematically shown in FIG. 9, the first bottom surface 21 of the first portion 210*ga*, the second bottom surface 22 of the second portion 210*gb*, and the third bottom surface 23 of the third portion 210*gc* are typically uneven surfaces. The shape of unevenness of these bottom surfaces can be formed by the plurality of first grooves Gr1 and the plurality of first recessed portions Dc1, or by the plurality of first grooves Gr1 and the plurality of second grooves Gr2.

As shown in the drawing, the first wiring 310 is present inside the first portion 210*ga* of the groove structure 210*g*, and the second wiring 320 is present inside the second portion 210*gb*. The first wiring 310 is connected with the first electrode 221 of the first light-emitting element 220A inside the first portion 210*ga*. The second wiring 320 is connected with the second electrode 222 of the first light-emitting element 220A inside the second portion 210*gb*. In this example, a third wiring 330 is present inside the third portion 210*gc*. In this example, the third wiring 330 is connected with the second electrode 222 of the second light-emitting element 220B inside the third portion 210*gc*. The first electrode 221 of the second light-emitting element 220B is connected with the second wiring 320 inside the second portion 210*gb*.

That is, in this example, the first electrode 221 of the second light-emitting element 220B and the second electrode 222 of the first light-emitting element 220A are electrically connected with each other by the second wiring 320. The first electrode 221 of the second light-emitting element 220B is for example a cathode, and the second electrode 222 of the first light-emitting element 220A is for example an anode. FIG. 9 shows an example where the first light-emitting element 220A and the second light-emitting element 220B are electrically connected in series. As a matter of course, the electrical connection between the first light-emitting element 220A and the second light-emitting element 220B is not required to be performed as this example. For example, the first light-emitting element 220A and the second light-emitting element 220B can be electrically connected in parallel by the first wiring 310 and the second wiring 320.

Fifth Variation

The light-emitting device can include two light-emitting elements or three or more light-emitting elements. In the configuration illustrated in FIG. 9, the first light-emitting element 220A and the second light-emitting element 220B are together provided on a single wavelength converting member 212. However, the present invention is not required to be performed as this example. In the light-emitting module, the wavelength converting member 212 can be provided for each light-emitting element as in the light-emitting device 100F shown in FIG. 10.

Figure 10:
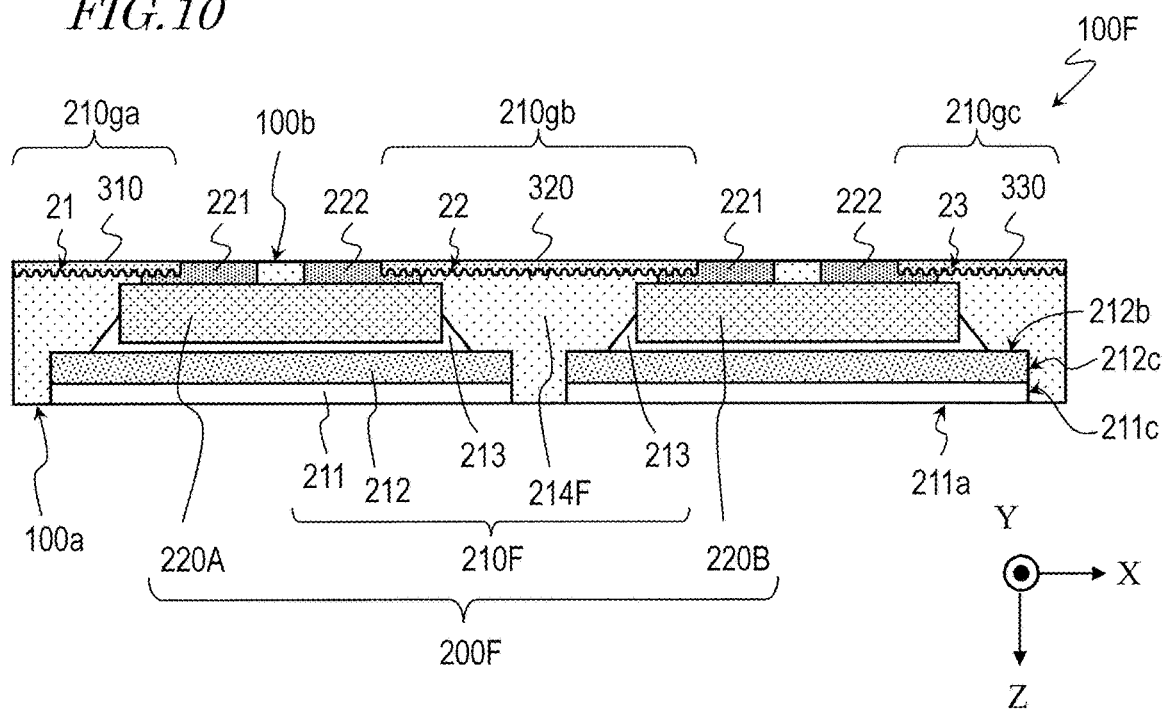
FIG. 10 is a schematic cross-sectional view showing a light-emitting device of a fifth variation of the first embodiment.

In the configuration illustrated in FIG. 10, the light-emitting module 200F of the light-emitting device 100F includes a first light-emitting element 220A, a second light-emitting element 220B, and a package 210F. The package 210F includes a light-reflective member 214F which covers the first light-emitting element 220A and the second light-emitting element 220B. As illustrated in the drawing, in this example, a set of the wavelength converting member 212 and the protecting member 211 is provided above the first light-emitting element 220A, and another set of the wavelength converting member 212 and the protecting member 211 is provided above the second light-emitting element 220B. The wavelength converting member 212 and the protecting member 211 provided above the first light-emitting element 220A and the wavelength converting member 212 and the protecting member 211 provided above the second light-emitting element 220B are separated from each other by the light-reflective member 214F in the package 210F.

When the light-emitting device includes a plurality of light-emitting elements as in the example described with reference to FIG. 9 and FIG. 10, the peak wavelength of light emitted from the light-emitting elements can be different among the light-emitting elements or can be equal among the light-emitting elements. Alternatively, the wavelength converting member 212 provided above the first light-emitting element 220A and the wavelength converting member 212 provided above the second light-emitting element 220B can contain different phosphors dispersed in the wavelength converting member 212. In such a case, even when identical elements are used as the first light-emitting element 220A and the second light-emitting element 220B, light having different wavelength ranges can be extracted from the upper surface 211*a* of the protecting member 211 on the first light-emitting element 220A side and the upper surface 211*a* of the protecting member 211 on the second light-emitting element 220B side.

In the example shown in FIG. 9 and FIG. 10, the lateral surfaces 211*c* of the protecting member 211 and the lateral surfaces 212*c* of the wavelength converting member 212 are covered with the light-reflective member 214E or 214F. As a matter of course, the present invention is not required to be performed as this example. The lateral surfaces 211*c* of the protecting member 211 and the lateral surfaces 212*c* of the wavelength converting member 212 can be exposed out of the light-reflective member 214E or 214F.

Manufacturing Method of Light-Emitting Device

Figure 11:
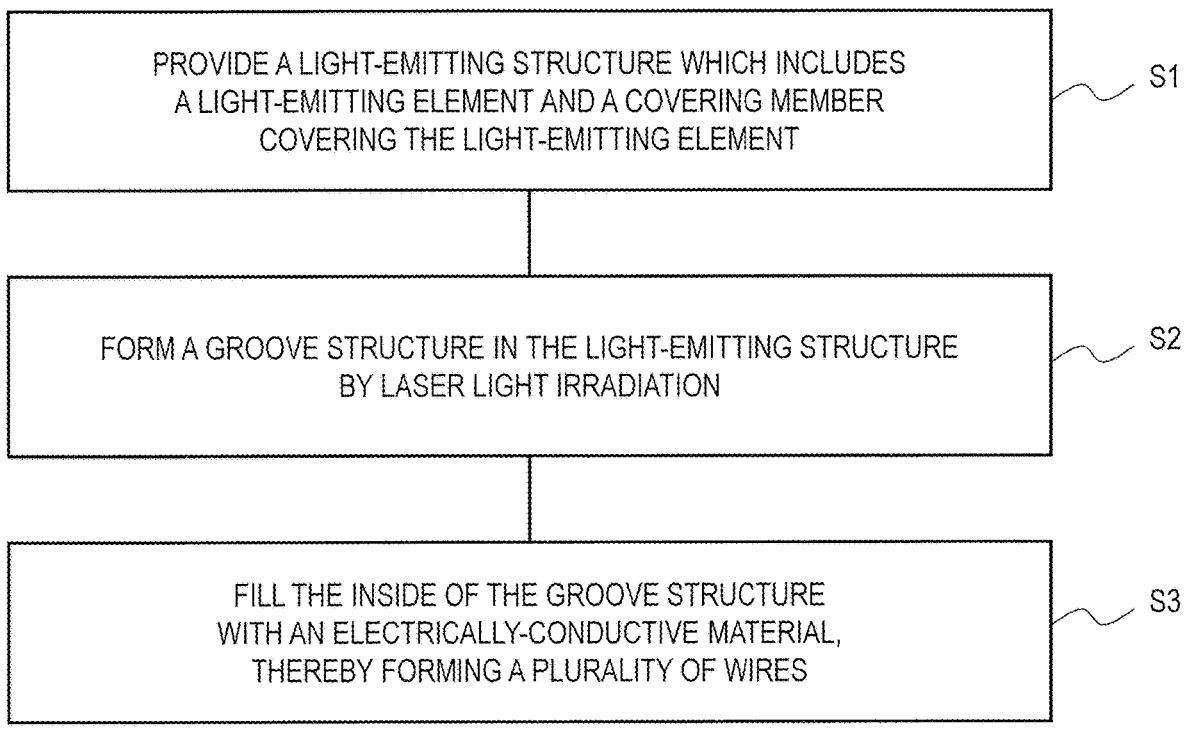
FIG. 11 is a flowchart illustrating an exemplary light-emitting device manufacturing method of the first embodiment of the present disclosure.

Hereinafter, a light-emitting device manufacturing method of the first embodiment of the present disclosure is described with reference to the drawings. FIG. 11 shows the outline of a light-emitting device manufacturing method of the first embodiment of the present disclosure. The light-emitting device manufacturing method shown in FIG. 11 includes providing a light-emitting structure which includes a light-emitting element and a covering member covering the light-emitting element (Step S1), forming a groove structure in the light-emitting structure by laser light irradiation (Step S2), and forming a plurality of wirings (Step S3) by filling the inside of the groove structure with an electrically-conductive material. Hereinafter, details of the respective steps are described with a main example of the light-emitting device 100E shown in FIG. 9.

Light-Emitting Structure Providing Step (A)

A light-emitting structure is provided which includes a light-emitting element and a covering member covering the light-emitting element (Step S1 of FIG. 11). Herein, a light-emitting structure is provided which includes a first light-emitting element 220A, a second light-emitting element 220B, and a covering member covering these two light-emitting elements. The light-emitting structure can be provided by purchasing or can be formed through a procedure which will be described in the following paragraphs.

Figure 12:
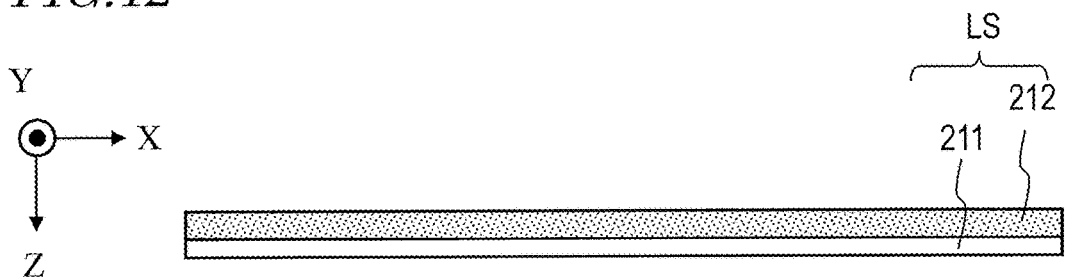
FIG. 12 is a schematic cross-sectional view for illustrating an exemplary light-emitting device manufacturing method of the first embodiment of the present disclosure.

In production of the light-emitting structure, as shown in FIG. 12, a multilayer sheet LS is provided which includes a protecting member 211 and a wavelength converting member 212. The multilayer sheet LS can be configured with, for example, a phosphor sheet and a light-transmitting resin sheet. These sheets are adhered to each other, and cut the resultant structure into pieces of predetermined dimensions by an ultrasonic cutter or the like, to thereby obtain the multilayer sheet LS. The phosphor sheet can be configured by a resin composition which contains a resin in a precured state and phosphor particles dispersed therein. The phosphor sheet can be made of a resin composition which contains a resin as the base material, a phosphor, filler particles, and a solvent. The base material used can be selected from various resins mentioned as the material of the wavelength converting member 212 (e.g., silicone resin). The phosphor used can also be selected from various phosphors mentioned as the material of the wavelength converting member 212. The light-transmitting resin sheet can be produced by, for example, curing a light-transmitting resin composition. The material of the light-transmitting resin sheet can be selected from various materials mentioned as the base material of the protecting member 211, and can optionally contain a light-reflective filler or the like. The multilayer sheet LS can alternatively be produced by applying a resin composition which contains a phosphor onto the light-transmitting resin sheet by an application method such as spraying, casting, potting, and then curing the applied resin composition. The protecting member 211 in the multilayer sheet LS can be a plate of polycarbonate or glass.

Figure 13:
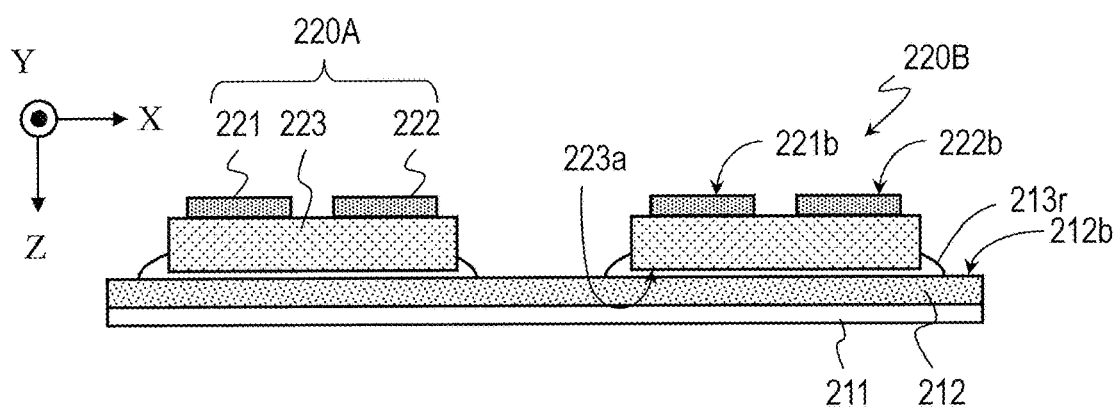
FIG. 13 is a schematic cross-sectional view for illustrating an exemplary light-emitting device manufacturing method of the first embodiment of the present disclosure.

Then, a light-transmitting resin composition 213r is applied to a predetermined position on a primary surface of the multilayer sheet LS on the wavelength converting member 212 side (the lower surface 212b of the wavelength converting member 212) using a dispenser or the like. Further, as shown in FIG. 13, a first light-emitting element 220A and a second light-emitting element 220B are placed on the applied resin composition 213r. In this step, the first light-emitting element 220A and the second light-emitting element 220B are placed on the resin composition 213r such that the upper surface 223a of the element body 223 (equivalent to the upper surface of the first light-emitting element 220A, the upper surface of the second light-emitting element 220B) faces the lower surface 212b of the wavelength converting member 212. The resin composition 213r used can be selected from the resin compositions mentioned as the material of the light guiding member 213. By curing the resin composition 213r, the light guiding member 213 is formed of the resin composition 213r while fixing the first light-emitting element 220A and the second light-emitting element 220B to the wavelength converting member 212.

Figure 14:
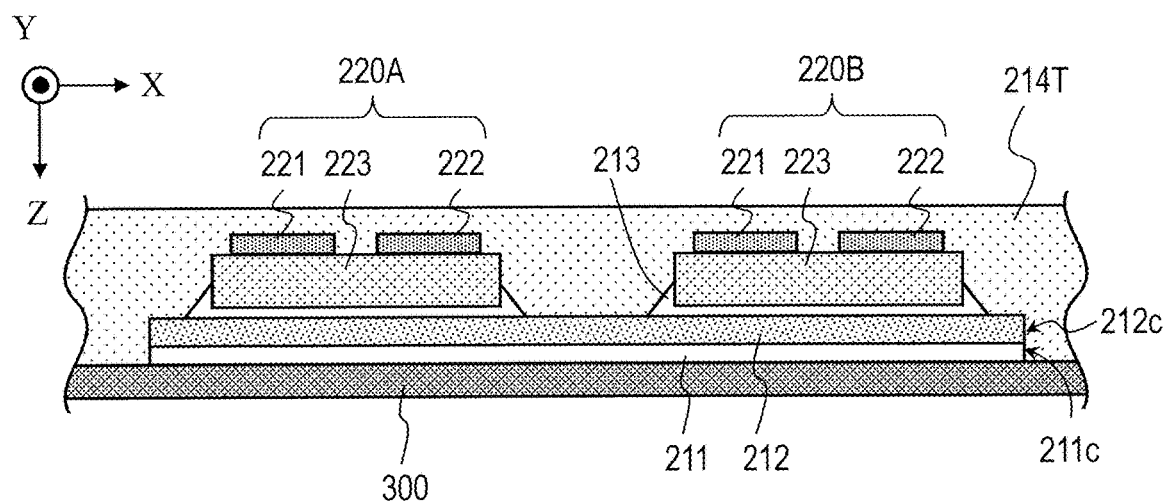
FIG. 14 is a schematic cross-sectional view for illustrating an exemplary light-emitting device manufacturing method of the first embodiment of the present disclosure.

Thereafter, a light-reflective resin layer 214T is formed so as to cover the structure in which the light guiding member 213 has been formed. For example, a structure which includes the light guiding member 213, the multilayer sheet LS, the first light-emitting element 220A and the second light-emitting element 220B is placed on a support 300 such as a heat-resistant adhesive tape as shown in FIG. 14, and then the light-reflective resin layer 214T is formed by transfer molding, spraying, compression molding, etc. As shown in FIG. 14, in this example, the light-reflective resin layer 214T covers the lateral surfaces 211c of the protecting member 211 and the lateral surfaces 212c of the wavelength converting member 212.

The material of the light-reflective resin layer 214T can be selected from the resin compositions mentioned as the material of the light reflecting member 214A. Alternatively, the light-reflective resin layer 214T can be in the form of a layer of a foamed plastic such as foamed polyethylene terephthalate (i.e., foamed PET) in which a light-reflective filler is dispersed.

Figure 15:
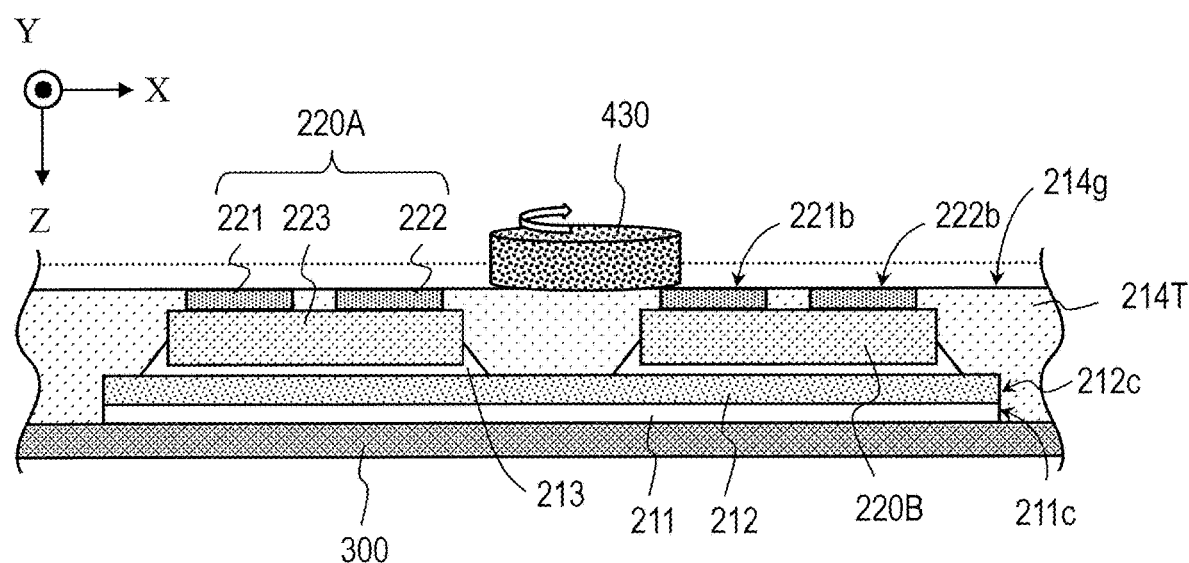
FIG. 15 is a schematic cross-sectional view for illustrating an exemplary light-emitting device manufacturing method of the first embodiment of the present disclosure.

After the light-reflective resin layer 214T is formed, the lower surface 221b of the first electrode 221 and the lower surface 222b of the second electrode 222 are exposed out of the light-reflective resin layer 214T by, typically, grinding. As schematically shown in FIG. 15, by grinding with a grindstone 430 attached to a grinder, the position of the ground surface 214g of the light-reflective resin layer 214T can be adjusted to the position of the lower surface 221b of the first electrode 221 and the lower surface 222b of the second electrode 222. The lower surface 221b of the first electrode 221 and the lower surface 222b of the second electrode 222 do not have to be exposed out of the ground surface 214g. In a groove structure formation step which will be described later, part of the light-reflective resin layer 214T can cover the first electrode 221 and the second electrode 222 so long as the positions of the first electrode 221 and the second electrode 222 can be detected through the light-reflective resin layer 214T.

Figure 16:
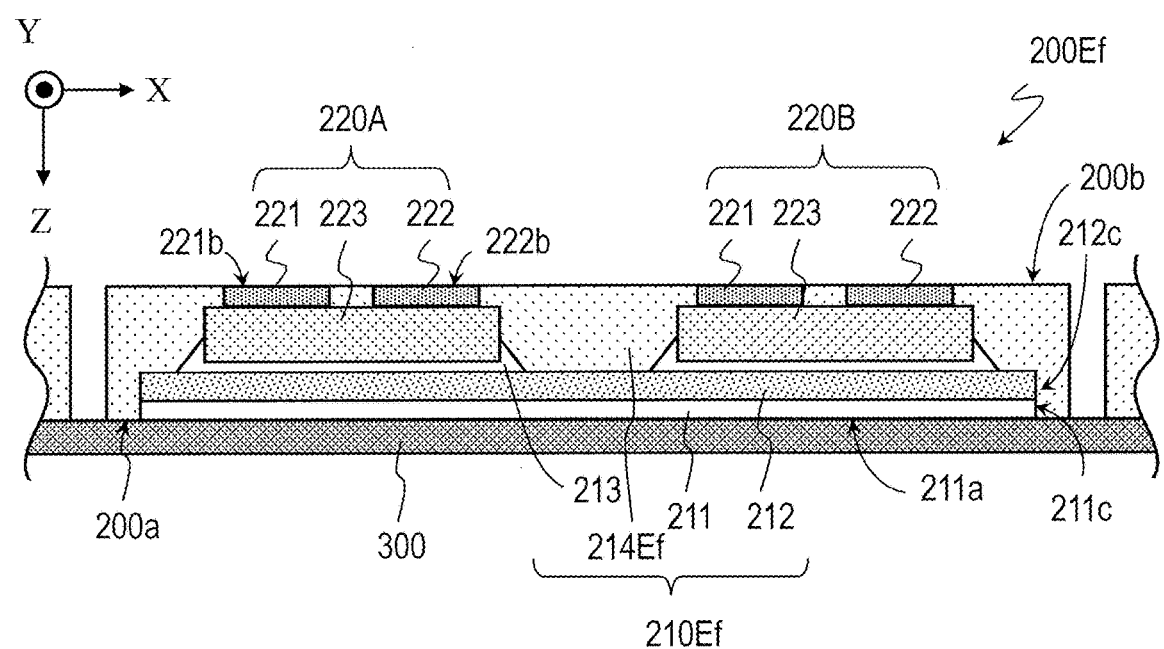
FIG. 16 is a schematic cross-sectional view for illustrating an exemplary light-emitting device manufacturing method of the first embodiment of the present disclosure.

Then, the light-reflective resin layer 214T is cut into portions of a desired shape using a dicing apparatus and the like. Thereby, as shown in FIG. 16, a light-reflective member 214Ef is formed from the light-reflective resin layer 214T, and a light-emitting structure 200Ef which includes a covering member 210Ef covering the first light-emitting element 220A and the second light-emitting element 220B can be formed on the support 300. The covering member 210Ef includes the protecting member 211, the wavelength converting member 212, the light guiding member 213 and the light-reflective member 214Ef.

The light-emitting structure 200Ef has an upper surface 200a (i.e., second surface), which includes the upper surface 211a of the protecting member 211 in part thereof, and a lower surface 200b (i.e., first surface) which is opposite to the upper surface 200a. As illustrated in the drawing, the lower surface 221b of the first electrode 221 and the lower surface 222b of the second electrode 222 are positioned closer to the lower surface 200b than the upper surface 200a of the light-emitting structure 200Ef. In this example, the lower surface 221b of the first electrode 221 and the lower surface 222b of the second electrode 222 are exposed out of the light-reflective member 214Ef. In other words, the lower surface 221b of the first electrode 221 and the lower surface 222b of the second electrode 222 exposed out of the lower surface 200b of the light-emitting structure 200Ef.

Groove Structure Formation Step (B)

Subsequently, a groove structure is formed in the light-emitting structure by laser light irradiation (Step S2 of FIG. 11). Herein, the lower surface 200b of the light-emitting structure 200Ef is irradiated with laser light such that a groove structure is formed in the lower surface 200b.

Figure 17:
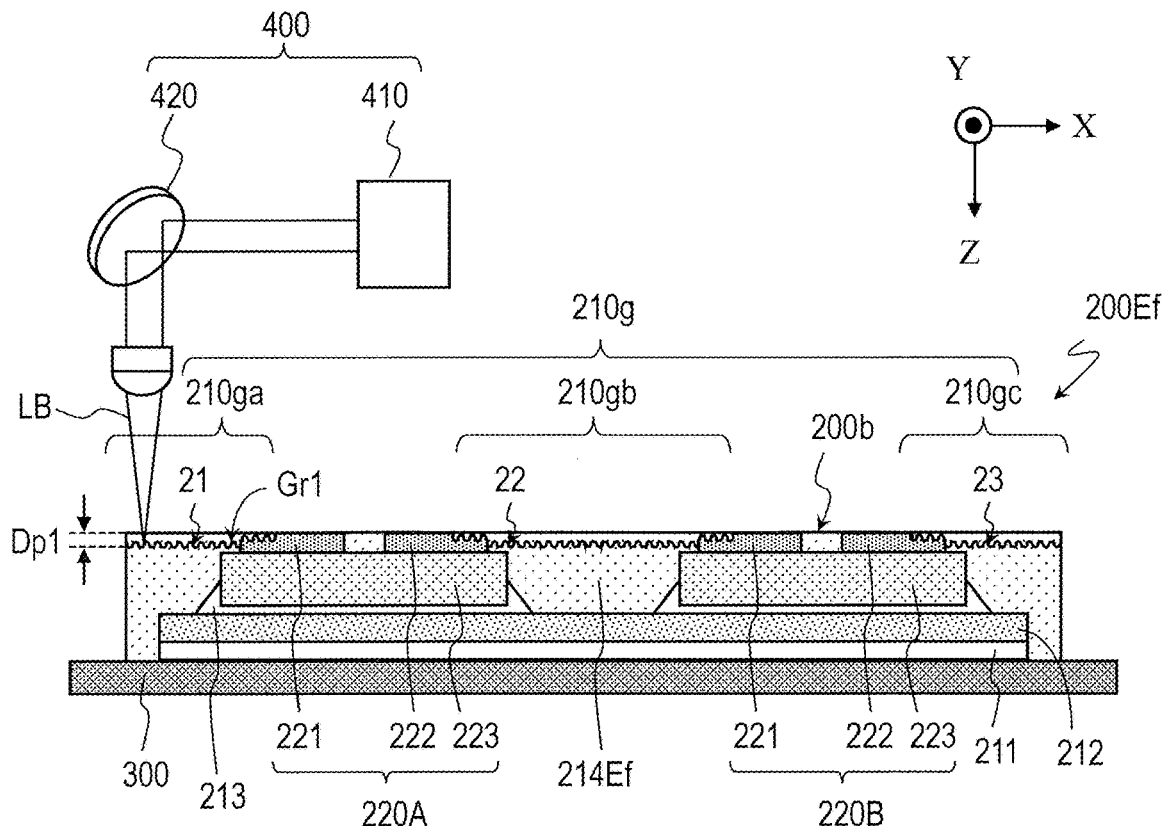
FIG. 17 is a schematic cross-sectional view for illustrating an exemplary light-emitting device manufacturing method of the first embodiment of the present disclosure.

The laser light irradiation can be realized by a known laser ablation apparatus. FIG. 17 schematically shows an example with a laser ablation apparatus 400 which includes a laser light source 410 and a galvanometer mirror 420. The number of galvanometer mirrors in the laser ablation apparatus 400 can be two or more. Examples of the laser light source 410 include $CO_2$ laser, Nd:YAG laser, Nd:$YVO_4$ laser, and the like. Alternatively, a laser light source called green laser which outputs laser light having 532 nm wavelength can also be used as the laser light source 410.

By scanning the lower surface 200*b* of the light-emitting structure 200Ef with a laser light beam LB, part of the covering member 210Ef, part of the first electrode 221 and part of the second electrode 222 can be removed. Herein, part of the covering member 210Ef, part of the first electrode 221 and part of the second electrode 222 are removed, whereby a groove structure 210*g* which includes the first portion 210*ga*, the second portion 210*gb* and the third portion 210*gc* is formed on the lower surface 200*b* side of the light-emitting structure 200Ef. That is, in this example, part of the covering member 210Ef, part of the first electrode 221 and part of the second electrode 222 are removed, whereby the same structure as that of the light-emitting module 200E shown in FIG. 9 is formed.

By forming the groove structure 210*g*, at least part of the first electrode 221 of the first light-emitting element 220A and at least part of the second electrode 222 of the first light-emitting element 220A are exposed inside the groove structure 210*g* as schematically shown in FIG. 17. In this example, part of the first electrode 221 of the first light-emitting element 220A is exposed inside the first portion 210*ga* of the groove structure 210*g*, and part of the second electrode 222 of the first light-emitting element 220A is exposed inside the second portion 210*gb* of the groove structure 210*g*. Part of the first electrode 221 of the second light-emitting element 220B is exposed inside the second portion 210*gb* of the groove structure 210*g*, and part of the second electrode 222 of the second light-emitting element 220B is exposed inside the third portion 210*gc* of the groove structure 210*g*.

As schematically shown in FIG. 17, the first bottom surface 21 of the first portion 210*ga* of the groove structure 210*g*, the second bottom surface 22 of the second portion 210*gb* and the third bottom surface 23 of the third portion 210*gc* can be uneven surfaces. Each of the first portion 210*ga*, the second portion 210*gb* and the third portion 210*gc* of the groove structure 210*g* is formed by, for example, scanning the lower surface 200*b* of the light-emitting structure 200Ef with the laser light beam LB in a certain direction (i.e., first direction). In this case, the first bottom surface 21, the second bottom surface 22 and the third bottom surface 23 are surfaces formed by a set of a plurality of first grooves Gr1 extending in the first direction. The depth of the first portion 210*ga*, in other words, the distance Dp1 from the first bottom surface 21 to the lower surface 200*b* of the light-emitting structure 200Ef, is for example in the range of not less than 5 µm and not more than 50 µm. Herein, it can be said that the position of the first bottom surface 21 is substantially identical with the position of a plurality of apexes formed between two adjacent first grooves Gr1. Likewise, the depth of the second portion 210*gb* of the groove structure 210*g* and the depth of the third portion 210*gc* of the groove structure 210*g* can also be in the range of, for example, not less than 5 µm and not more than 50 µm.

As previously described with reference to FIG. 4, by further irradiating with laser light, a plurality of first recesses Dc1 can be formed in the first bottom surface 21 of the first portion 210*ga*, the second bottom surface 22 of the second portion 210*gb* and the third bottom surface 23 of the third portion 210*gc* so as to overlap the plurality of first grooves Gr1. As previously described, the irradiation pattern of the laser light in formation of the plurality of first recesses Dc1 is different from that adopted in formation of the first grooves Gr1. For example, the plurality of first recesses Dc1 can be formed by irradiation with the laser light beam LB in the second direction that is different from the first direction while having intervals.

The plurality of first recesses Dc1 are formed so as to overlap the plurality of first grooves Gr1, whereby deeper portions are formed in the bottom portion of the groove structure 210, so that a greater anchoring effect can be achieved. Instead of forming the plurality of first recesses Dc1 by irradiating with the laser light beam LB in the second direction while having intervals, a plurality of second grooves Gr2 extending in a direction different from the extending direction of the plurality of first grooves Gr1 (i.e., first direction) can be formed by further irradiating with laser light so as to overlap the plurality of first grooves Gr1 as in the example previously described with reference to FIG. 5. By forming the plurality of second grooves Gr2 in addition to the plurality of first grooves Gr1, portions which are deeper than the first grooves Gr1 and the second grooves Gr2 (i.e., second recesses) are formed at the meeting positions of the first grooves Gr1 and the second grooves Gr2. Thus, improvement in the anchoring effect can be expected as in formation of the plurality of first recesses Dc1.

When using the light-reflective member 214Ef in which light absorbing material is dispersed while forming the groove structure 210*g* by laser light scanning, laser light can effectively be absorbed by the light-reflective member 214Ef so that partial removal of the surface of the light-reflective member 214Ef can be effectively achieved. For example, part of the light-reflective member 214Ef can be deeper than the first electrode 221 and the second electrode 222 of the light-emitting element. A typical example of the material which absorbs the laser light is a colorant. For example, when a UV laser whose center wavelength is in the ultraviolet range is used as the laser light source 410, a filler of titanium dioxide, carbon, barium sulfate, zinc oxide, or the like can be used as the laser light absorbing material by being dispersed in the light-reflective member 214Ef. When a green laser is used as the laser light source 410, carbon, nickel oxide, iron oxide (III) or the like can be used for the filler. When an IR laser whose center wavelength is in the infrared range is used, carbon, calcium sulfate, magnesium silicate, aluminum oxide, tungsten oxide complex or the like can be used for the filler.

When the light-reflective member 214Ef is formed of a foamed plastic, the light-reflective member 214Ef includes cells in which a plurality of pores are formed. Therefore, by partial removal of the light-reflective member 214Ef from the lower surface 200*b* side of the light-emitting structure 200Ef, minute recessed and raised portions are naturally formed in the bottom portion of the groove structure 210*g*. Thus, improvement in the anchoring effect can be expected.

By forming the groove structure 210*g* in the light-emitting structure 200Ef, the light-reflective member 214E is formed from the light-reflective member 214Ef, and the package 210E shown in FIG. 9 can be formed. That is, the light-emitting module 200E which has been previously described with reference to FIG. 9 is obtained.

Wiring Formation Step (C)

Figure 18:
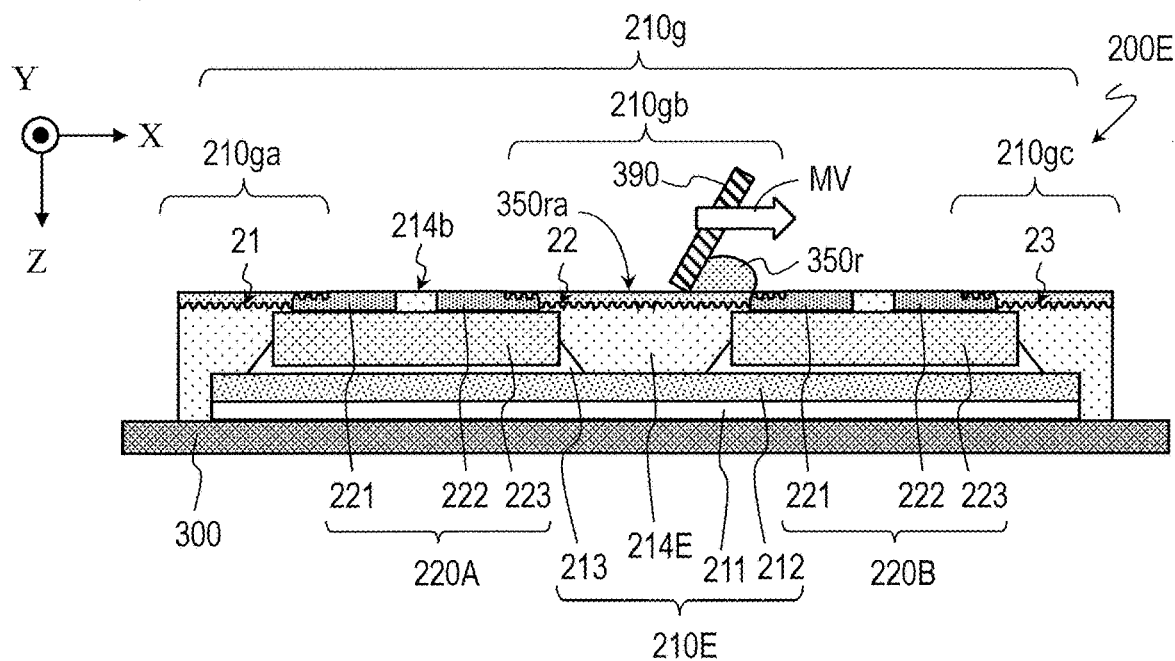
FIG. 18 is a schematic cross-sectional view for illustrating an exemplary light-emitting device manufacturing method of the first embodiment of the present disclosure.

Subsequently, the inside of the groove structure is filled with an electrically-conductive material, whereby a plurality of wirings are formed (Step S3 of FIG. 11). Herein, as schematically shown in FIG. 18, the groove structure 210*g* is filled with an electrically-conductive paste 350*r* as the electrically-conductive material. FIG. 18 shows an example where the electrically-conductive paste 350*r* is placed inside the groove structure 210*g* by printing with the use of the squeegee 390. The electrically-conductive paste 350r can be a material formed by dispersing particles of Au, Ag, Cu or the like in a base material such as an epoxy resin. For example, a known Au paste, Ag paste, or Cu paste can be used as the electrically-conductive paste 350r. The electrically-conductive paste 350r can contain a solvent. Instead of the electrically-conductive paste 350r, for example, an alloy material formed by adding copper powder to a Sn—Bi based solder can be use as the electrically-conductive material.

The electrically-conductive paste 350r is applied to the inside of the groove structure 210g or onto the lower surface 214b of the light-reflective member 214E, and the squeegee 390 is moved across the lower surface 214b as illustrate by thick arrow MV in FIG. 18. In this step, part of the electrically-conductive paste 350r enters the inside of the first grooves Gr1. Another part of the electrically-conductive paste 350r enters the inside of the first recesses Dc1 or the second grooves Gr2. That is, the inside of the first grooves Gr1, the inside of the first recesses Dc1 and the inside of the second grooves Gr2 are filled with the electrically-conductive paste 350r.

A bulging part of the electrically-conductive paste 350r applied onto the light-reflective member 214E which is positioned higher level than the lower surface 214b is removed by moving the squeegee 390. By removing the unnecessary part of the electrically-conductive paste 350r, the surface 350ra of the electrically-conductive paste 350r can be made substantially coplanar with the lower surface 214b of the light-reflective member 214E.

The method of applying the electrically-conductive paste 350r to the light-emitting module 200E is not required to be the method using a squeegee. Application of the electrically-conductive paste 350r can be realized by various printing methods, including spin coating, dip coating, screen printing, offset printing, flexo printing, gravure printing, microcontact printing, inkjet printing, nozzle printing, and aerosol jet printing. As a matter of course, the electrically-conductive paste 350r can be applied to the light-emitting module 200E by a method other than printing.

Thereafter, the electrically-conductive paste 350r placed inside the groove structure 210g is cured by heating or light irradiation. By curing the electrically-conductive paste 350r, a wiring pattern can be formed of the electrically-conductive paste 350r such that the wiring pattern has a shape which matches with the shape of the groove structure 210g as viewed in the normal direction of the lower surface 100b of the light-emitting device as in the example shown in FIG. 3. In this example, by curing the electrically-conductive paste 350r, a first wiring 310 which has a shape matched with the shape of the first portion 210ga is formed inside the first portion 210ga of the groove structure 210g, and a second wiring 320 which has a shape matched with the shape of the second portion 210gb is formed inside the second portion 210gb of the groove structure 210g. Also, a third wiring 330 which has a shape matched with the shape of the third portion 210gc is formed inside the third portion 210gc. Through the above-described process, the light-emitting device 100E shown in FIG. 9 can be manufactured.

When necessary, an additional grinding step can be carried out after the electrically-conductive paste 350r has been cured. In the example shown in FIG. 19, the surface of the cured electrically-conductive paste 350r and the lower surface 200Eb of the light-emitting module 200E are ground using a grindstone 430. By grinding, the lower surface 310b of the first wiring 310, the lower surface 320b of the second wiring 320 and the lower surface 330b of the third wiring 330, which are the ground surfaces, can be made coplanar with the lower surface 200Eb of the light-emitting module 200E. Also, the residue of the electrically-conductive paste 350r adhered to the lower surface 200Eb of the light-emitting module 200E can be removed. When necessary, a copper plating layer or a nickel-gold plating layer can be formed on the cured electrically-conductive paste 350r.

Because part of the first electrode 221 of the first light-emitting element 220A is exposed inside the first portion 210ga, the first wiring 310 is electrically connected with the first electrode 221 of the first light-emitting element 220A. Likewise, because part of the second electrode 222 of the second light-emitting element 220B is exposed inside the third portion 210gc, the third wiring 330 is electrically connected with the second electrode 222 of the second light-emitting element 220B. In this example, part of the second electrode 222 of the first light-emitting element 220A and part of the first electrode 221 of the second light-emitting element 220B are exposed inside the second portion 210gb. Therefore, the second wiring 320 formed inside the second portion 210gb electrically connects the second electrode 222 of the first light-emitting element 220A and the first electrode 221 of the second light-emitting element 220B with each other.

The second electrode 222 of the first light-emitting element 220A is, for example, the cathode of the first light-emitting element 220A. The first electrode 221 of the second light-emitting element 220B is, for example, the anode of the second light-emitting element 220B. In this case, the first light-emitting element 220A and the second light-emitting element 220B are electrically connected in series by forming the first wiring 310, the second wiring 320 and the third wiring 330. Alternatively, when the first electrode 221 of the second light-emitting element 220B and the second electrode 222 of the first light-emitting element 220A are cathodes, the cathode electrode of the first light-emitting element 220A and the cathode electrode of the second light-emitting element 220B are electrically connected together via the second wiring 320. In other words; the first light-emitting element 220A and the second light-emitting element 220B can be electrically connected in parallel by forming the first wiring 310, the second wiring 320 and the third wiring 330. When the first light-emitting element 220A and the second light-emitting element 220B are connected in parallel, the first wiring 310 can be short-circuited to the third wiring 330.

Thus, according to the present embodiment, for example, the first wiring 310 connected with the first electrode 221 of the light-emitting element and the second wiring 320 connected with the second electrode 222 of the light-emitting element can be relatively easily formed in the groove structure 210g. That is, a wiring pattern is included on the light-emitting device side. For example, the light-emitting device can be driven by such a simple connection that a power supply connector is connected to the first wiring 310 and the second wiring 320. Therefore, the light-emitting device can be driven without the necessity of using a wiring board which has a predetermined wiring pattern. Even when the light-emitting device includes a plurality of light-emitting elements, a light-emitting device which includes wirings for connecting these light-emitting elements can be provided.

In the step illustrated in FIG. 12, a plurality of multilayer sheets LS can be provided. These sheets can be two-dimensionally arrayed on a support such as a heat-resistant adhesive tape before being subjected to the process illustrated in FIG. 13, FIG. 14, FIG. 15 and FIG. 16. In this case, after the light-reflective resin layer 214T is formed, the light-reflective resin layer 214T is cut at a position between two adjacent multilayer sheets LS on the support, whereby plurality of light-emitting modules 200E can be efficiently produced. In the example shown in FIG. 16 the lateral surfaces 211c of the protecting member 211 and the lateral surfaces 212c of the wavelength converting member 212 are covered with the light-reflective member 214Ef. However, when the structure on the support 300 is cut at a position which includes not only the light-reflective resin layer 214T but also the protecting member 211 and the wavelength converting member 212, a light-emitting device can be produced in which the lateral surfaces 211c of the protecting member 211 and the lateral surfaces 212c of the wavelength converting member 212 are exposed out of the light-reflective member as in the configuration described with reference to FIG. 7 and FIG. 8.

Although in the example described with reference to FIG. 13 two light-emitting elements, the first light-emitting element 220A and the second light-emitting element 220B, are placed on the multilayer sheet LS, the number of light-emitting elements placed on the multilayer sheet LS can be appropriately determined. When a single light-emitting element 220 is placed on a single multilayer sheet LS, the light-emitting device 100A shown in FIG. 2 is formed. Structures each including a single light-emitting element 220 fixed onto each multilayer sheet LS can be two-dimensionally arrayed on a support, and covered with a single light-reflective resin layer 214T. For example, the light-emitting device 100F shown in FIG. 10 can be produced by cutting into pieces each including two of the structures in which a single light-emitting element 220 is included for each multilayer sheet LS.

Figure 20:
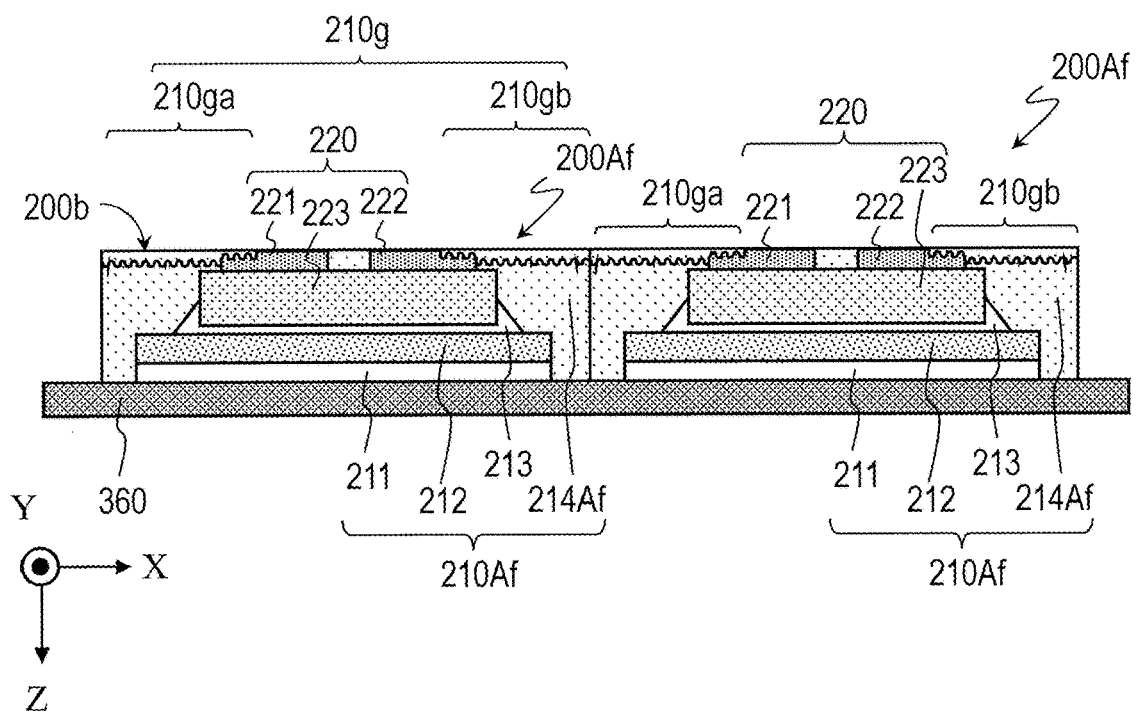
FIG. 20 is a schematic cross-sectional view for illustrating a variation of the light-emitting device manufacturing method of the first embodiment of the present disclosure.

After a plurality of light-emitting structures are formed in the above-described light-emitting structure providing step (A), the plurality of light-emitting structures can be electrically connected together in the wiring formation step (C). In the example shown in FIG. 20, just after a plurality of light-emitting structures 200Af are formed each of which includes a light-emitting element 220 and a covering member 210Af covering the light-emitting element 220, two light-emitting structures 200Af (i.e., the first and second light-emitting structures) are placed on a support 360 (i.e., a heat-resistant adhesive tape).

Each of the light-emitting structures 200Af is formed, for example, through the process described with reference to FIG. 12, FIG. 13, FIG. 14, FIG. 15, FIG. 16 and FIG. 17 such that a single light-emitting element 220 is provided on a single multilayer sheet LS. Each of the light-emitting structures 200Af has a groove structure 210g which includes the first portion 210ga and the second portion 210gb on the lower surface 200b side. The covering member 210Af of each light-emitting structure 200Af includes a light-reflective member 214Af. The light-reflective member 214Af of the first light-emitting structure 200Af and the light-reflective member 214Af of the second light-emitting structure 200Af are placed on the support 360 with no gap therebetween. The light-reflective members 214Af of these two light-emitting structures 200Af can be joined together by an adhesive agent or the like.

Figure 19:
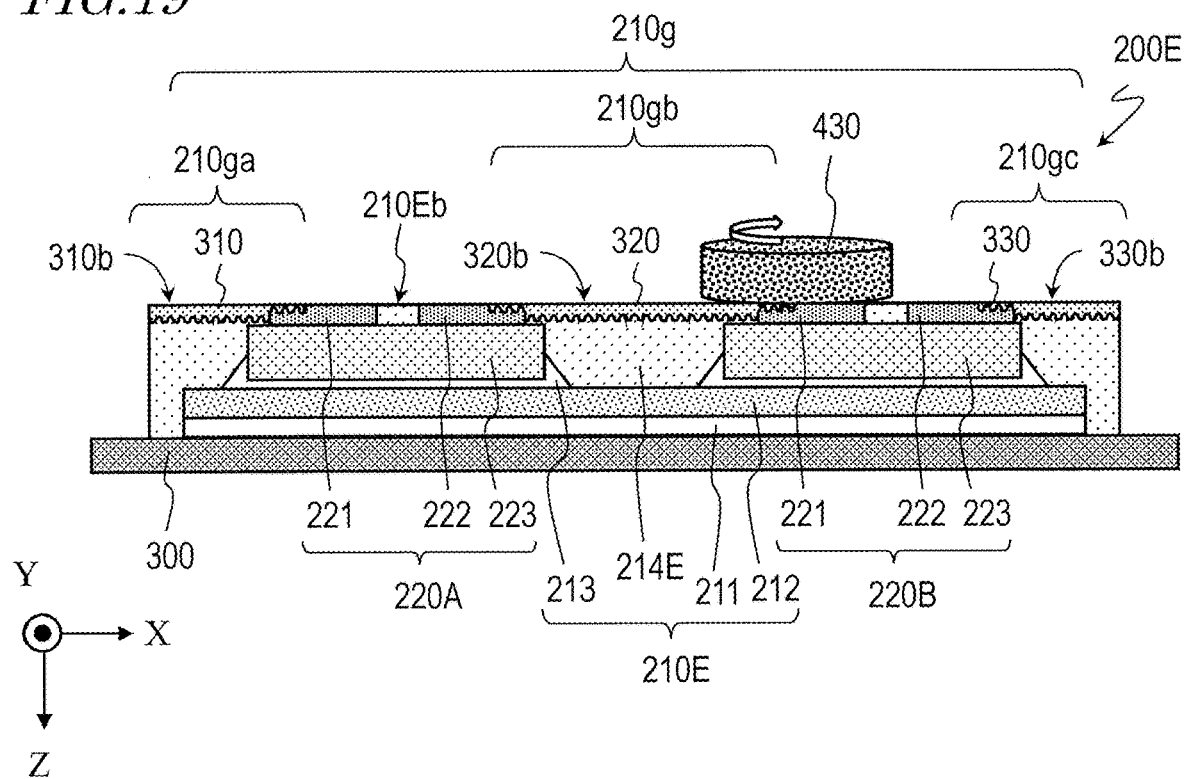
FIG. 19 is a schematic cross-sectional view for' illustrating an exemplary light-emitting device manufacturing method of the first embodiment of the present disclosure.

After the first and second light-emitting structures 200Af are placed, wirings are formed inside the first portion 210ga and the second portion 210gb through the same process as that described with reference to FIG. 18 and FIG. 19. Thereby, as shown in FIG. 21, a light-emitting device 100N is obtained in which two light-emitting modules 200A are connected by the second wiring 320.

Figure 21:
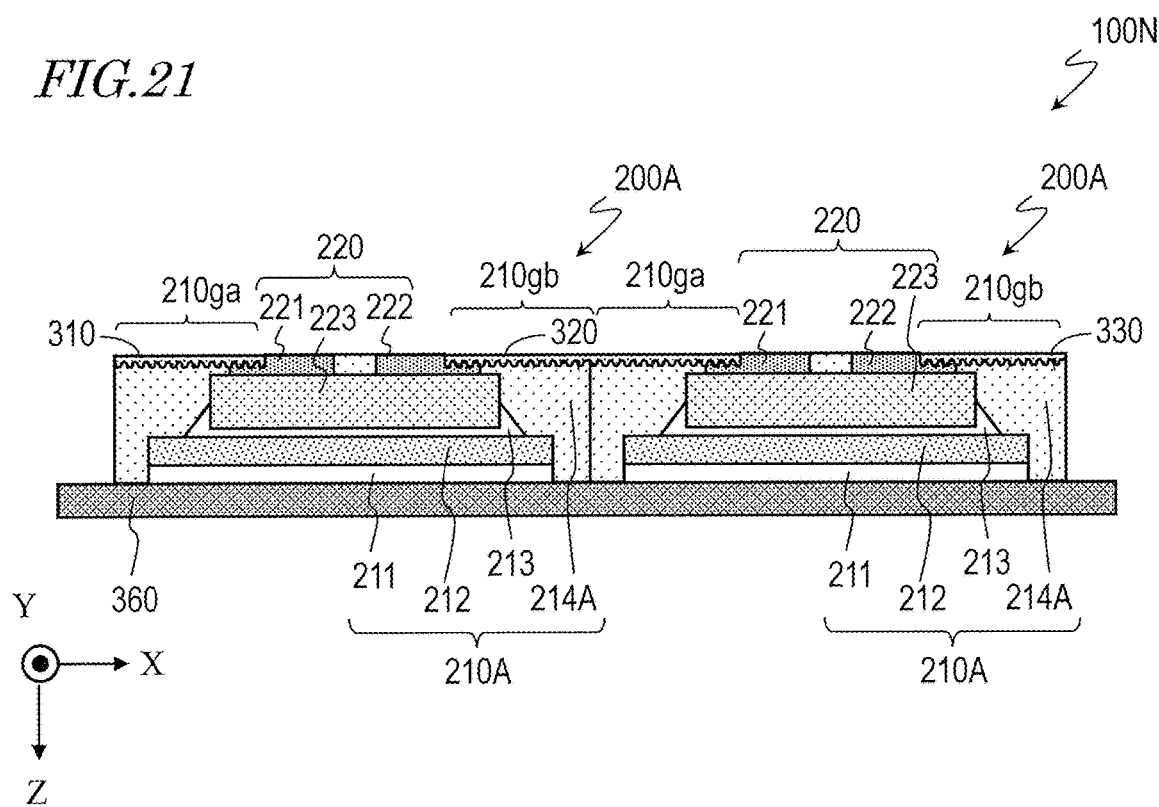
FIG. 21 is a schematic stepwise cross-sectional view showing a resultant structure after a wiring is formed inside a groove structure 210g of FIG. 20.

In the configuration illustrated in FIG. 21, the second wiring 320 is continuously provided inside the second portion 210gb of the groove structure 210g provided in the light-emitting module 200A shown in the left side of the drawing and the first portion 210ga of the groove structure 210g provided in the light-emitting module 200A shown in the right side of the drawing so as to extend from one to the other. That is, the second wiring 320 electrically connects the second electrode 222 of the light-emitting element 220 of the light-emitting module 200A shown in the left side of the drawing and the first electrode 221 of the light-emitting element 220 of the light-emitting module 200A shown in the right side of the drawing. The first wiring 310 is provided in the first portion 210ga of the groove structure 210g provided in the light-emitting module 200A shown in the left side of the drawing. The third wiring 330 is provided in the second portion 210gb of the groove structure 210g provided in the light-emitting module 200A shown in the right side of the drawing. Therefore, these light-emitting modules 200A can be driven by connecting the first wiring 310 and the third wiring 330 to an external power supply.

Figure 22:
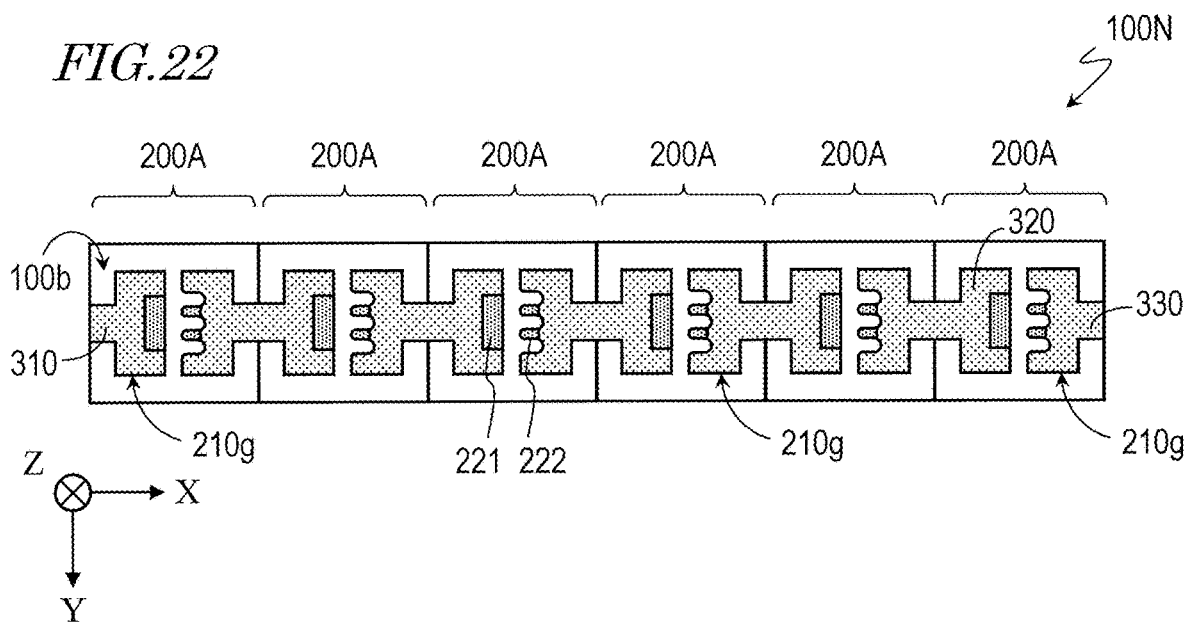
FIG. 22 is a schematic bottom view showing an example where light-emitting, elements 220 of a plurality of light-emitting modules 200A are electrically connected together by the first wiring 310, the second wiring 320 and the third wiring 330 formed in the groove structure 210g.

FIG. 22 shows an example where six light-emitting modules 200A are one-dimensionally arrayed, and electrodes of adjacent modules are electrically connected with each other by a second wiring 320. As illustrated in FIG. 22, a bar-like light source can be produced by, for example, one-dimensionally arraying a plurality of light-emitting modules 200A. As clearly seen from this example, the number of light-emitting modules in which electrical connection is formed by wirings provided in the groove structure 210g can be appropriately determined.

Figure 23:
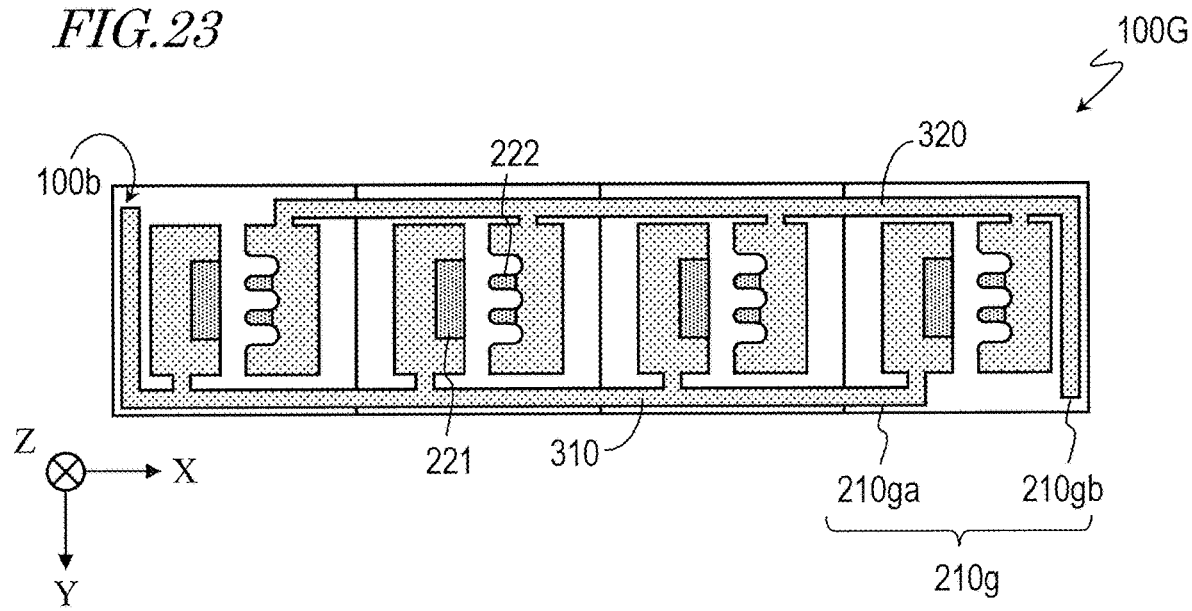
FIG. 23 is a schematic bottom view showing another example of the electrical connection of the plurality of light-emitting modules by the first wiring 310 and the second wiring 320.

The electrical connection of the light-emitting elements 220 included in the plurality of light-emitting modules can be serial connection or can be parallel connection. The light-emitting device 100G shown in FIG. 23 includes four light-emitting modules which are one-dimensionally arrayed. In the configuration illustrated in FIG. 23, the first wiring 310 and the second wiring 320 provided inside the groove structure 210g at the lower surface 100b respectively electrically connect the first electrode 221 and the second electrode 222 of the light-emitting element included in each light-emitting module. FIG. 23 shows an example where the light-emitting elements 220 included in the plurality of light-emitting modules are electrically connected in parallel. In this example, the first wiring 310 and the second wiring 320 are used as terminals so that the light-emitting elements 220 included in these light-emitting modules can be simultaneously lit on or off.

Figure 24:
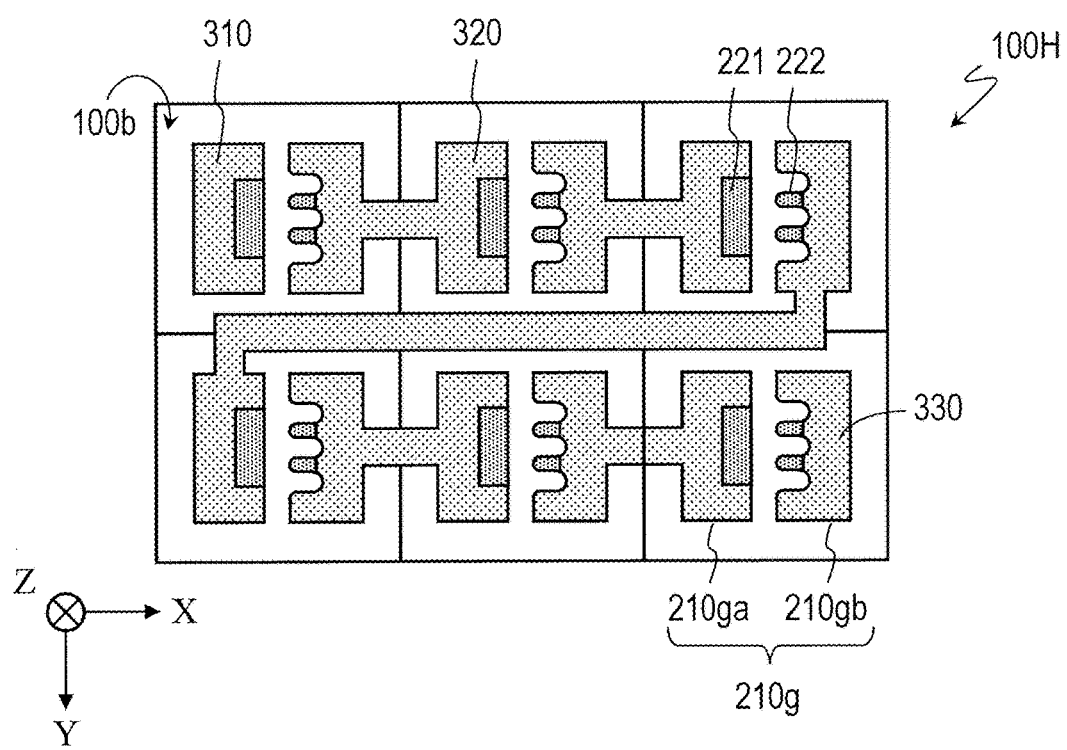
FIG. 24 is a schematic bottom view showing an example where a plurality of light-emitting modules are two-dimensionally arrayed.

FIG. 24 shows an example where six light-emitting modules are two-dimensionally arrayed, and the light-emitting elements 220 included in these modules are electrically connected by the first wiring 310, the second wiring 320 and the third wiring 330 provided in the groove structure 210g. The light-emitting device 100H shown in FIG. 24 has an array of six light-emitting modules in two rows and three columns. In this example, likewise as in the light-emitting device 100N described with reference to FIG. 21 and FIG. 22, the first electrode 221 of one light-emitting module and the second electrode 222 of another light-emitting module are electrically connected via the second wiring 320. Therefore, the first wiring 310 and the third wiring 330 can be used as a set of the cathode-side terminal and the anode-side terminal. The six light-emitting modules can be mounted to a wiring board or the like in a relatively easy manner without the necessity of individually mounting the six light-emitting modules.

As illustrated in FIG. 24, a plurality of light-emitting modules are two-dimensionally arrayed, whereby a large-area emission surface can be realized. Thus, according to the present embodiment, a plurality of light-emitting structures can be electrically connected in a relatively easy manner by the wirings provided inside the groove structure of each light-emitting structure. Therefore, a large-area emission surface can be realized through a simple process. Thus, a plurality of light-emitting structures each having a groove structure 210g are one-dimensionally or two-dimensionally arrayed, and then, wirings are formed of an electrically-conductive paste or the like in the groove structure 210g. In this way, wirings for electrically connecting the light-emitting elements among the plurality of light-emitting modules can be simultaneously formed in an efficient manner.

Figure 25:
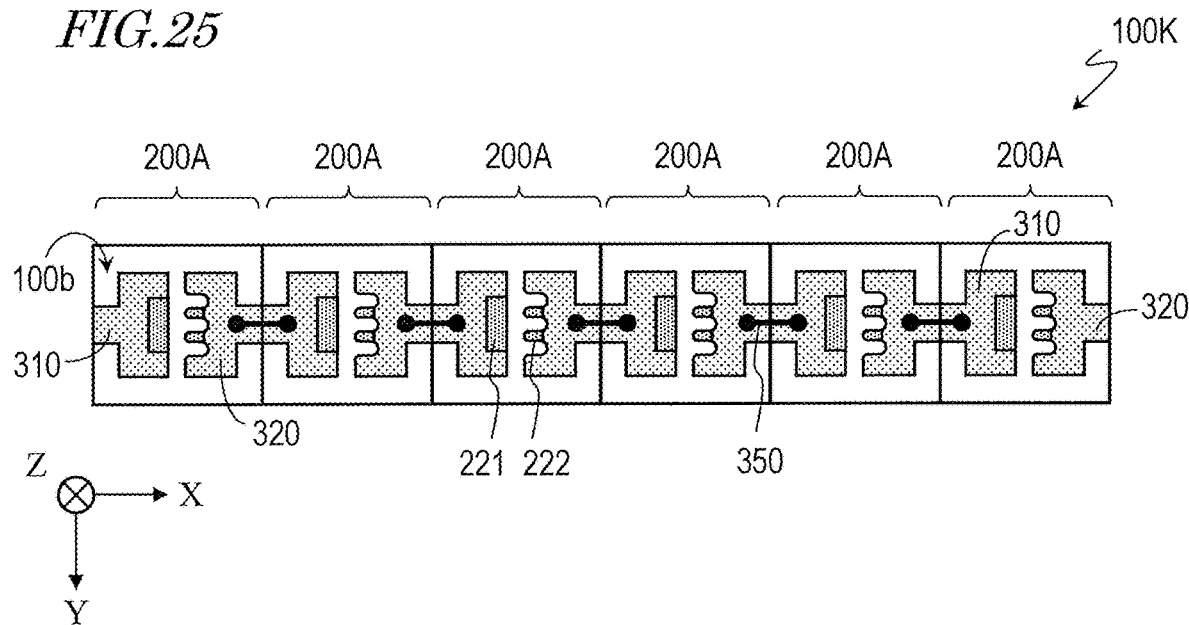
FIG. 25 is a schematic bottom view showing an example where a plurality of light-emitting modules are electrically connected together by wirings.

The electrical connection between the light-emitting elements of the plurality of light-emitting modules is not required to be performed by the wirings continuously formed inside the groove structure 210g between two adjoining light-emitting modules via. The light-emitting device 100K shown in FIG. 25 includes a plurality of light-emitting modules 200A, a plurality of first wirings 310 and a plurality of second wirings 320, and a plurality of wires 350. In the configuration illustrated in FIG. 25, the first wiring 310 formed in one light-emitting module 200A and the second wiring 320 formed in another light-emitting module 200A which is adjacent to that light-emitting module 200A are electrically connected to each other by one of the wirings 350. The arrangement of the plurality of light-emitting modules can be appropriately determined. For example, a plurality of light-emitting modules can be arranged in an annular arrangement and electrically connected to each other.

Figure 26:
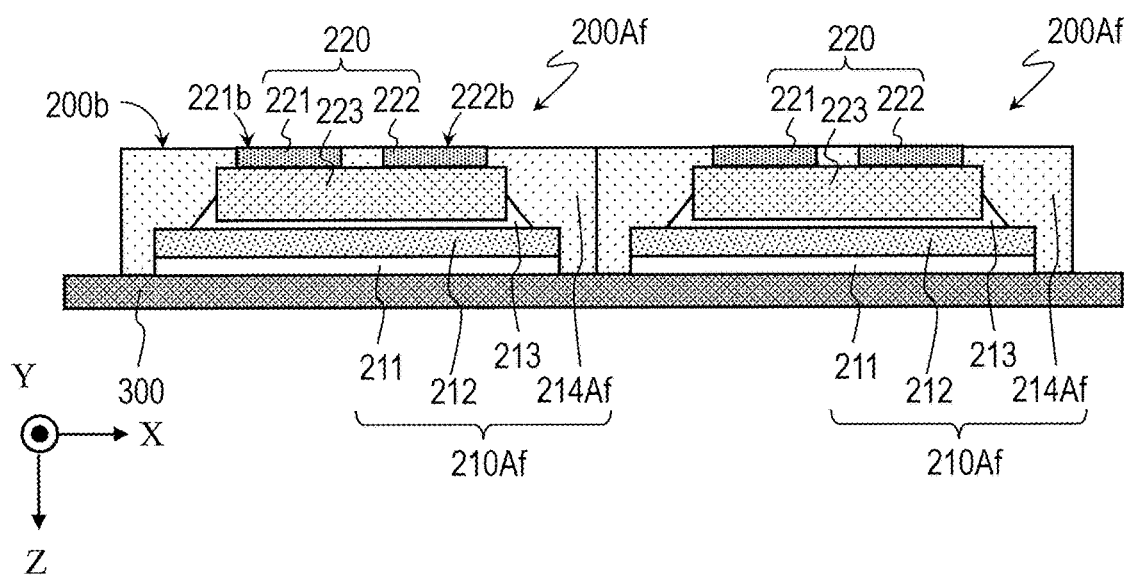
FIG. 26 is a schematic cross-sectional view for illustrating another variation of a light-emitting device manufacturing method of the first embodiment of the present disclosure.

Alternatively, just after a plurality of light-emitting structures are formed, those light-emitting structures can be one-dimensionally or two-dimensionally arrayed, and groove structures can be formed in the lower surfaces of the plurality of light-emitting structures. FIG. 26 shows a plurality of light-emitting structures 200Af arrayed on the support 300 with no gap therebetween. Although FIG. 26 shows an example where two light-emitting structures 200Af each including a light-reflective member 214Af are one-dimensionally arrayed in the X-direction for simplicity, the number and arrangement of light-emitting structures 200Af can be appropriately determined.

Figure 27:
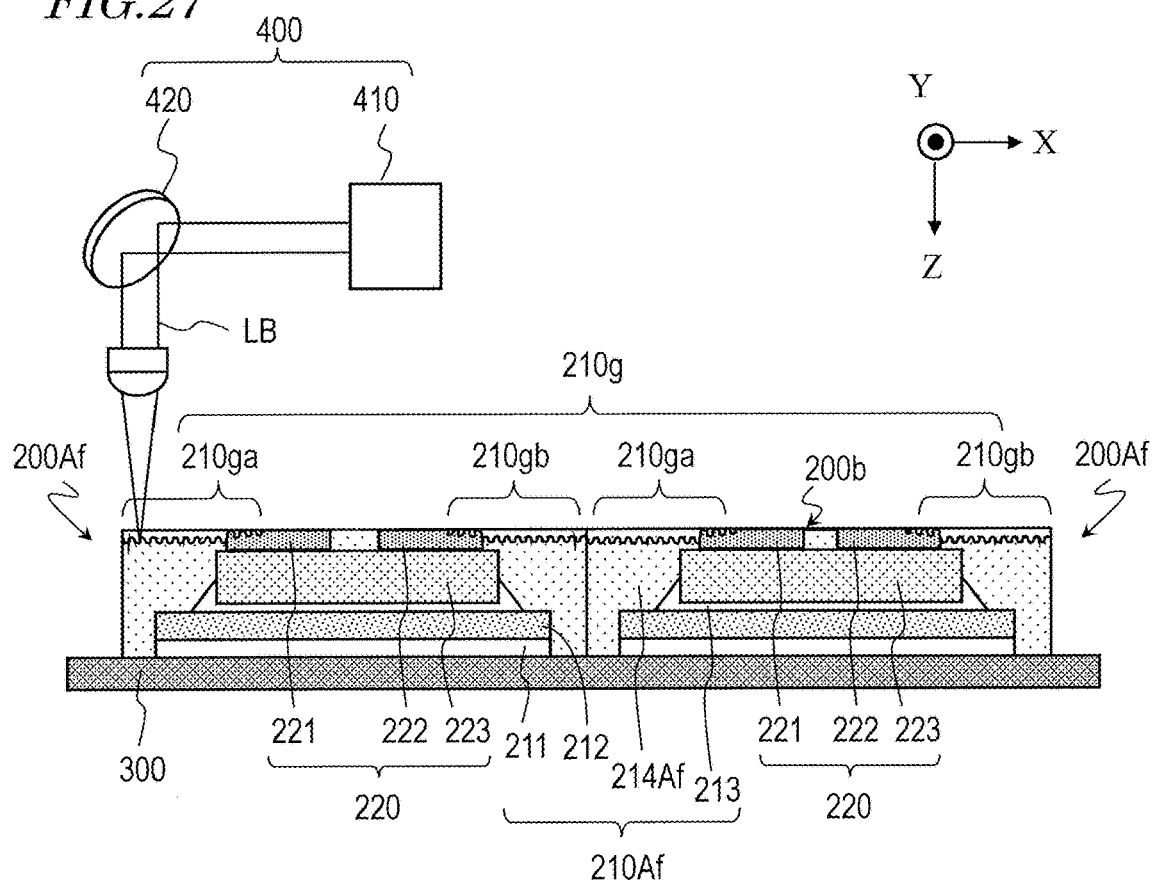
FIG. 27 is a schematic cross-sectional view for illustrating another variation of a light-emitting device manufacturing method of the first embodiment of the present disclosure.

Subsequently, the above-described groove structure formation step is performed. For example, as schematically shown in FIG. 27, the lower surface 200b of the light-emitting structures 200Af is scanned with the laser light beam LB such that the groove structure 210g is formed in the lower surface 200b. In this step, a plurality of first grooves Gr1 can be formed on the lower surface 200b side of the light-emitting structures 200Af. Likewise as in the above-described example, a plurality of first recesses Dc1 can be further formed so as to overlap the plurality of first grooves Gr1. Alternatively, a plurality of second grooves Gr2 can be further formed so as to overlap the plurality of first grooves Gr1 instead of further forming a plurality of first recesses Dc1.

Figure 28:
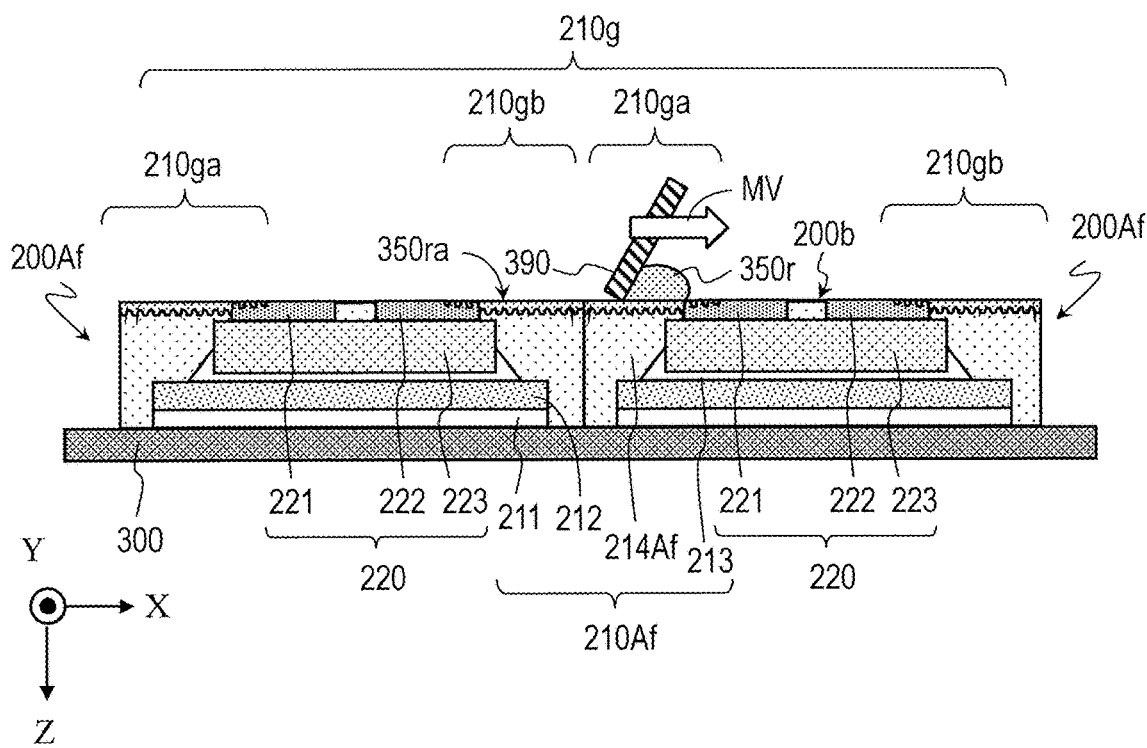
FIG. 28 is a schematic cross-sectional view for illustrating another variation of a light-emitting device manufacturing method of the first embodiment of the present disclosure.

Subsequent steps can be the same as those described with reference to FIG. 18 and FIG. 19. That is, as schematically shown in FIG. 28, for example, an electrically-conductive paste 350r is placed in the groove structure 210g formed in each of the light-emitting structures 200Af. Thereafter, the electrically-conductive paste 350r is cured. When necessary, the grinding step which has previously been described with reference to FIG. 19 can further be carried out thereafter.

Through the process described hereinabove, the same structure as that of the light-emitting device 100N shown in FIG. 21 is formed on the support 300. When a plurality of light-emitting structures are arrayed prior to formation of the groove structure 210g as in this example, groove structures 210g can be formed simultaneously in the plurality of light-emitting structures, and wirings matched with the shape of the groove structures 210g can be efficiently formed.

Second Embodiment

Figure 29:
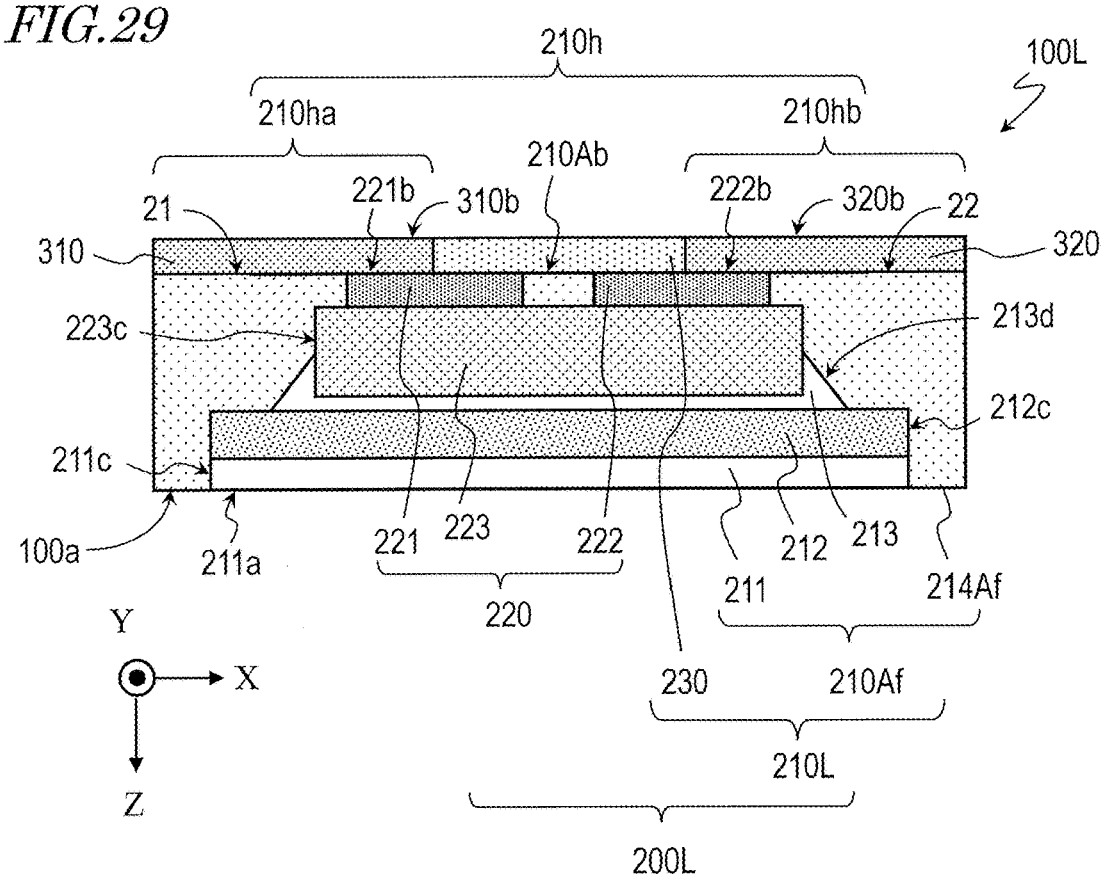
FIG. 29 is a schematic cross-sectional view showing a light-emitting device of a second embodiment of the present disclosure.

FIG. 29 shows a cross section of an exemplary light-emitting device of the second embodiment of the present disclosure. FIG. 29 schematically shows a cross section of the light-emitting device 100L of the second embodiment of the present disclosure taken along a plane perpendicular to the upper surface 100a in the center or its vicinity of the light-emitting device 100L. The external appearance of the light-emitting device 100L as viewed from the upper surface 100a side can be the same as that of the light-emitting device 100A shown in FIG. 1 and, therefore, illustration thereof is herein omitted.

As schematically shown in FIG. 29, the light-emitting device 100L generally includes a light-emitting module 200L, and a first wiring 310 and a second wiring 320. The light-emitting module 200L includes a light-emitting element 220. The present embodiment is substantially equal to the first embodiment in that the light-emitting module 200L has a groove structure 210h on the lower surface side which is opposite to the upper surface 100a of the light-emitting device 100L, and the first wiring 310 and the second wiring 320 are provided inside the groove structure 210h. Also in the example shown in FIG. 29, the groove structure 210h includes two portions, the first portion 210ha and the second portion 210hb. The first wiring 310 is present inside the first portion 210ha of the groove structure 210h, and is connected with part of the first electrode 221 of the light-emitting element 220 which is exposed to an inside of the first portion 210ha. The second wiring 320 is present inside the second portion 210hb of the groove structure 210h, and is connected with part of the second electrode 222 of the light-emitting element 220 which is exposed to an inside of the second portion 210hb.

As does the light-emitting device of the first embodiment, the light-emitting module 200L includes a package 210L which covers the light-emitting element 220. Herein, the package 210L includes a covering member 210Af and a resin layer 230. The covering member 210Af includes a protecting member 211, a wavelength converting member 212, a light guiding member 213, and a light-reflective member 214Af. The number of light-emitting elements covered with the package 210L is not required to be one but can be two or more.

Covering Member 210Af

As schematically shown in FIG. 29, the covering member 210Af covers the light-emitting element 220 except for part of the lower surface 221b of the first electrode 221 of the light-emitting element 220 and part of the lower surface 222b of the second electrode 222 of the light-emitting element 220. It can be said that the covering member 210Af is substantially equal to the covering member 210Af shown in FIG. 26. As illustrated in the drawing, in this example, part of the lower surface 221b of the first electrode 221 is exposed inside the first portion 210ha of the groove structure 210h. The position of the first bottom surface 21 of the first portion 210ha is substantially the same height as the position of the lower surface 221b of the first electrode 221 in the Z direction as seen in this cross-sectional view. Likewise, in this example, part of the lower surface 222b of the second electrode 222 is exposed inside the second portion 210hb of the groove structure 210h, and the position of the second bottom surface 22 of the second portion 210hb is substantially the same height as the position of the lower surface 222b of the second electrode 222 in the Z direction as seen in this cross-sectional view.

In the example shown in FIG. 29, the first bottom surface 21 of the first portion 210ha and the second bottom surface 22 of the second portion 210hb are substantially flat surfaces. However, the shape of the bottom portion of the groove structure 210h is not required to be a flat surface. The first bottom surface 21 and the second bottom surface 22 can have surface unevenness likewise as in the example previously described with reference to, for example, FIG. 2. For example, the first bottom surface 21 and the second bottom surface 22 can be formed by a set of a plurality of first grooves Gr1. A plurality of first recesses Dc1 and/or a plurality of second grooves Gr2 can be formed so as to overlap the plurality of first grooves Gr1. Various configurations described in this specification can be used in arbitrary combinations so long as no technical inconsistency occurs.

The light-reflective member 214Af in the covering member 210Af surrounds the light-emitting element 220 and, in this example, covers the lateral surfaces 211c of the protecting member 211 and the lateral surfaces 212c of the wavelength converting member 212. As a matter of course, such a configuration is also possible that the lateral surfaces 211c of the protecting member 211 and the lateral surfaces 212c of the wavelength converting member 212 are exposed out of the light-reflective member as in the example shown in FIG. 8.

Resin Layer 230

Figure 30:
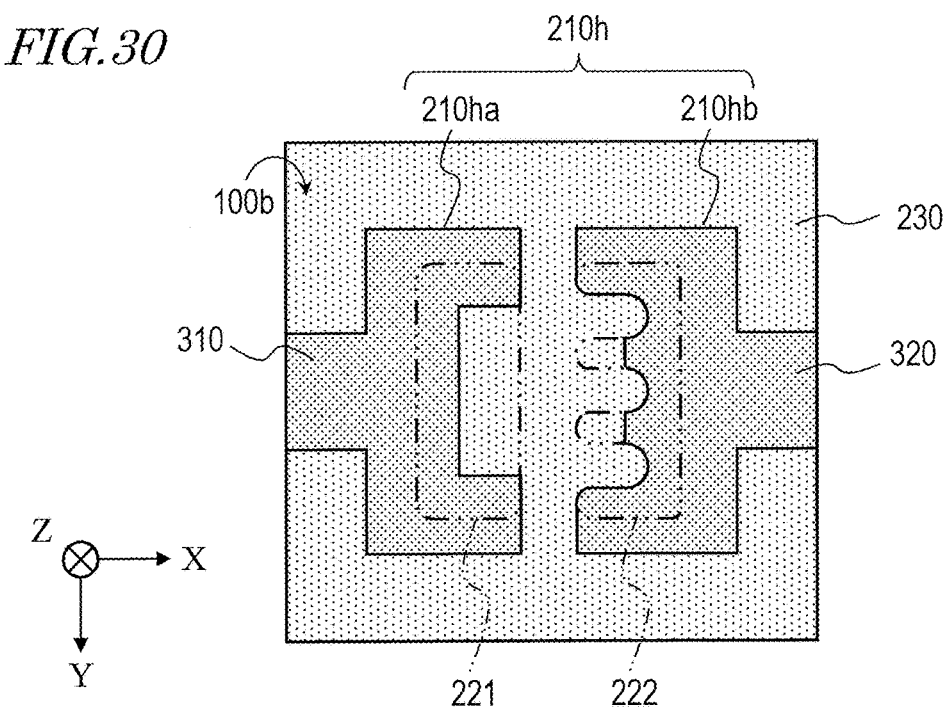
FIG. 30 is a schematic bottom view of the light-emitting device 100L shown in FIG. 29 as viewed from the lower surface 100b side.

The resin layer 230 is provided on the lower surface 210Ab of the covering member 210Af, in other words, on the lower surface side of the package 210L at which the groove structure 210h is provided, and has openings in part thereof. FIG. 30 shows an example of the external appearance of the light-emitting device 100L shown in FIG. 29 as viewed from the lower surface 100b side that is opposite to the upper surface 100a. As seen from FIG. 29 and FIG. 30, the first wiring 310 and the second wiring 320 occupy the inner space of the openings of the resin layer 230. That is, in the present embodiment, it can be said that the groove structure 210h of the light-emitting module 200L has a planar shape defined by the openings formed in the resin layer 230. As a matter of course, the shape of the groove structure 210h shown in FIG. 30 is merely exemplary. The shape of the groove structure 210h as viewed from the bottom does not have particular requirement so long as it overlaps part of the first electrode 221 of the light-emitting element and part of the second electrode 222 of the light-emitting element.

The resin layer 230 can be a layer formed by curing an adhesive agent. The adhesive agent used can be, a known thermoplastic or thermosetting material, for example, a thermoplastic resin, a thermosetting resin, or a synthetic elastomer. The material of the resin layer 230 can be a copolymer of acrylonitrile and 1,3-butadiene (also referred to as NBR) or an epoxy resin. An epoxy resin to which NBR or an acrylic resin is added can be used as the material of the resin layer 230.

Also in the present embodiment, a set of the first wiring 310 and the second wiring 320 can serve as a set of the anode and cathode of the light-emitting device 100L likewise as in the first embodiment. That is, the light-emitting device 100L can be driven by connecting a driver, a power supply circuit, etc., to the first wiring 310 and the second wiring 320. Particularly when the resin layer 230 is an adhesive layer, the light-emitting device 100L can be temporarily attached to a wiring board or the like using the adhesive layer, and mounting can be carried out more easily.

Manufacturing Method of Light-Emitting Device

Hereinafter, a light-emitting device manufacturing method of the second embodiment of the present disclosure is described with reference to the drawings. FIG. 31 illustrates the outline of the light-emitting device manufacturing method of the second embodiment of the present disclosure. The light-emitting device manufacturing method illustrated in FIG. 31 includes: providing a light-emitting structure, the light-emitting structure including a light-emitting element which includes the first electrode and the second electrode and a covering member which covers the light-emitting element (Step S11); placing a mask having a sheet shape above the lower surface of the electrodes of the light-emitting element (Step S12); irradiating with laser light to remove at least part of the mask such that at least part of the first electrode and at least part of the second electrode are exposed (Step S13); and forming a plurality of wirings by filling a portion from which the mask has been removed with an electrically-conductive material (Step S14). According to the manufacturing method described herein, a plurality of light-emitting structures are formed each of which includes a light-emitting element and a covering member that covers the light-emitting element, and a light-emitting device which includes a plurality of light-emitting modules is formed from these light-emitting structures.

Light-Emitting Structure Providing Step (A')

First, a plurality of light-emitting structures 200Af are provided each of which includes a light-emitting element 220 and a covering member 210Af that covers the light-emitting element 220 (Step S11 of FIG. 31). Herein, likewise as in the example previously described with reference to FIG. 26, the plurality of light-emitting structures 200Af are arranged on a support 300 such as a heat-resistant adhesive tape. At the stage of providing the plurality of light-emitting structures 200Af, typically, the lower surface 221b of the first electrode 221 and the lower surface 222b of the second electrode 222 of each light-emitting element 220 are exposed out of the light-reflective member 214Af.

Mask Placing Step (B')

Figure 32:
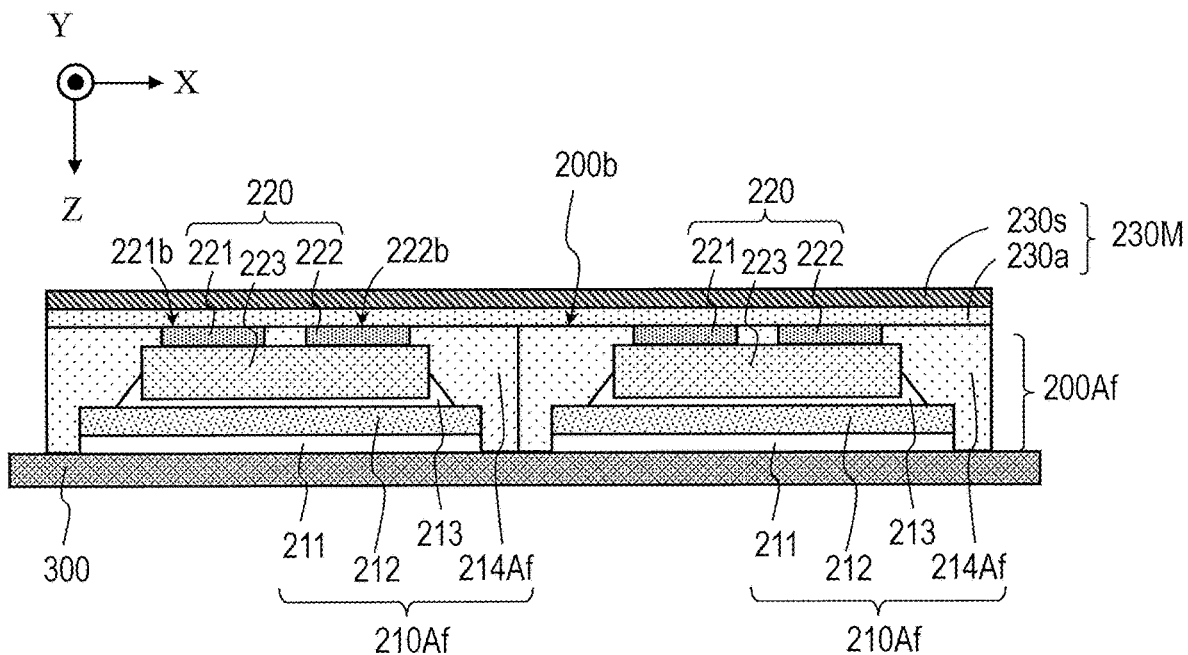
FIG. 32 is a schematic cross-sectional view for illustrating an exemplary light-emitting device manufacturing method of the second embodiment of the present disclosure.

Subsequently, a mask is placed above the lower surfaces of the electrodes of the light-emitting element (Step S12 of FIG. 31). For example, as shown in FIG. 32, a mask 230M having a sheet shape is placed on the light-emitting structures 200Af so as to cover the lower surface 221b of the first electrode 221 and the lower surface 222b of the second electrode 222 of the light-emitting element 220. Herein, a multilayer sheet which includes a supporting layer 230s and an adhesive layer 230a is used as the mask 230M. This multilayer sheet is attached to the light-emitting structures 200Af such that the adhesive layer 230a faces the lower surface 200b of the light-emitting structures 200Af. The supporting layer 230s is, for example, a sheet of polyethylene terephthalate. The adhesive layer 230a is, for example, a layer of an epoxy-based adhesive agent to which a nitrile rubber is added. The adhesive layer 230a has a thickness in the range of not less than about 5 μm and not more than about 50 μm. After the mask 230M is attached, the material of the adhesive layer 230a is cured by heating etc. when necessary. In the example illustrated in FIG. 32, two light-emitting structures 200Af are arranged in the X-direction with no gap therebetween on the support 300 to show the structure without excessive complication. However, the number of light-emitting structures 200Af can be three or more. The arrangement of the light-emitting structures 200Af is not required to be a one-dimensional array, but can be a two-dimensional array.

Irradiation Step (C')

Figure 33:
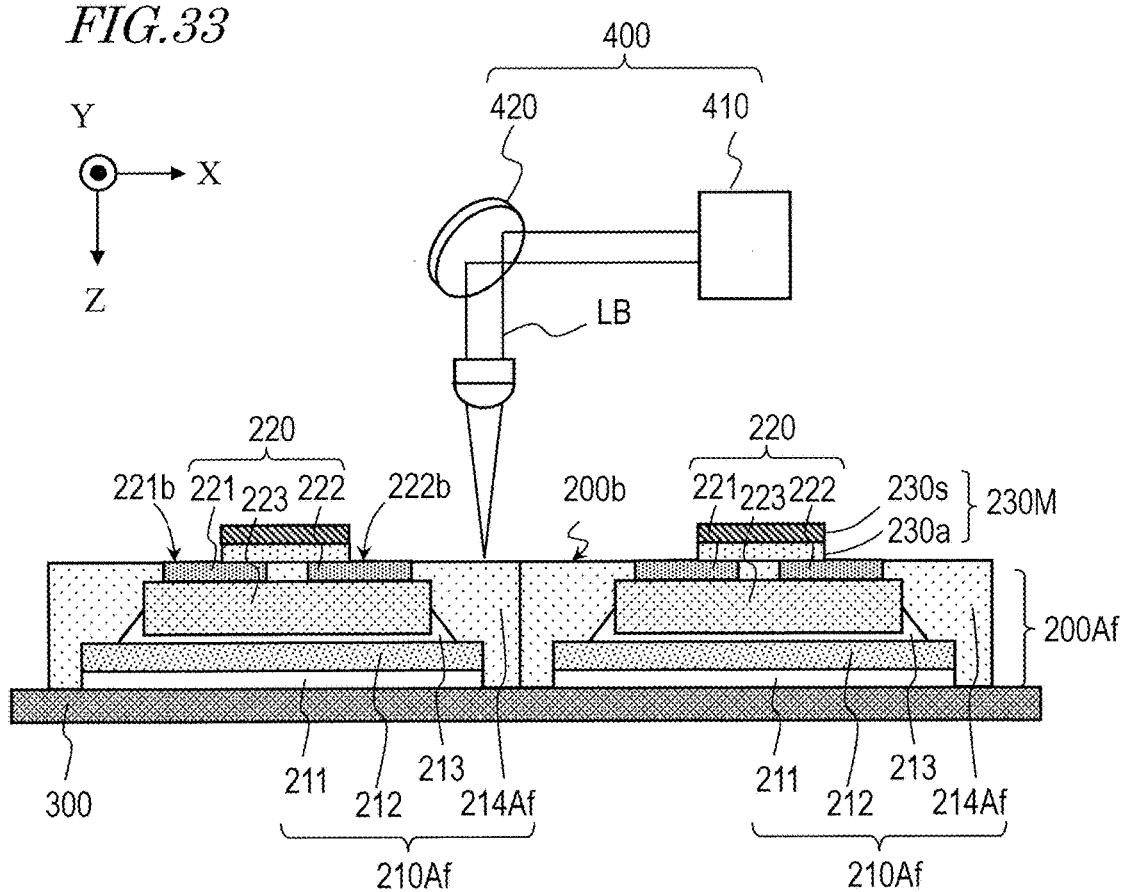
FIG. 33 is a schematic cross-sectional view for illustrating an exemplary light-emitting device manufacturing method of the second embodiment of the present disclosure.

Subsequently, the mask is partially removed by laser light irradiation. In this step, part of each electrode of the light-emitting element is exposed by removing the mask (Step S13 of FIG. 31). For example, a laser ablation apparatus 400 is used to irradiate the lower surface 200b of the light-emitting structures 200Af with a laser light beam LB from the supporting layer 230s side of the mask 230M via the mask 230M as schematically shown in FIG. 33. Thereby, part of the mask 230M is removed, whereby part of the lower surface 221b of the first electrode 221 and part of the lower surface 222b of the second electrode 222 in each the light-emitting element 220 are exposed out of the mask 230M.

Figure 34:
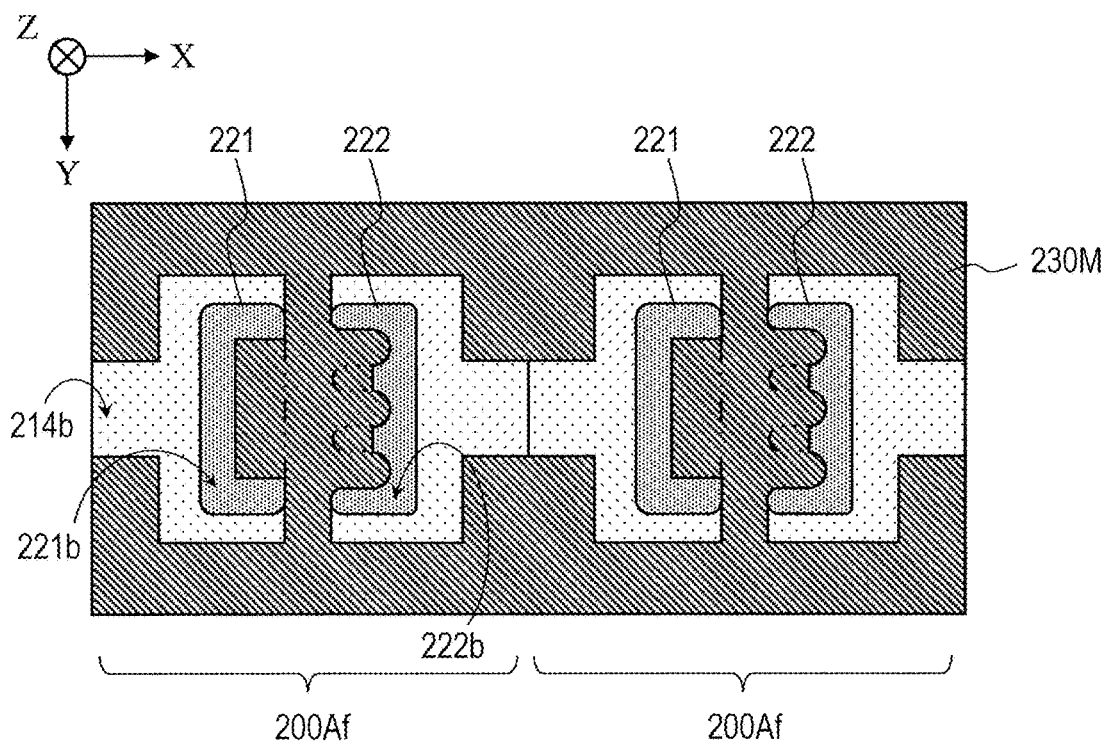
FIG. 34 is a schematic bottom view showing a resultant structure after part of a mask 230M is removed by laser light irradiation from the structure shown in FIG. 32.

FIG. 34 schematically shows a resultant structure after part of the mask 230M is removed by laser light irradiation. As shown in FIG. 34, part of the lower surface 200b of the light-emitting structures 200Af is exposed at openings formed in the mask 230M by partial removal of the mask 230M. Part of the lower surface 200b of the light-emitting structures 200Af which is exposed out of the mask 230M includes part of the lower surface 221b of the first electrode 221 and part of the lower surface 222b of the second electrode 222 of the light-emitting element 220, and part of the lower surface 214b of the light-reflective member 214Af.

In this irradiation step (C'), part of the first electrode 221 and part of the second electrode 222 of the light-emitting element 220 can be removed by laser light irradiation as in the first embodiment. Part of the lower surface 214b of the light-reflective member 214Af can be removed by laser light irradiation. In this case, the lower surface 214b of the light-reflective member 214Af, the lower surface 221b of the first electrode 221, and the lower surface 222b of the second electrode 222 can have an uneven shape. For example, in the same manner as in the example previously described with reference to FIG. 27, partial removal of the mask 230M and formation of the plurality of first grooves Gr1 can be performed by laser light irradiation. After the partial removal of the mask 230M, part of the lower surface 200b of the light-emitting structures 200Af which is exposed out of the mask 230M can be further irradiated with laser, light such that a plurality of first recesses Dc1 are further formed so as to overlap the plurality of first grooves Gr1, or a plurality of second grooves Gr2 are further formed so as to overlap the plurality of first grooves Gr1.

Wiring Formation Step (D')

Figure 35:
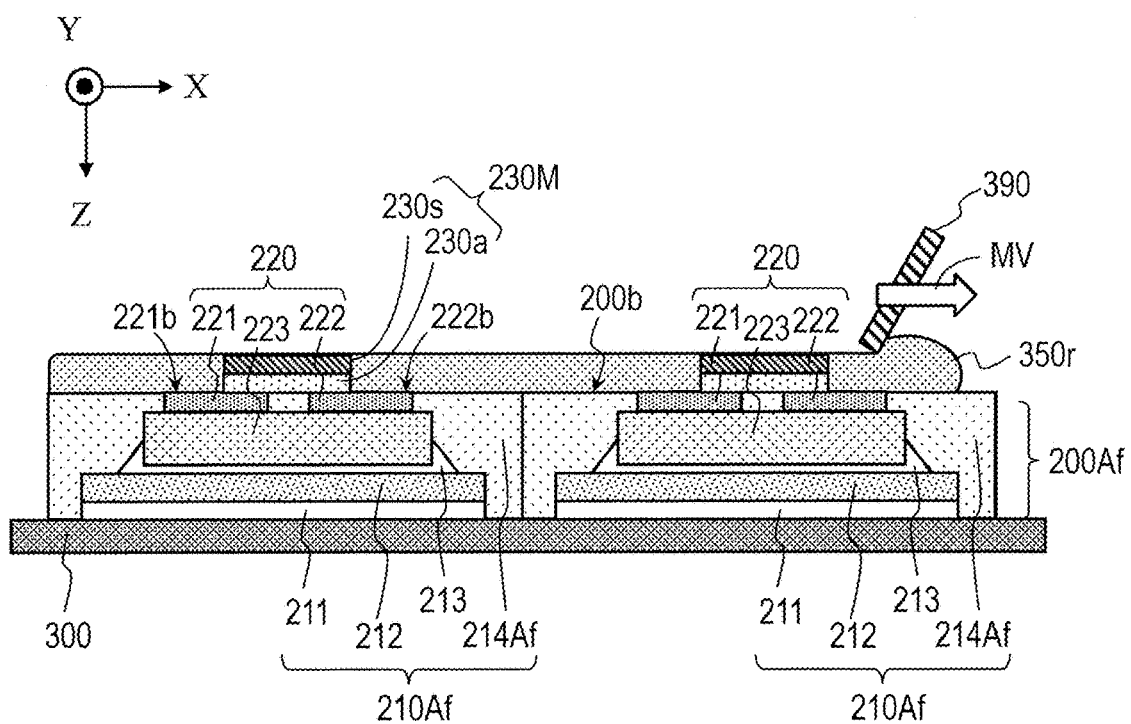
FIG. 35 is a schematic cross-sectional view for illustrating an exemplary light-emitting device manufacturing method of the second embodiment of the present disclosure.

Subsequently, the portions from which the mask has been removed are filled with an electrically-conductive material, whereby a plurality of wirings are formed (Step S14 of FIG. 31). A specific wiring formation method can be substantially the same as that in the wiring formation step (C) of the first embodiment. Specifically, an electrically-conductive paste 350r as the electrically-conductive material is placed on part of the lower surface 200b of the light-emitting structures 200Af which is exposed out of the mask 230M and/or on the remaining part of the mask 230M which has not been removed by laser light irradiation. Thereafter, the squeegee 390 is moved at the level of the surface of the mask 230M as illustrate by thick arrow MV in FIG. 35. As a matter of course, the method of electrically-conductive material filling to portions of the structure on the support 300 from which the mask 230M has been removed is not required to be printed with the use of the squeegee 390 but can be formed using any other appropriate method.

Figure 36:
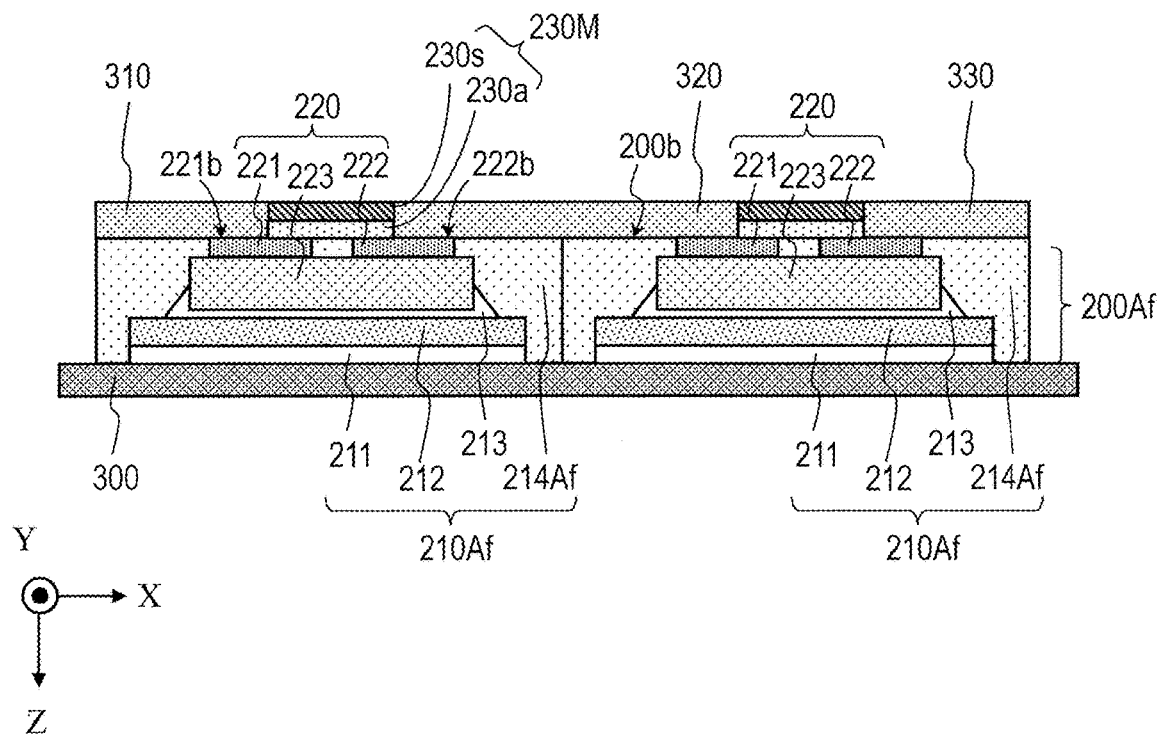
FIG. 36 is a schematic cross-sectional view for illustrating an exemplary light-emitting device manufacturing method of the second embodiment of the present disclosure.

Thereafter, the electrically-conductive paste 350r filling the openings of the mask 230M is cured. By curing the electrically-conductive paste 350r, a plurality of wirings which have shapes matched with the shapes of the openings of the mask 230M can be formed inside the openings of the mask 230M. In the configuration illustrated in FIG. 36, the first wiring 310, the second wiring 320 and the third wiring 330 are formed of the electrically-conductive paste 350r in the openings of the mask 230M. As illustrated in the drawing, the first wiring 310 is in contact with the first electrode 221 of the light-emitting element 220 of the light-emitting structure 200Af shown in the left side of the drawing, and is electrically connected with the first electrode 221. The third wiring 330 is in contact with the second electrode 222 of the light-emitting element 220 of the light-emitting structure 200Af shown in the right side of the drawing, and is electrically connected with the second electrode 222. The second wiring 320 is in contact with the second electrode 222 of the light-emitting element 220 of the light-emitting structure 200Af shown in the left side of the drawing and with the first electrode 221 of the light-emitting element 220 of the light-emitting structure 200Af shown in the right side of the drawing and electrically connects these electrodes with each other.

Figure 37:
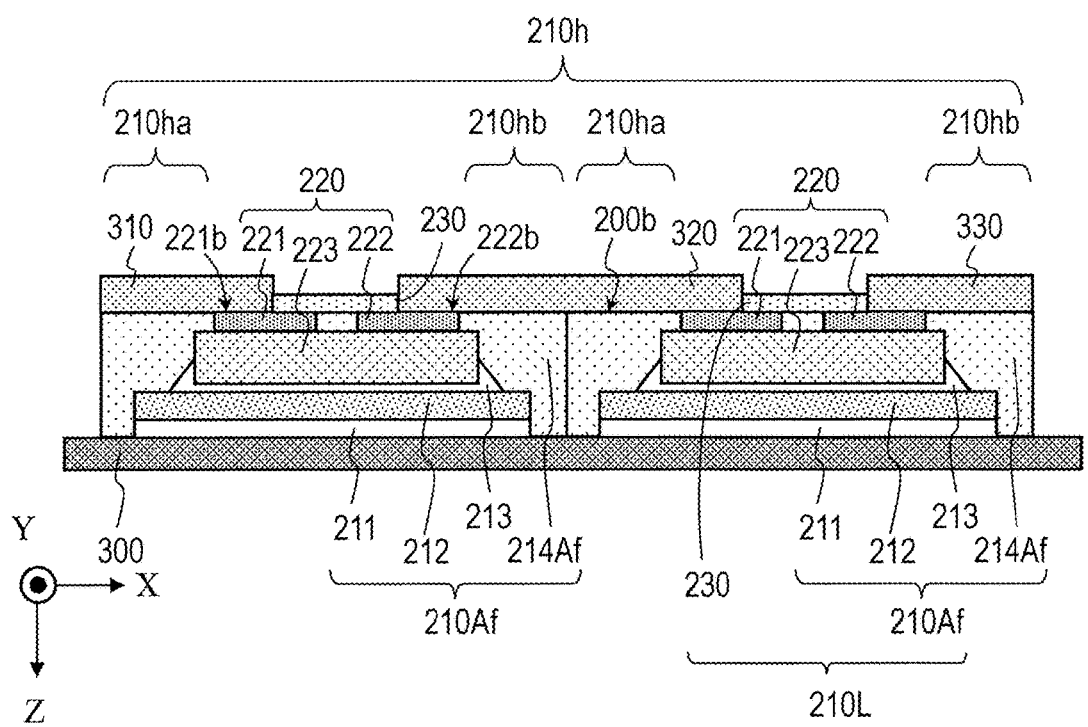
FIG. 37 is a schematic cross-sectional view for illustrating an exemplary light-emitting device manufacturing method of the second embodiment of the present disclosure.

When necessary, part of the remainder of the mask 230M corresponding to the supporting layer 230s is removed. By peeling off the part corresponding to the supporting layer 230s by for example a mechanical method, the part corresponding to the supporting layer 230s can be selectively removed while part of the remainder of the mask 230M corresponding to the adhesive layer 230a remains on the light-emitting structures 200Af. After the plurality of wirings are formed, a portion corresponding to the supporting layer 230s is removed from the region above the light-emitting structure 200Af, resulting in a package 210L which includes the resin layer 230 and the covering member 210Af as schematically shown in FIG. 37. Part of the remainder of the mask 230M corresponding to the adhesive layer 230a corresponds to the resin layer 230 in the package 210L.

By removing part of the remainder of the mask 230M corresponding to the supporting layer 230s, a groove structure 210h defined by the openings formed in the resin layer 230 is formed on the side opposite to the protecting member 211 of the covering member 210Af in the Z direction of the light-emitting structure 200Af. As shown in FIG. 37, the groove structure 210h includes a first portion 210ha in which part of the first electrode 221 is exposed and a second portion 210hb in which part of the second electrode 222 is exposed. In this example, the second wiring 320 is continuously provided from the second portion 210hb formed in the package 210L shown in the left side of the drawing to the first portion 210ha formed in the package 210L shown in the right side of the drawing. That is, it can be said that two light-emitting modules on the support 300 are electrically connected with each other via the second wiring 320.

By removing the part corresponding to the supporting layer 230s, residue of debris scattered and adhered onto the mask 230M in the above-described irradiation step (C') and residue of the electrically-conductive paste 350r cured on the mask 230M in the wiring formation step (D') can be removed together with the supporting layer 230s. That is, remaining of debris or the like on the lower surface of the light-emitting device can be avoided. As described above, the light-emitting device can be temporarily attached to a mounting board, or the like, using part of the remainder of the mask 230M corresponding to the adhesive layer 230a.

After the part corresponding to the supporting layer 230s is removed, part of the first electrode 221 and part of the second electrode 222 can be removed by grinding. In the example shown in FIG. 38, the surface of the first wiring 310, the second wiring 320 and the third wiring 330 is ground using the grindstone 430. By performing such a grinding step, the position of the lower surface 310b of the first wiring 310, the position of the lower surface 320b of the second wiring 320, and the position of the lower surface 330b of the third wiring 330 can be adjusted to the position of the surface of the resin layer 230. The adhesive layer 230a of the mask 230M has a thickness of, for example, not less than 5 µm and not more than 50 µm. After the grinding step has been performed, the thickness of the first wiring 310, the second wiring 320 and the third wiring 330 can be, approximately, in the range of not less than about 5 µm and not more than about 50 µm. When necessary, a copper plating layer or a nickel-gold plating layer can be formed on the surfaces of the first wiring 310, the second wiring 320 and the third wiring 330.

Through the above-described process, a light-emitting device 100M is realized in which two light-emitting modules 200L shown in FIG. 29 are continued. The electrical connection between the light-emitting elements 220 of the two light-emitting modules 200L can be serial connection or can be parallel connection.

Figure 38:
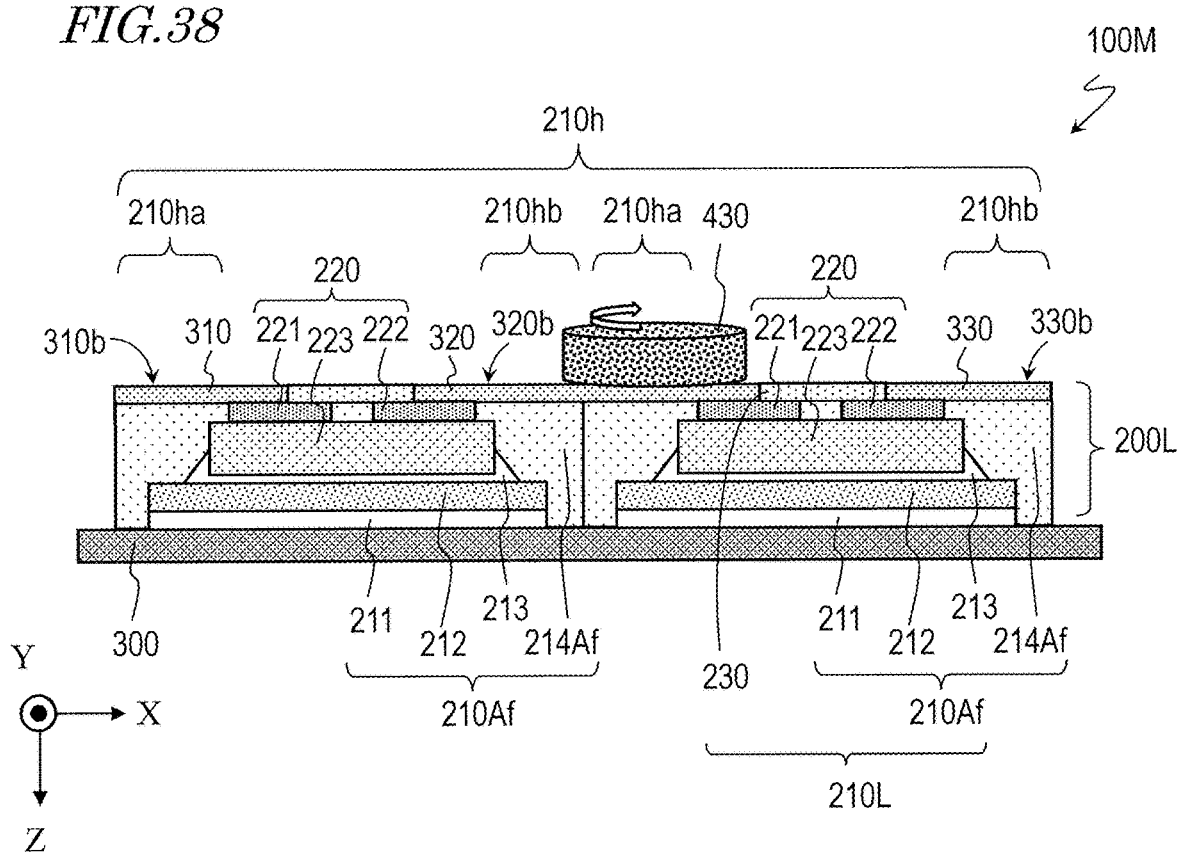
FIG. 38 is a schematic cross-sectional view for illustrating an exemplary light-emitting device manufacturing method of the second embodiment of the present disclosure.
Figure 39:
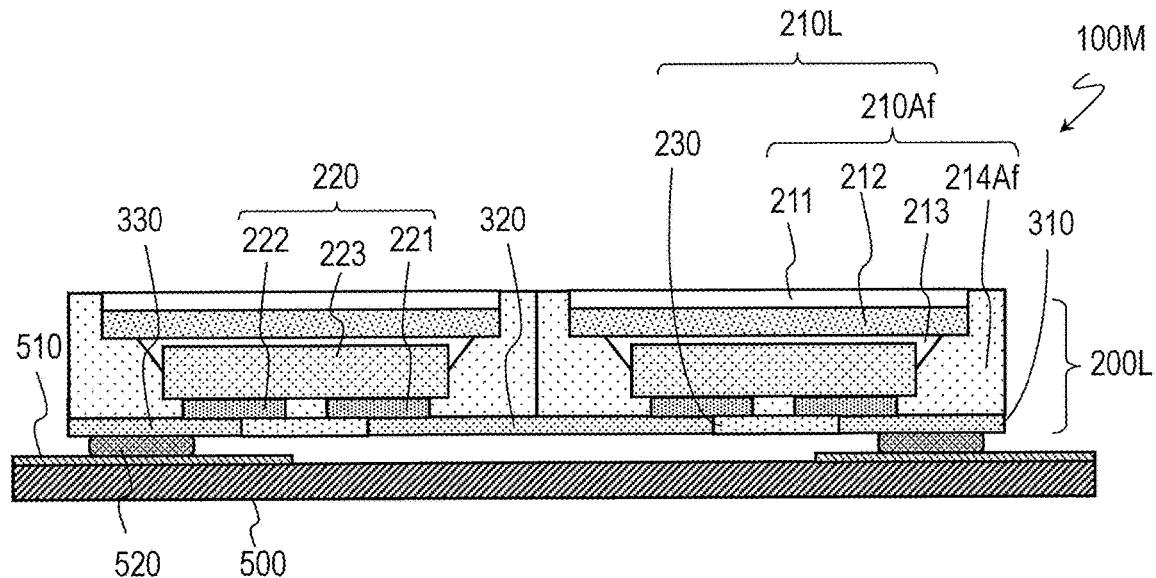
FIG. 39 is a schematic cross-sectional view showing a resultant structure after the light-emitting device 100M shown in FIG. 38 is mounted to a wiring board 500.

FIG. 39 schematically shows a resultant structure after the light-emitting device 100M shown in FIG. 38 is mounted to a wiring board. As shown in FIG. 39, a bonding material 520, such as solder, electrically-conductive paste, or the like, is placed on the wiring pattern 510 of a wiring board 500, such as glass epoxy substrate, whereby the light-emitting device 100M can be mounted to the wiring board 500 via the bonding material 520. Also in the present embodiment, wirings are included in the light-emitting device side, and therefore, it is not necessary to use a wiring board which has complicated wiring patterns, and mounting of a light-emitting device to a wiring board is easy, as in the first embodiment. Further, formation of the first wiring 310, the second wiring 320 and the third wiring 330 on the light-emitting device side does not need photolithography or etching. Thus, these wirings can be formed on the lower surface side of the light-emitting device through a simple process.

As in the examples previously described with reference to FIG. 32, FIG. 33, FIG. 34, FIG. 35, FIG. 36, FIG. 37, FIG. 38 and FIG. 39, one-dimensional or two-dimensional array of a plurality of light-emitting structures is formed, and a plurality of wirings including the first wiring 310 and the second wiring 320 are formed. With this structure, a large-area emission surface can be formed through a simple process. Particularly a single mask 230M can be placed on one-dimensionally or two-dimensionally arrayed light-emitting structures so as to cover all the light-emitting structures, whereby a groove structure extending across plurality of light-emitting modules can be efficiently formed. As a matter of course, a plurality of light-emitting structures each including the first light-emitting element 220A and the second light-emitting element 220B such as shown in FIG. 16 can be provided, and the above-described mask placing step (B'), irradiation step (C') and wiring formation step (D') can be performed on these light-emitting structures. In such a process, a wiring which electrically connects the first light-emitting element 220A and the second light-emitting element 220B in series or in parallel can be formed in the wiring formation step (D'). A light-emitting device can be provided which has wirings for connecting a plurality of light-emitting elements.

EXAMPLES

Hereinafter, examples of a light-emitting device of an embodiment of the present disclosure will be described in more detail. As a matter of course, the embodiment of the present disclosure is not required to be forms specified by the following examples.

Evaluation 1 of Shape of Bottom Portion of Groove Structure

A plurality of samples were prepared in which, by scanning a white resin plate with a laser light beam, a groove structure was formed in one of the primary surfaces of the resin plate, and a bottom portion of the groove structure was further irradiated with laser light in a different irradiation pattern. These samples were evaluated as to the shape of the bottom portion of the groove structure.

Example 1-1

First, a resin plate was provided in which particles of titanium dioxide were dispersed in a silicone resin that is a base material. Then, one of the primary surfaces of this resin plate was scanned with a laser light beam in a certain direction (first direction) such that a plurality of first grooves each extending in the first direction were formed in the resin plate (corresponding to the previously-described groove structure formation step). Herein, scanning with the laser light beam was carried out in five different regions of the primary surface of the resin plate, whereby a groove structure was formed in the resin plate such that the groove structure included five portions each having a bottom surface defined by a set of a plurality of first grooves. The irradiation conditions of the laser light in this step are as follows:

Peak wavelength of the laser light: 532 nm;
Laser power: 2.4 W;
Pulse width: 100 nanoseconds;
Frequency: 50 kHz;
Operation speed: 200 mm/s;
Defocus: 0 µm;
Pitch of the first grooves: 15 µm or 30 µm.

Then, from the five portions included in the groove structure, a portion in which the pitch of the first grooves was 15 µm was selected at random, scanning with a laser light beam was carried out in the second direction that meets the first direction, and the bottom portion of the selected portion (hereinafter, referred to as "first portion") was irradiated with a laser light beam. Thereby, a plurality of first recesses in the dot shapes were formed in the bottom portion of the first portion likewise as in the examples described with reference to FIG. 4. This was the sample of Example 1-1. Herein, a direction selected as the second direction was perpendicular to the first direction. When viewed from the top, each of the first recesses had a diameter of about 0.1 mm. The irradiation conditions of the laser light in this step are as follows:

Peak wavelength of the laser light: 532 nm;
Laser power: 2.4 W;
Pulse width: 100 nanoseconds;
Frequency: 50 kHz;
Operation speed: 200 mm/s;
Defocus: 0 µm;
Distance between the centers of the first recesses: 15 µm.

Figure 40:
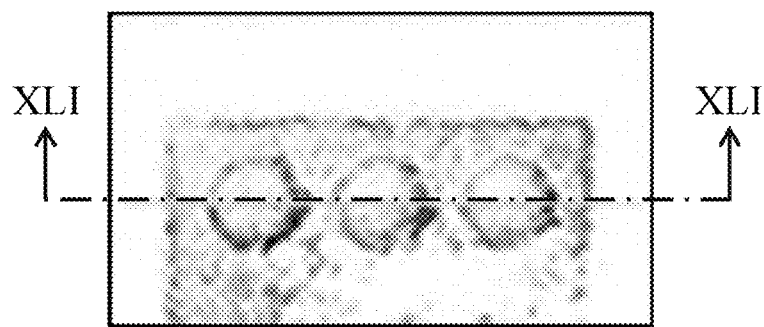
FIG. 40 shows a microscopic image of a bottom surface of a groove structure of the sample of Example 1-1.
Figure 41:
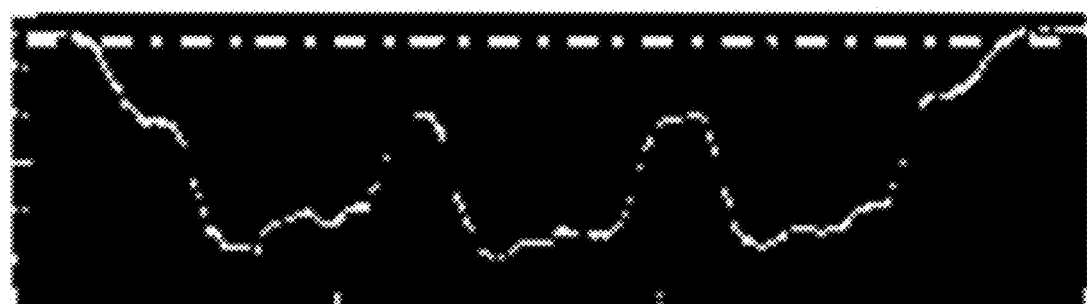
FIG. 41 shows a cross-sectional profile of the sample of Example 1-1.

FIG. 40 is a microscopic image enlargedly showing the bottom surface of the groove structure of the sample of Example 1-1. FIG. 41 shows a cross-sectional profile of the sample of Example 1-1 which was obtained by a laser microscope and which corresponds to a cross-sectional view taken along line XLI-XLI of FIG. 40. In FIG. 41, the horizontal dot-chain line represents the position of the surface of the resin plate before formation of the groove structure. As shown in FIG. 40, herein, the bottom portion of the first portion has three first recesses aligned in the horizontal direction of the drawing sheet. In the cross-sectional profile shown in FIG. 41, the average depth of the three first recesses was about 120 µm.

Example 1-2

From the five portions included in the groove structure, another portion in which the pitch of the first grooves was 15 µm was selected at random, and the bottom portion of the portion selected herein (hereinafter, referred to as "second portion") was irradiated with a laser light beam under the same laser light irradiation conditions as those for Example 1-1 except that the laser power was 1.2 W and the frequency was changed such that the distance between the centers of the first recesses was 60 µm. Thereby, a plurality of first recesses in the dot shapes were formed in the bottom portion of the second portion. This was the sample of Example 1-2.

Figure 42:
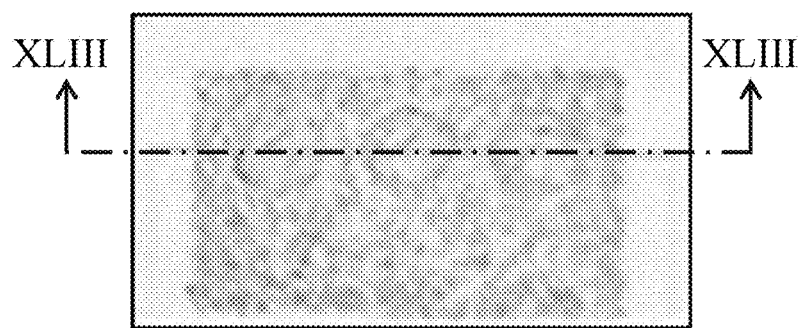
FIG. 42 shows a microscopic image of a bottom surface of a groove structure of the sample of Example 1-2.
Figure 43:
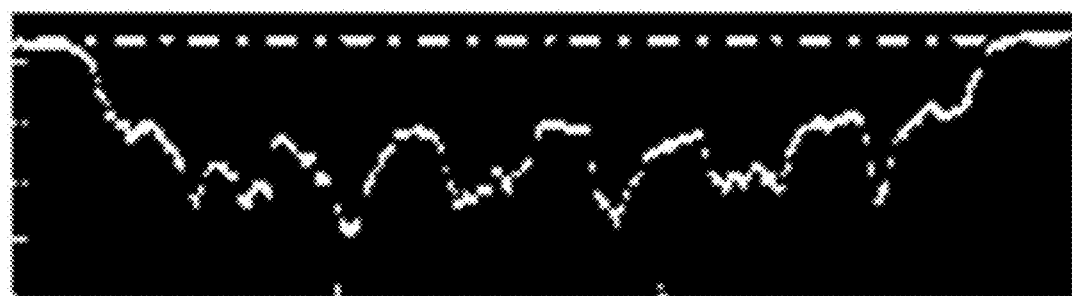
FIG. 43 shows a cross-sectional profile of the sample of Example 1-2.

FIG. 42 is an enlarged microscopic image showing the bottom surface of the groove structure of the sample of Example 1-2. FIG. 43 shows a cross-sectional profile of the sample of Example 1-2 which was obtained by a laser microscope and which corresponds to a cross-sectional view taken along line XLIII-XLIII of FIG. 42. In FIG. 43, likewise as in FIG. 41, the horizontal dot-chain line represents the position of the surface of the resin plate before formation of the groove structure. Although it is difficult to confirm from FIG. 42, the bottom portion has three first recesses aligned along the XLIII-XLIII line likewise as in the example shown in FIG. 40. In the cross-sectional profile shown in FIG. 43, the average depth of the three first recesses was about 50 µm.

Example 1-3

From the five portions included in the groove structure, a portion in which the pitch of the first grooves was 30 µm was selected at random, and the bottom portion of the portion selected herein (hereinafter, referred to as "third portion") was irradiated with a laser light beam under the same laser light irradiation conditions as those for Example 1-2 except that the frequency was changed such that the distance between the centers of the first recesses was 30 µm. Thereby, a plurality of first recesses in the dot shapes were formed in the bottom portion of the third portion. This was the sample of Example 1-3.

Figure 44:
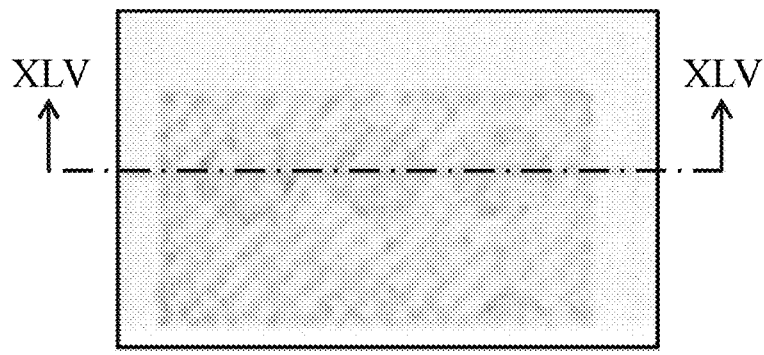
FIG. 44 shows a microscopic image of a bottom surface of a groove structure of the sample of Example 1-3.
Figure 45:
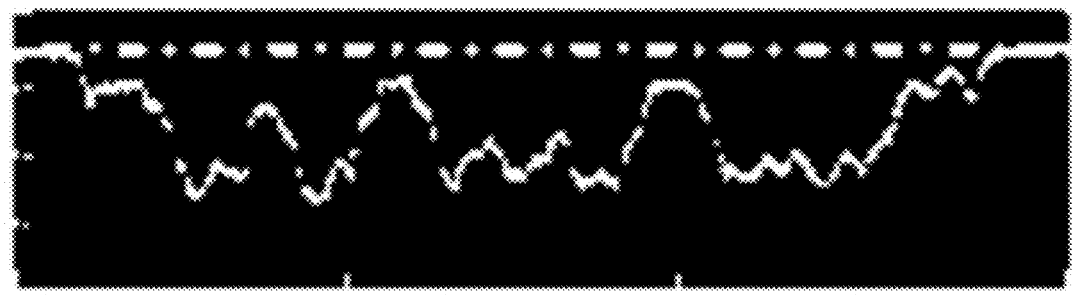
FIG. 45 shows a cross-sectional profile of the sample of Example 1-3.

FIG. 44 is an enlarged microscopic image showing the bottom surface of the groove structure of the sample of Example 1-3. FIG. 45 shows a cross-sectional profile of the sample of Example 1-3 which was obtained by a laser microscope and which corresponds to a cross-sectional view taken along line XLV-XLV of FIG. 44. In FIG. 45, the horizontal dot-chain line represents the position of the surface of the resin plate before formation of the groove structure. Although it is difficult to confirm from FIG. 44, also in this example, the bottom portion has three first recesses aligned along the XLV-XLV line likewise as in the examples shown in FIG. 40 and FIG. 42. In the cross-sectional profile shown in FIG. 45, the average depth of the three first recesses was about 40 µm.

Example 1-4

From the five portions included in the groove structure, another portion in which the pitch of the first grooves was 30 µm was selected at random, and the bottom portion of the portion selected herein (hereinafter, referred to as "fourth portion") was irradiated with a laser light beam under the same laser light irradiation conditions as those for Example 1-3 except that the frequency was changed such that the distance between the centers of the first recesses was 60 µm. Thereby, a plurality of first recesses in the dot shapes were formed in the bottom portion of the fourth portion. This was the sample of Example 1-4.

Figure 46:
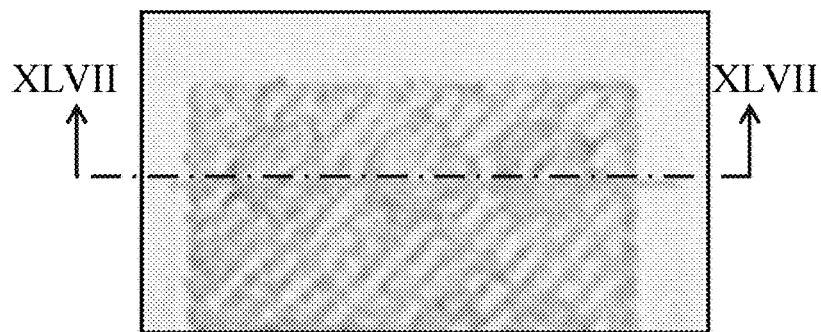
FIG. 46 shows a microscopic image of a bottom surface of a groove structure of the sample of Example 1-4.
Figure 47:
FIG. 47 shows a cross-sectional profile of the sample of Example 1-4.

FIG. 46 is an enlarged microscopic image showing the bottom surface of the groove structure of the sample of Example 1-4. FIG. 47 shows a cross-sectional profile of the sample of Example 1-4 which was obtained by a laser microscope and which corresponds to a cross-sectional view taken along line XLVII-XLVII of FIG. 46. In FIG. 47, the horizontal dot-chain line represents the position of the surface of the resin plate before formation of the groove structure. Although it is difficult to confirm from FIG. 46, also in this example, the bottom portion has three first recesses aligned along the XLVII-XLVII line likewise as in the examples shown in FIG. 40, FIG. 42 and FIG. 44. In the cross-sectional profile shown in FIG. 47, the average depth of the three first recesses was about 38 µm.

Reference Example 1-1

The bottom portion of the remaining one of the five portions included in the groove structure (hereinafter, referred to as "fifth portion") was irradiated with a laser light beam under the same laser light irradiation conditions as those for Example 1-2 except that the operation speed was changed to 500 mm/s. Thereby, a plurality of first recesses in the dot shapes were formed in the bottom portion of the fifth portion. This was the sample of Reference Example 1-1.

Figure 48:
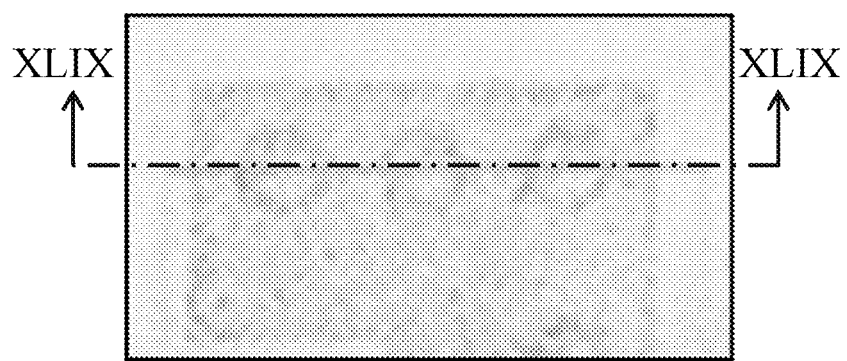
FIG. 48 shows a microscopic image of a bottom surface of a groove structure of the sample of Reference Example 1-1.
Figure 49:
FIG. 49 shows a cross-sectional profile of the sample of Reference Example 1-1.

FIG. 48 is an enlarged microscopic image showing the bottom surface of the groove structure of the sample of Reference Example 1-1. FIG. 49 shows a cross-sectional profile of the sample of Reference Example 1-1 which was obtained by a laser microscope and which corresponds to a cross-sectional view taken along line XLIX-XLIX of FIG. 48. In FIG. 49, the horizontal dot-chain line represents the position of the surface of the resin plate before formation of the groove structure. Although it is difficult to confirm from FIG. 48, also in this example, the bottom portion has three first recesses aligned along the XLIX-XLIX line likewise as in the examples shown in FIG. 40, FIG. 42, FIG. 44 and FIG. 46. In the cross-sectional profile shown in FIG. 49, the average depth of the three first recesses was about 22 µm.

It was found from the cross-sectional profiles of the samples of Example 1-1 to Example 1-4 (FIG. 41, FIG. 43, FIG. 45 and FIG. 47) and the cross-sectional profile of the sample of Reference Example 1-1 (FIG. 49) that a plurality of apexes formed between two adjoining first grooves were at a position lower than the surface of the resin plate before formation of the groove structure. That is, in these samples, the position of, the bottom surface of the groove structure is lower than the surface of the resin plate before formation of the groove structure. Therefore, when the electrically-conductive material is placed inside the groove structure, the electrically-conductive material is in contact not only with the bottom portion of the groove structure but also with the lateral surfaces of the groove structure which are present between the bottom portion and the surface of the resin plate, so that achievement of the anchoring effect at the interfaces between the lateral surfaces of the groove structure and the electrically-conductive material can be expected.

As seen from the comparison between the cross-sectional profiles of the samples of Example 1-1 to Example 1-4 and the cross-sectional profile of the sample of Reference Example 1-1, the recessed and raised portions formed in the region irradiated with the laser light in the sample of Reference Example 1-1 are not so large. That is, it is advantageous that the operation speed is not excessively high from the viewpoint of forming first recesses of an appropriate depth in the bottom surface which has a plurality of first grooves in the groove structure formation step. It was also found from the comparison between the cross-sectional profile of the sample of Example 1-1 and the cross-sectional profiles of the samples of Example 1-2 to Example 1-4 that, if at equal operation speeds, recessed and raised portions of finer shapes are more readily formed when the laser power is restricted within a certain range.

Evaluation 1 of Shape of Wirings

Next, the groove structure was filled with an electrically-conductive paste, and the electrically-conductive paste was cured, whereby the wirings were formed in the groove structure (corresponding to the previously-described wiring formation step). It was checked by cross-sectional observation whether or not the wirings had a shape following the shape of the bottom portion of the groove structure.

Example 1-5

Through the following procedure, the second portion of the sample of Example 1-2 was filled with an electrically-conductive paste, and the electrically-conductive paste was cured, whereby the sample of Example 1-5 was produced. Herein, firstly, the second portion was filled with an electrically-conductive paste by printing with the use of a squeegee and, thereafter, the resin plate filled with an electrically-conductive paste was placed in a 130° C. environment for 30 minutes such that the electrically-conductive paste was cured, whereby a wiring was formed inside the second portion.

Figure 50:
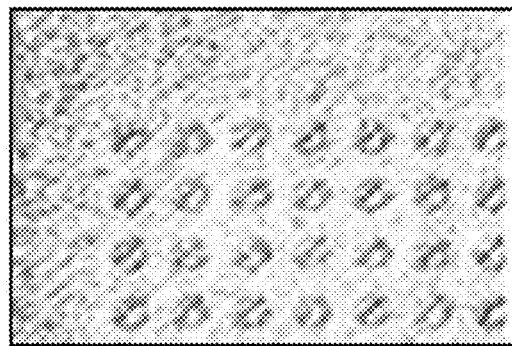
FIG. 50 shows a microscopic image of the second portion before being filled with an electrically-conductive paste.
Figure 51:
FIG. 51 shows a microscopic image of a cross section after the second portion was filled with an electrically-conductive paste and the electrically-conductive paste was cured.

FIG. 50 is a microscopic image showing the second portion before being filled with an electrically-conductive paste. A plurality of first grooves running in a diagonal direction in the drawing sheet and a plurality of first recesses can be seen. FIG. 51 shows a cross section after the second portion was filled with an electrically-conductive paste and the electrically-conductive paste was cured. In the following description, the diagram for the cross section after the electrically-conductive paste was cured shows a cross section formed by cutting the range of about 4 mm square.

Example 1-6

Figure 52:
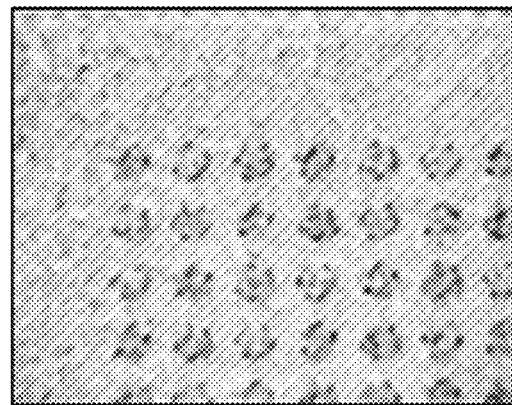
FIG. 52 shows a microscopic image of the third portion before being filled with an electrically-conductive paste.
Figure 53:
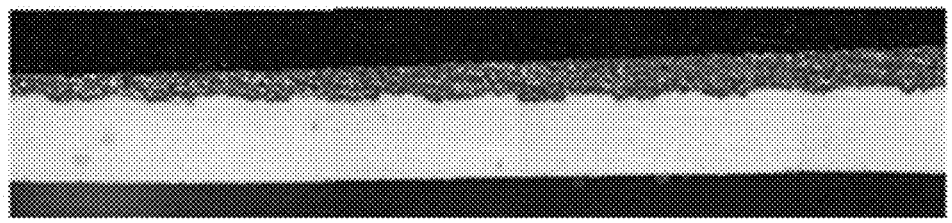
FIG. 53 shows a microscopic image of a cross section after the third portion was filled with an electrically-conductive paste and the electrically-conductive paste was cured.

The sample of Example 1-6 was produced likewise as the sample of Example 1-5 except that the third portion of the sample of Example 1-3 was filled with an electrically-conductive paste. FIG. 52 is a microscopic image showing the third portion before being filled with an electrically-conductive paste. FIG. 53 shows a cross section after the third portion was filled with an electrically-conductive paste and the electrically-conductive paste was cured.

Example 1-7

Figure 54:
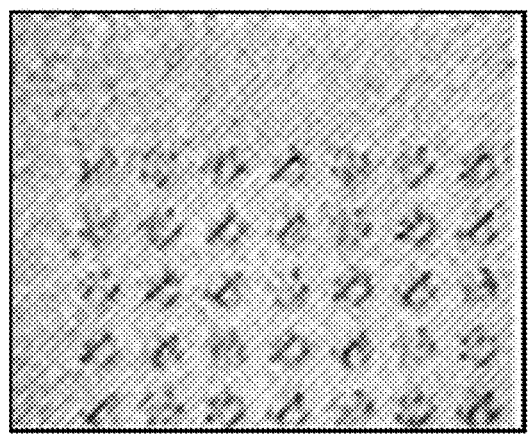
FIG. 54 shows a microscopic image of the fourth portion before being filled with an electrically-conductive paste.
Figure 55:
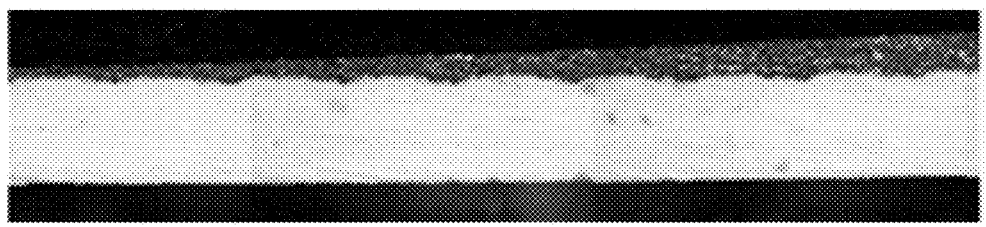
FIG. 55 shows a microscopic image of a cross section after the fourth portion was filled with an electrically-conductive paste and the electrically-conductive paste was cured.

The sample of Example 1-7 was produced likewise as the sample of Example 1-5 except that the fourth portion of the sample of Example 1-4 was filled with an electrically-conductive paste. FIG. 54 is a microscopic image showing the fourth portion before being filled with an electrically-conductive paste. FIG. 55 shows a cross section after the fourth portion was filled with an electrically-conductive paste and the electrically-conductive paste was cured.

It was found from the cross-sectional images of the samples of Example 1-5 to Example 1-7 (FIG. 51, FIG. 53 and FIG. 55) that, in each of the samples, part of the wiring was present inside the first grooves and the first recesses. Specifically, the wiring closely followed the shape of the bottom portion of the groove structure, and no void occurred between the wiring and the bottom portion of the groove structure.

Evaluation 2 of Shape of Bottom Portion of Groove Structure

A plurality of samples which further had a plurality of second grooves each extending in the second direction in the bottom portion of the groove structure were prepared by irradiating the bottom portion of the groove structure with laser light by scanning with a laser light beam in the second direction that is different from the first direction instead of forming a plurality of first recesses in the dot shapes in the groove structure formation step. These samples were evaluated as to the shape of the bottom portion of the groove structure.

Example 2-1

First, a groove structure was formed in a resin plate, likewise as in production of the sample of Example 1-1 described above, so as to include five portions each having a bottom surface defined by a set of a plurality of first grooves. Note that, however, herein, the laser light irradiation conditions were appropriately changed such that the pitch of the first grooves was 50 μm. Hereinafter, these five portions are referred to as "sixth portion", "seventh portion", "eighth portion", "ninth portion" and "tenth portion".

Then, the bottom portion of the sixth portion of the groove structure was irradiated with a laser light beam by scanning with the laser light beam in the second direction that met the first direction. Thereby, likewise as in the example shown in FIG. 5, a plurality of second grooves each extending in the second direction were formed in the bottom portion of the sixth portion so as to overlap the first grooves. This was the sample of Example 2-1. Herein, also, a direction selected as the second direction was perpendicular to the first direction. The irradiation conditions of the laser light in this step are as follows:

Peak wavelength of the laser light: 532 nm;
Laser power: 2.4 W;
Pulse width: 100 nanoseconds;
Frequency: 50 kHz;
Operation speed: 200 mm/s;
Defocus: 0 μm;
Pitch of the second grooves: 50 μm.

Figure 56:
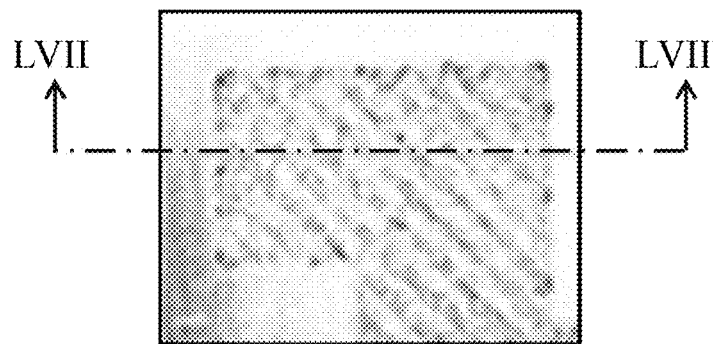
FIG. 56 shows a microscopic image of a bottom surface of a groove structure of the sample of Example 2-1.
Figure 57:
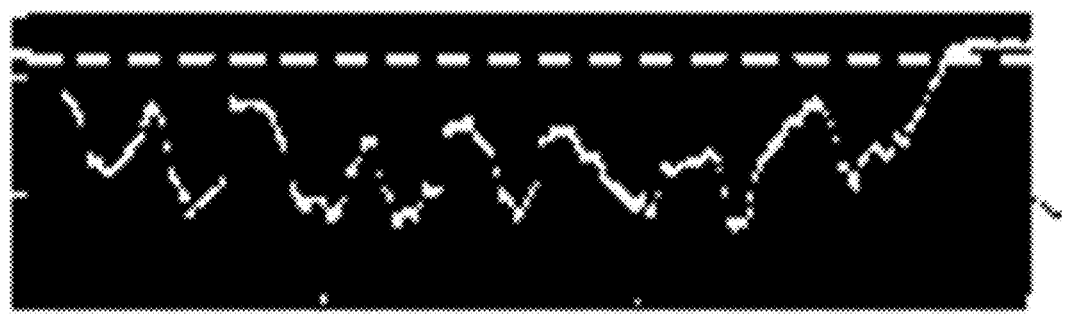
FIG. 57 shows a cross-sectional profile of the sample of Example 2-1.

FIG. 56 is an enlarged microscopic image showing the bottom surface of the groove structure of the sample of Example 2-1. FIG. 57 shows a cross-sectional profile of the sample of Example 2-1 which was obtained by a laser microscope and which corresponds to a cross-sectional view taken along line LVII-LVII of FIG. 56. In FIG. 57, the horizontal dot-chain line represents the position of the surface of the resin plate before formation of the groove structure. As shown in FIG. 57, herein, the bottom portion of the sixth portion has eight first recesses aligned in the horizontal direction of the drawing sheet. In the cross-sectional profile shown in FIG. 57, the average depth of the eight first recesses was about 50 μm.

Example 2-2

The bottom portion of the seventh portion of the groove structure was irradiated with a laser light beam under the same laser light irradiation conditions as those for Example 2-1 except that the laser power was 1.2 W. Thereby, a plurality of second grooves each extending in the second direction were formed in the bottom portion of the seventh portion so as to overlap the first grooves. This was the sample of Example 2-2.

Figure 58:
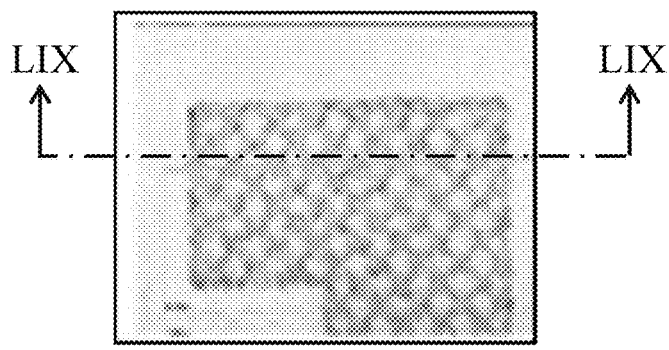
FIG. 58 shows a microscopic image of a bottom surface of a groove structure of the sample of Example 2-2.
Figure 59:
FIG. 59 shows a cross-sectional profile of the sample of Example 2-2.

FIG. 58 is an enlarged microscopic image showing the bottom surface of the groove structure of the sample of Example 2-2. FIG. 59 shows a cross-sectional profile of the sample of Example 2-2 which was obtained by a laser microscope and which corresponds to a cross-sectional view taken along line LIX-LIX of FIG. 58. In FIG. 59, likewise as in FIG. 57, the horizontal dot-chain line represents the position of the surface of the resin plate before formation of the groove structure. Also in this example, likewise as in the example shown in FIG. 57, the bottom portion has eight first recesses aligned along line LIX-LIX. In the cross-sectional profile shown in FIG. 59, the average depth of the eight first recesses was about 35 μm.

Example 2-3

The bottom portion of the eighth portion of the groove structure was irradiated with a laser light beam under the same laser light irradiation conditions as those for Example 2-1 except that the laser power was 1.6 W. Thereby, a plurality of second grooves each extending in the second direction were formed in the bottom portion of the eighth portion so as to overlap the first grooves. This was the sample of Example 2-3.

Figure 60:
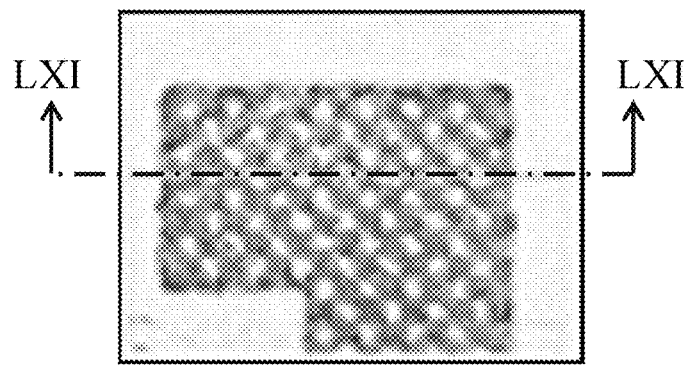
FIG. 60 shows a microscopic image of a bottom surface of a groove structure of the sample of Example 2-3.
Figure 61:
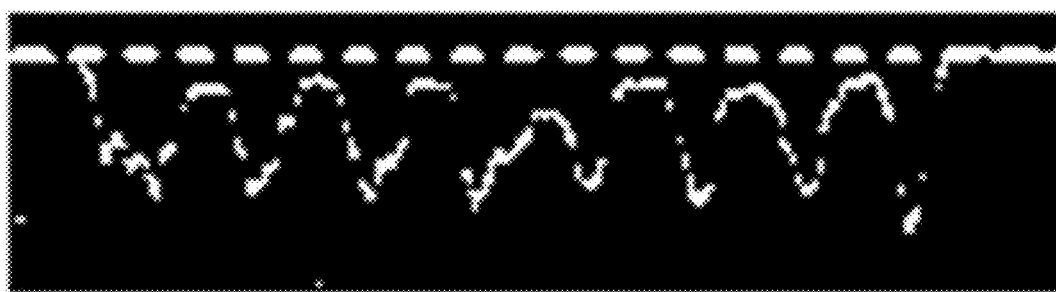
FIG. 61 shows a cross-sectional profile of the sample of Example 2-3.

FIG. 60 is an enlarged microscopic image showing the bottom surface of the groove structure of the sample of Example 2-3. FIG. 61 shows a cross-sectional profile of the sample of Example 2-3 which was obtained by a laser microscope and which corresponds to a cross-sectional view taken along line LXI-LXI of FIG. 60. In FIG. 61, the horizontal dot-chain line represents the position of the surface of the resin plate before formation of the groove structure. Also in this example, likewise as in the examples shown in FIG. 57 and FIG. 59, the bottom portion has eight first recesses aligned along line LXI-LXI. In the cross-sectional profile shown in FIG. 61, the average depth of the eight first recesses was about 37 μm.

Example 2-4

The bottom portion of the ninth portion of the groove structure was irradiated with a laser light beam under the same laser light irradiation conditions as those for Example 2-1 except that the laser power was 2 W. Thereby, a plurality of second grooves each extending in the second direction were formed in the bottom portion of the ninth portion so as to overlap the first grooves. This was the sample of Example 2-4.

Figure 62:
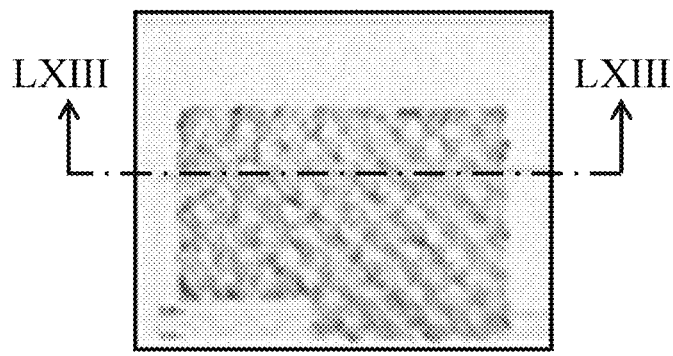
FIG. 62 shows a microscopic image of a bottom surface of a groove structure of the sample of Example 2-4.
Figure 63:
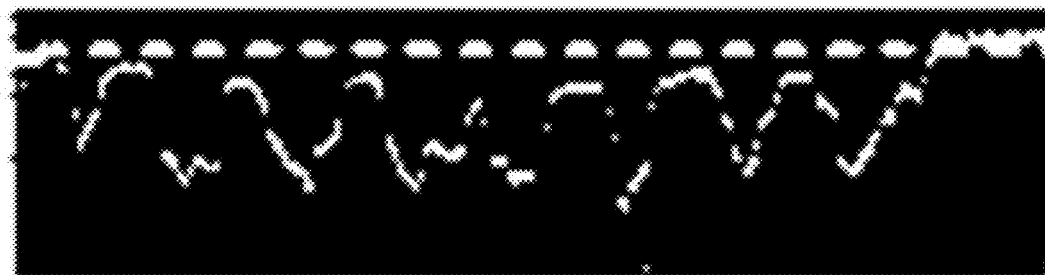
FIG. 63 shows a cross-sectional profile of the sample of Example 2-4.

FIG. 62 is an enlarged microscopic image showing the bottom surface of the groove structure of the sample of Example 2-4. FIG. 63 shows a cross-sectional profile of the sample of Example 2-4 which was obtained by a laser microscope and which corresponds to a cross-sectional view taken along line LXIII-LXIII of FIG. 62. In FIG. 63, the horizontal dot-chain line represents the position of the surface of the resin plate before formation of the groove structure. Also in this example, likewise as in the examples shown in FIG. 57, FIG. 59 and FIG. 61, the bottom portion has eight first recesses aligned along line LXIII-LXIII. In the cross-sectional profile shown in FIG. 63, the average depth of the eight first recesses was about 42 μm.

Reference Example 2-1

The bottom portion of the tenth portion of the groove structure was irradiated with a laser light beam under the same laser light irradiation conditions as those for Example 2-1 except that the operation speed was 500 mm/s. Thereby, a plurality of second grooves each extending in the second direction were formed in the bottom portion of the tenth portion so as to overlap the first grooves. This was the sample of Reference Example 2-1.

Figure 64:
FIG. 64 shows a cross-sectional profile of the sample of Reference Example 2-1.

FIG. 64 shows a cross-sectional profile of the sample of Reference Example 2-1 which was obtained by a laser microscope. In FIG. 64, the horizontal dot-chain line represents the position of the surface of the resin plate before formation of the groove structure. Also in this example, likewise as in the examples shown in FIG. 57, FIG. 59, FIG. 61 and FIG. 63, it was confirmed in a cross-sectional view that eight first recesses were formed. In the cross-sectional profile shown in FIG. 64, the average depth of the eight first recesses was about 30 μm.

It was found from the cross-sectional profiles of the samples of Example 2-1 to Example 2-4 (FIG. 57, FIG. 59, FIG. 61 and FIG. 63) that a plurality of apexes formed between two adjoining first grooves were at a position lower than the surface of the resin plate before formation of the groove structure also in these samples likewise as in the samples of Example 1-1 to Example 1-4 and Reference Example 1-1. Therefore, also in these samples, achievement of the anchoring effect at the interfaces between the lateral surfaces of the groove structure and the electrically-conductive material can be expected.

In comparison, as seen from the cross-sectional profile of the sample of Reference Example 2-1 (FIG. 64), the position of the bottom surface of the groove structure in the sample of Reference Example 2-1 is generally identical with the position of the surface of the resin plate before formation of the groove structure. This means that forming a wiring of a large aspect ratio is relatively difficult. In consideration of this, it can be said that the operation speed is preferably not excessively high from the viewpoint of placing the electrically-conductive material inside the groove structure and forming a wiring of the electrically-conductive material.

Evaluation 2 of Shape of Wirings

Next, also as for the configuration in which a plurality of first grooves and a plurality of second grooves were provided in the bottom portion of the groove structure, it was checked whether or not the wirings had a shape following the shape of the bottom portion of the groove structure.

Example 2-5

Likewise as in the sample of Example 1-5, the sixth portion of the groove structure was filled with an electrically-conductive paste and the electrically-conductive paste was cured. Thereby, the sample of Example 2-5 was produced which had a wiring formed of the electrically-conductive paste inside the sixth portion.

Figure 65:
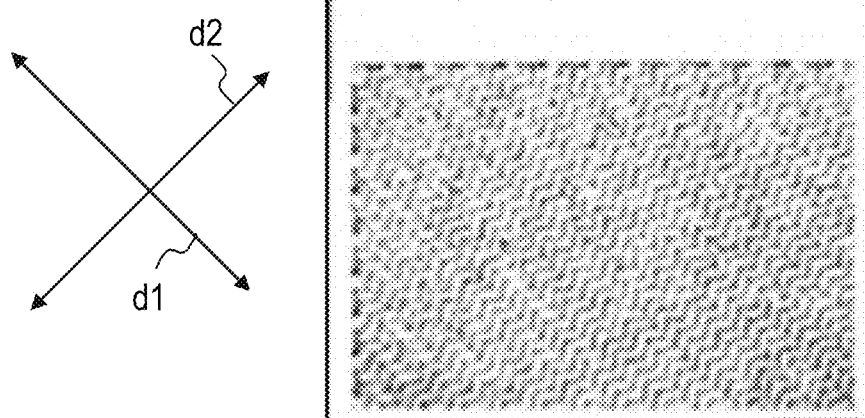
FIG. 65 shows a microscopic image of the sixth portion before being filled with an electrically-conductive paste.
Figure 66:
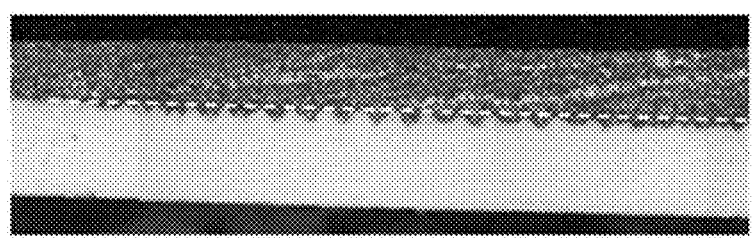
FIG. 66 shows a microscopic image of a cross section after the sixth portion was filled with an electrically-conductive paste and the electrically-conductive paste was cured.

FIG. 65 is a microscopic image showing the sixth portion before being filled with an electrically-conductive paste. In FIG. 65, seemingly, a plurality of grooves of a zig-zag shape are provided in the bottom portion of the groove structure although in actuality formation of a plurality of first grooves by scanning with a laser light beam along the first direction and formation of a plurality of second grooves by scanning with a laser light beam along the second direction were sequentially performed. In FIG. 65, a double-headed arrow d1 and a double-headed arrow d2 represent the first direction and the second direction, respectively. FIG. 66 shows a cross section after the sixth portion was filled with an electrically-conductive paste and the electrically-conductive paste was cured. In FIG. 66, a white broken line represents an approximate position of the bottom surface of the groove structure.

Example 2-6

The sample of Example 2-6 was produced in the same way as the sample of Example 2-5 except that the eighth portion of the sample of Example 2-3 was filled with an electrically-conductive paste. FIG. 67 is a microscopic image showing the eighth portion before being filled with an electrically-conductive paste. The sample of Example 2-6 was equal to the sample of Example 2-5 in that formation of a plurality of first grooves by scanning with a laser light beam along the first direction and formation of a plurality of second grooves by scanning with a laser light beam along the second direction were sequentially performed. FIG. 68 shows a cross section after the eighth portion was filled with an electrically-conductive paste and the electrically-conductive paste was cured. In FIG. 68, likewise as in FIG. 66, a white broken line represents an approximate position of the bottom surface of the groove structure.

Example 2-7

The sample of Example 2-7 was produced in the same way as the sample of Example 2-5 except that the ninth portion of the sample of Example 2-4 was filled with an electrically-conductive paste. FIG. 69 is a microscopic image showing the ninth portion before being filled with an electrically-conductive paste. Also in this example, likewise as the sample of Example 2-5 and the sample of Example 2-6, formation of a plurality of first grooves by scanning with a laser light beam along the first direction and formation of a plurality of second grooves by scanning with a laser light beam along the second direction were sequentially performed. FIG. 70 shows a cross section after the ninth portion was filled with an electrically-conductive paste and the electrically-conductive paste was cured. In FIG. 70, a white broken line represents an approximate position of the bottom surface of the groove structure.

It was found from the cross-sectional images of the samples of Example 2-5 to Example 2-7 (FIG. 66, FIG. 68 and FIG. 70) that, in each of the samples, part of the wiring was present inside the first grooves and the second recesses. Specifically, the wiring closely followed the shape of the bottom portion of the groove structure, and no void occurred between the wiring and the bottom portion of the groove structure.

Evaluation of Adhesion of Wirings

Next, simple evaluation of the adhesion of the wirings was carried out by a method compliant with a crosscut test defined by JIS K 5600-5-6 (1999) likewise as evaluation of the mechanical properties of a paint coating.

Example 3-1

First, a groove structure including seven rectangular portions having a bottom surface defined by a set of a plurality of first grooves was formed in a resin plate. The irradiation conditions of the laser light in this step are as follows:
Peak wavelength of the laser light: 532 nm;
Laser power: 0.3 W to 2.8 W;
Pulse width: 100 nanoseconds;
Frequency: 50 kHz;
Operation speed: 200 mm/s;
Defocus: 0 µm;
Pitch of the first grooves: 15 µm.

Hereinafter, the seven portions formed in this step are referred to as "eleventh portion", "twelfth portion", "thirteenth portion", "fourteenth portion", "fifteenth portion", "sixteenth portion" and "seventeenth portion". Herein, the laser power was adjusted such that the depth of the first grooves was different among the eleventh to seventeenth portions. The laser power in formation of the eleventh portion was 0.3 W. The dimension of the eleventh to seventeenth portions as viewed from the top was in the range of about 300 µm to about 500 µm.

Then, by scanning with a laser light beam in the second direction that meets the first direction, the bottom portion of the eleventh portion of the groove structure was irradiated with the laser light beam. Thereby, likewise as in the example shown in FIG. 5, a plurality of second grooves each extending in the second direction were formed in the bottom portion of the eleventh portion so as to overlap the first grooves. Herein, also, a direction selected as the second direction was perpendicular to the first direction. The irradiation conditions of the laser light in this step are as follows:
Peak wavelength of the laser light: 532 nm;
Laser power: 0.3 W;
Pulse width: 100 nanoseconds;
Frequency: 50 kHz;
Operation speed: 200 mm/s;
Defocus: 0 µm;
Pitch of the second grooves: 20 µm.

The depth of the second grooves was measured by cross-sectional image taken with the use of a laser microscope. The average depth of the second grooves was about 5 µm.

Then, likewise as in the sample of Example 1-5, the eleventh portion of the groove structure was filled with an electrically-conductive paste and the electrically-conductive paste was cured. Thereby, the sample of Example 3-1 was produced which had a wiring formed of the electrically-conductive paste inside the eleventh portion.

Example 3-2

A plurality of second grooves each extending in the second direction were formed in the bottom portion of the twelfth portion so as to overlap the first grooves in the same way as the sample of Example 3-1 except that, of the laser light irradiation conditions, the laser power was changed to 0.6 W so as to increase the depth of the first grooves and the depth of the second grooves. The depth of the second grooves was measured by cross-sectional image taken with the use of a laser microscope. The average depth of the second grooves was about 10 µm.

Then, likewise as in the sample of Example 3-1, the twelfth portion of the groove structure was filled with an electrically-conductive paste and the electrically-conductive paste was cured. Thereby, the sample of Example 3-2 was produced which had a wiring formed of the electrically-conductive paste inside the twelfth portion.

Example 3-3

A plurality of second grooves each extending in the second direction were formed in the bottom portion of the thirteenth portion so as to overlap the first grooves in the same way as the sample of Example 3-1 except that, of the laser light irradiation conditions, the laser power was changed to 1.2 W so as to increase the depth of the first grooves and the depth of the second grooves. The depth of the second grooves was measured by cross-sectional image taken with the use of a laser microscope. The average depth of the second grooves was about 25 µm.

Then, likewise as in the sample of Example 3-1, the thirteenth portion of the groove structure was filled with an electrically-conductive paste and the electrically-conductive paste was cured. Thereby, the sample of Example 3-3 was produced which had a wiring formed of the electrically-conductive paste inside the thirteenth portion.

Example 3-4

A plurality of second grooves each extending in the second direction were formed in the bottom portion of the fourteenth portion so as to overlap the first grooves in the same way as the sample of Example 3-1 except that, of the laser light irradiation conditions, the laser power was changed to 2.4 W so as to increase the depth of the first grooves and the depth of the second grooves. The depth of the second grooves was measured by cross-sectional image taken with the use of a laser microscope. The average depth of the second grooves was about 50 µm.

Then, likewise as in the sample of Example 3-1, the fourteenth portion of the groove structure was filled with an electrically-conductive paste and the electrically-conductive paste was cured. Thereby, the sample of Example 3-4 was produced which had a wiring formed of the electrically-conductive paste inside the fourteenth portion.

Comparative Example 3-1

The fifteenth portion which had a plurality of first grooves each extending in the first direction was formed in the same way as the sample of Example 3-1 except that, in formation of the first grooves, the laser light irradiation conditions were changed so as to decrease the depth of the first grooves. In formation of the plurality of first grooves, herein, the laser power was changed to 0.2 W. Note that, herein, a plurality of second grooves were not formed. The depth of the first grooves was measured by cross-sectional image taken with the use of a laser microscope. The average depth of the first grooves was about 1.5 µm.

Then, likewise as in the sample of Example 3-1, the fifteenth portion of the groove structure was filled with an electrically-conductive paste and the electrically-conductive paste was cured. Thereby, the sample of Comparative Example 3-1 was produced which had a wiring formed of the electrically-conductive paste inside the fifteenth portion.

Comparative Example 3-2

The sixteenth portion which had a plurality of first grooves each extending in the first direction was formed in the same way as the sample of Comparative Example 3-1 except that the laser light irradiation conditions were changed such that the depth of the first grooves is smaller than in the sample of Example 3-1. In formation of the plurality of first grooves, herein, the laser power was changed to 0.2 W.

Then, by scanning with a laser light beam in the second direction that meets the first direction, the bottom portion of the sixteenth portion of the groove structure was irradiated with the laser light beam. Thereby, likewise as in the example shown in FIG. 5, a plurality of second grooves each extending in the second direction were formed in the bottom portion of the sixteenth portion so as to overlap the first grooves. Herein, also, a direction selected as the second direction was perpendicular to the first direction. The irradiation conditions of the laser light in this step are the same as those for formation of the first grooves except that the laser power was 0.2 W and the pitch of the second grooves was 20 µm. The depth of the second grooves was measured by cross-sectional image taken with the use of a laser microscope. The average depth of the second grooves was about 3 µm.

Then, likewise as in the sample of Example 3-1, the sixteenth portion of the groove structure was filled with an electrically-conductive paste and the electrically-conductive paste was cured. Thereby, the sample of Comparative Example 3-2 was produced which had a wiring formed of the electrically-conductive paste inside the sixteenth portion.

Comparative Example 3-3

The seventeenth portion which had a plurality of first grooves each extending in the first direction was formed in the same way as the sample of Example 3-1 except that, in formation of the first grooves, the laser light irradiation conditions were changed so as to increase the depth of the first grooves. In formation of the plurality of first grooves, herein, the laser power was changed to 2.8 W.

Then, by scanning with a laser light beam in the second direction that meets the first direction, the bottom portion of the seventeenth portion of the groove structure was irradiated with the laser light beam under the same laser light irradiation conditions as those for the sample of Comparative Example 3-2 except that the laser power was 2.8 W, whereby a plurality of second grooves were formed in the bottom portion of the seventeenth portion so as to overlap the first grooves. The depth of the second grooves was measured by cross-sectional image taken with the use of a laser microscope. The average depth of the second grooves was about 60 µm.

Then, in the same way as the sample of Example 3-1, we attempted to fill the seventeenth portion of the groove structure with an electrically-conductive paste. However, the inside of the seventeenth portion was not sufficiently filled with the electrically-conductive paste. After the electrically-conductive paste was cured, a wiring pattern of a desired shape was not formed.

Then, in each of the samples of Example 3-1 to Example 3-4, Comparative Example 3-1 and Comparative. Example 3-2, grooves are formed in the form of a grid using a cutter in a wiring so as to reach the bottom surface of the groove structure, whereby 25 rectangular sections in total were formed. In this step, the grooves were formed in the wiring at a pitch of about 1 mm.

Then, a cellophane tape was placed onto the surface of the wiring so as to cover the plurality of sections formed in the wiring. Before five minutes elapsed since the tape was placed, the tape was peeled off in the normal direction of the surface of the wiring. Of the 25 sections formed in the wiring, the proportion of sections in which the wiring was adhered to the tape and separated from the resin plate was checked, whereby the adhesion of the wiring was evaluated.

In the sample of Example 3-1, separation was found in only one of the 25 sections. In each of the samples of Example 3-2 to Example 3-4, separation was not found in any of the 25 sections. Meanwhile, in the sample of Comparative Example 3-1 and the sample of Comparative Example 3-2, separation was found in 12.5 sections and 5 sections, respectively, out of the 25 sections.

Figure 71:
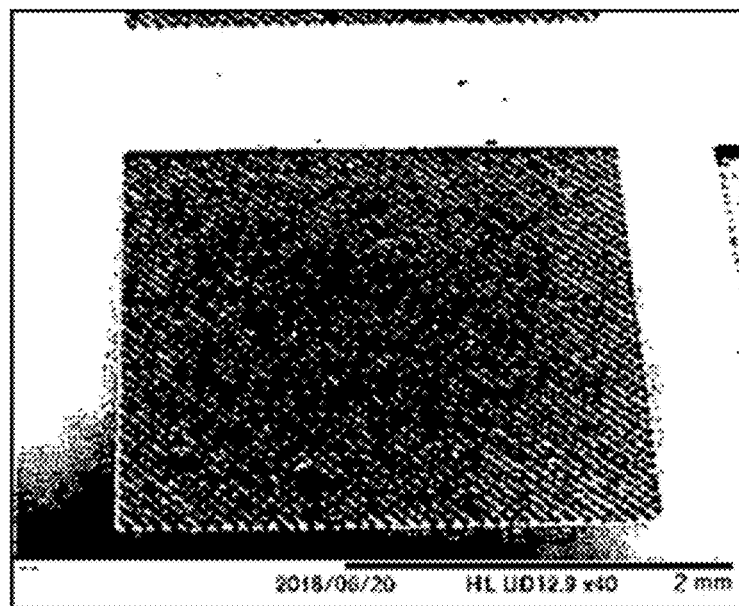
FIG. 71 shows a microscopic image of a bottom surface of a groove structure of the sample of Example 3-3 before being filled with an electrically-conductive paste.
Figure 72:
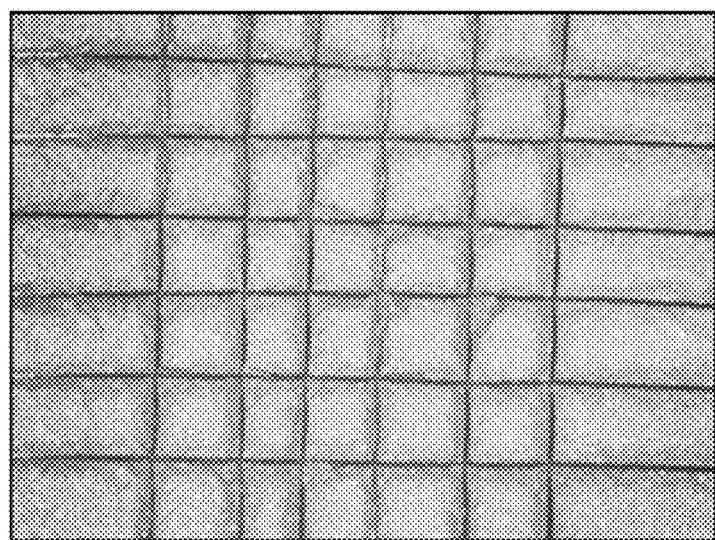
FIG. 72 is a plan view showing the external appearance of a wiring after the tape was peeled off in the sample of Example 3-3.
Figure 73:
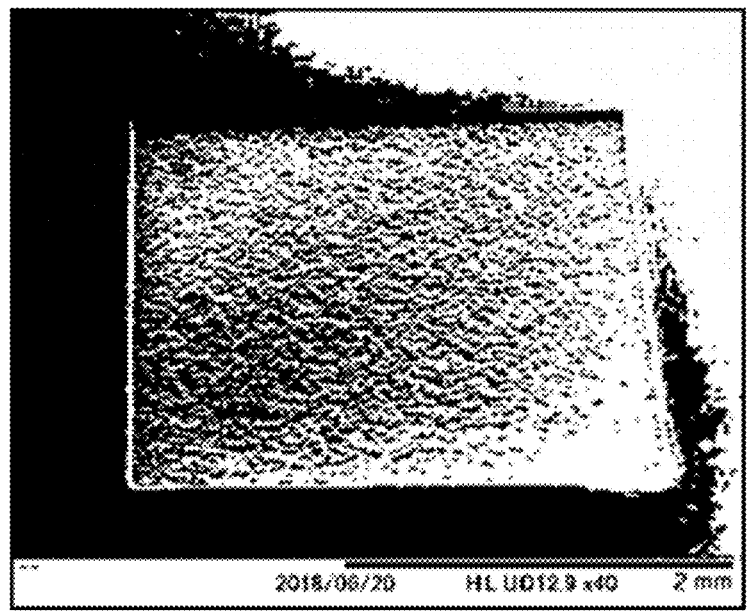
FIG. 73 shows a microscopic image of a bottom surface of a groove structure of the sample of Comparative Example 3-1 before being filled with an electrically-conductive paste.
Figure 74:
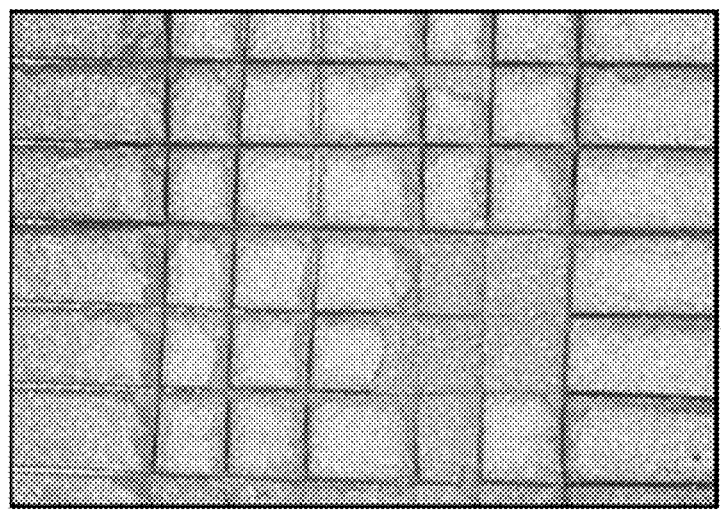
FIG. 74 is a plan view showing the external appearance of a wiring after the tape was peeled off in the sample of Comparative Example 3-2.

FIG. 71 is an enlarged microscopic image showing the bottom surface of the groove structure of the sample of Example 3-3 before being filled with an electrically-conductive paste. FIG. 72 shows the external appearance of the wiring after the tape was peeled off in the sample of Example 3-3. FIG. 73 is an enlarged microscopic image showing the bottom surface of the groove structure of the sample of Comparative Example 3-1 before being filled with an electrically-conductive paste. FIG. 74 shows the external appearance of the wiring after the tape was peeled off in the sample of Comparative Example 3-2.

As seen from the results after the tape was peeled off, formation of the second grooves can provide the effect of preventing separation of the wiring due to the anchoring effect. Particularly, when the depth of the second grooves is not less than 5 µm, it is advantageous in preventing separation of the wiring. It was also found that although a greater anchoring effect is likely to be achieved as the second grooves are deeper, keeping the depth of the second grooves so as not to exceed 60 µm is advantageous in forming a wiring of a desired shape.

Evaluation of Moldability of Groove Structure and Wirings

Next, a light-emitting structure was prepared which was similar to the light-emitting structures 200Af shown in FIG. 26. A groove structure and wirings were formed on the lower surface side of the light-emitting structure through the procedures of the groove structure formation step and the wiring formation step of the above-described embodiment, and the moldability of the groove structure and the wirings was evaluated. Herein, before the groove structure was formed, the lower surfaces of the electrodes of a light-emitting element (the lower surface 221b of the first electrode 221 and the lower surface 222b of the second electrode 222) was exposed out of the lower surface of the light-emitting structure used for evaluation.

Example 4-1

After the light-emitting structure was prepared, the lower surface of the light-emitting structure was scanned with a laser light beam in a certain direction (first direction) such that a plurality of first grooves each extending in the first direction were formed. By scanning with the laser light beam, part of the light-reflective member and part of the electrodes of the light-emitting element were removed, whereby a groove structure was formed in the lower surface of the light-emitting structure such that the groove structure had a bottom surface defined by a set of the plurality of first grooves. The irradiation conditions of the laser light in this step are as follows:

Peak wavelength of the laser light: 532 nm;
Laser power: 2.4 W;
Pulse width: 100 nanoseconds;
Frequency: 50 kHz;
Operation speed: 200 mm/s;
Defocus: 0 µm;
Pitch of the first grooves: 15 µm or 30 µm.

Then, the bottom portion of the groove structure was further irradiated with a laser light beam by scanning with the laser light beam in the second direction that meets the first direction. Thereby, a plurality of first recesses in the dot shapes, which were the same as those of the example shown in FIG. 4, were formed in the bottom portion of the groove structure. Herein, a direction selected as the second direction was perpendicular to the first direction. When viewed from the top, each of the first recesses had a diameter of about 0.1 mm. The irradiation conditions of the laser light in this step are as follows:

Peak wavelength of the laser light: 532 nm;
Laser power: 2.4 W;
Pulse width: 100 nanoseconds;
Frequency: 50 kHz;
Operation speed: 200 mm/s;
Defocus: 0 µm;
Distance between the centers of the first recesses: 15 µm.

Figure 75:
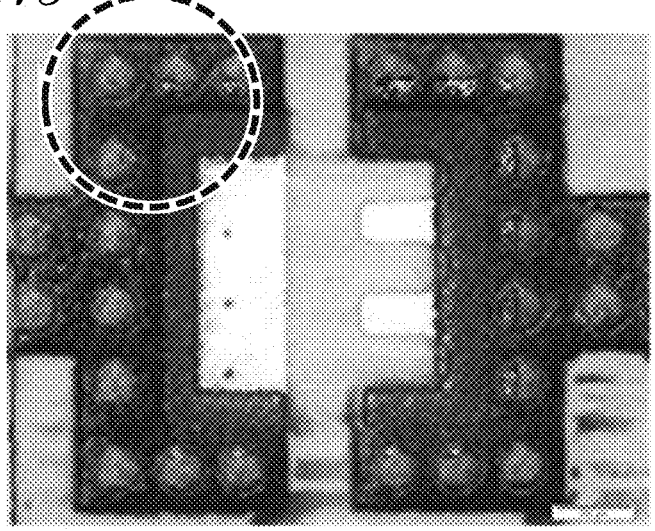
FIG. 75 shows a microscopic image of a bottom surface of a light-emitting structure after the groove structure formation step was performed.
Figure 76:
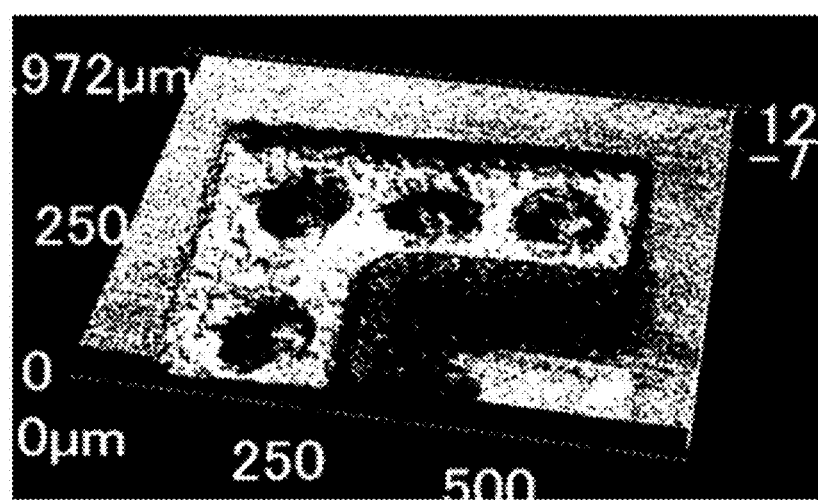
FIG. 76 shows an image of a portion enclosed by a broken circle shown in FIG. 75, which was obtained by a laser microscope.
Figure 77:
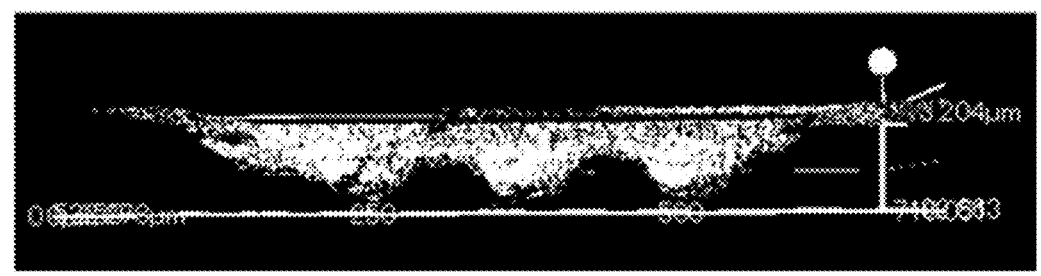
FIG. 77 shows an image of a cross section of a groove structure, which was obtained by a laser microscope.

FIG. 75 shows a bottom surface of a light-emitting structure after the groove structure formation step was performed. FIG. 76 shows an image of a portion enclosed by a broken circle shown in FIG. 75, which was obtained by a laser microscope. FIG. 77 shows an image of a cross section of a groove structure, which was obtained by a laser microscope. FIG. 77 shows a cross section of a portion formed in the light-reflective member of the groove structure.

Figure 78:
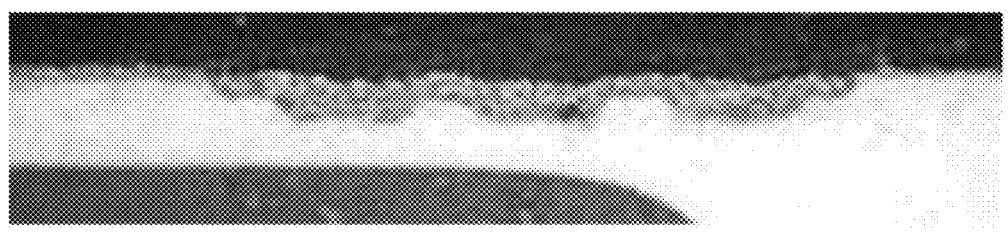
FIG. 78 shows a microscopic image of a cross section of the sample of Example 4-1 after the electrically-conductive paste was cured.

Then, in the same way as the sample of Example 1-5, the groove structure was filled with an electrically-conductive paste, and the electrically-conductive paste was cured, whereby a wiring was formed in the groove structure (corresponding to the previously-described wiring formation step), resulting in the sample of Example 4-1. FIG. 78 shows a cross section after the groove structure was filled with the electrically-conductive paste and the electrically-conductive paste was cured.

Example 4-2

The sample of Example 4-2 was produced in the same way as the sample of Example 4-1 except that, instead of forming a plurality of first recesses, a plurality of second grooves each extending in the second direction were further formed in the bottom portion of the groove structure by irradiating the bottom portion of the groove structure with laser light by scanning with a laser light beam in the second direction that is different from the first direction. The irradiation conditions of the laser light in formation of the plurality of second grooves are as follows. Herein, also, a direction selected as the second direction was perpendicular to the first direction.

Peak wavelength of the laser light: 532 nm;
Laser power: 2.4 W;
Pulse width: 100 nanoseconds;
Frequency: 50 kHz;
Operation speed: 200 mm/s;
Defocus: 0 µm;
Pitch of the second grooves: 50 µm.

Figure 79:
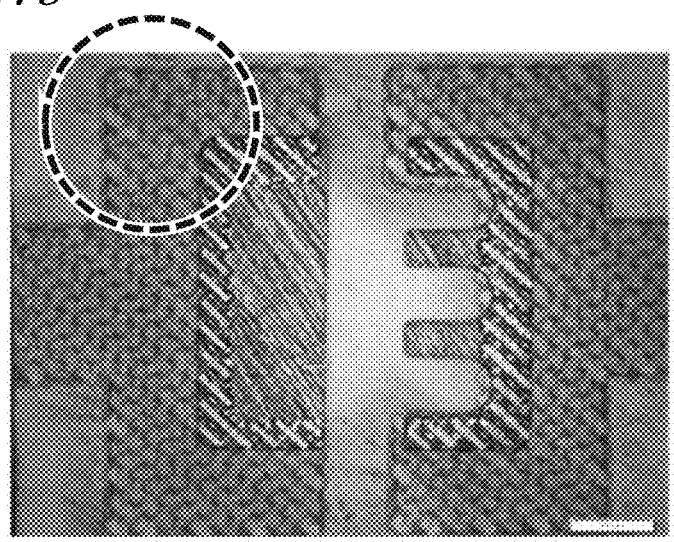
FIG. 79 shows a microscopic image of a bottom surface of a light-emitting structure after the groove structure formation step was performed but before the wiring formation step was performed.
Figure 80:
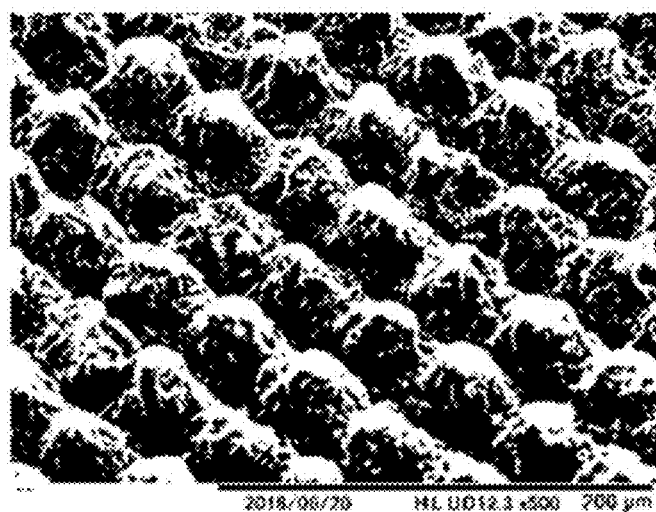
FIG. 80 shows a SEM image of part of a bottom portion of a groove structure.
Figure 81:
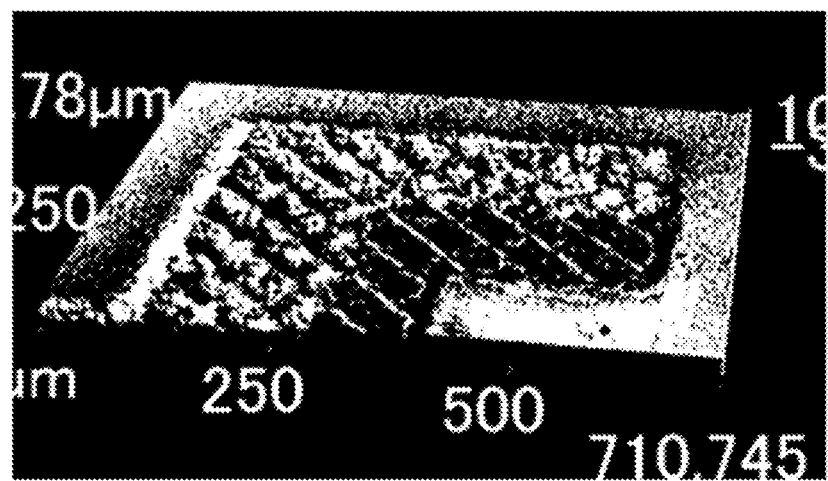
FIG. 81 shows an image of a portion enclosed by a broken circle shown in FIG. 79, which was obtained by a laser microscope.
Figure 82:
FIG. 82 shows an image of a cross section of a groove structure, which was obtained by a laser microscope.

FIG. 79 shows a bottom surface of a light-emitting structure after the groove structure formation step was performed but before the wiring formation step was performed. FIG. 80 shows a SEM image of part of a bottom portion of a groove structure. FIG. 81 shows an image of a portion enclosed by a broken circle shown in FIG. 79, which was obtained by a laser microscope. FIG. 82 shows an image of a cross section of a groove structure, which was obtained by a laser microscope. FIG. 80 and FIG. 82 each shows a cross section of a portion formed in the light-reflective member of the groove structure as does FIG. 77.

Figure 83:
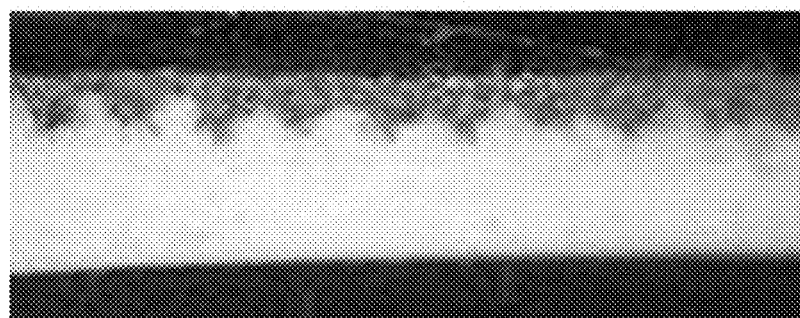
FIG. 83 shows a microscopic image of a cross section of the sample of Example 4-2 after the electrically-conductive paste was cured.

After the groove structure was formed, the groove structure was filled with an electrically-conductive paste, and the electrically-conductive paste was cured, whereby a wiring was formed in the groove structure as in the sample of Example 4-1. FIG. 83 shows a cross section after the groove structure was filled with the electrically-conductive paste and the electrically-conductive paste was cured.

Reference Example 4-1

Figure 84:
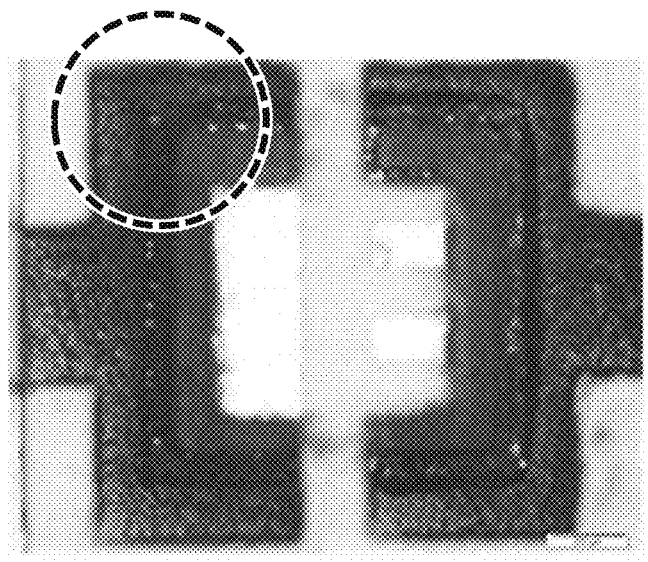
FIG. 84 shows a microscopic image of a bottom surface of a light-emitting structure after the groove structure formation step was performed but before the wiring formation step was performed.
Figure 85:
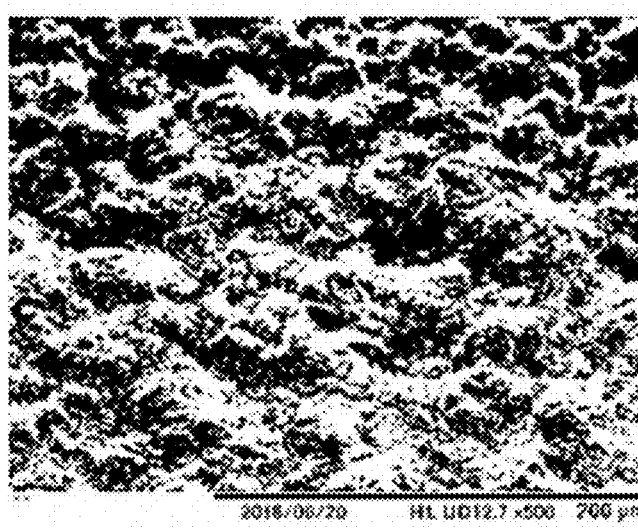
FIG. 85 shows a SEM image of part of a bottom portion of a groove structure.
Figure 86:
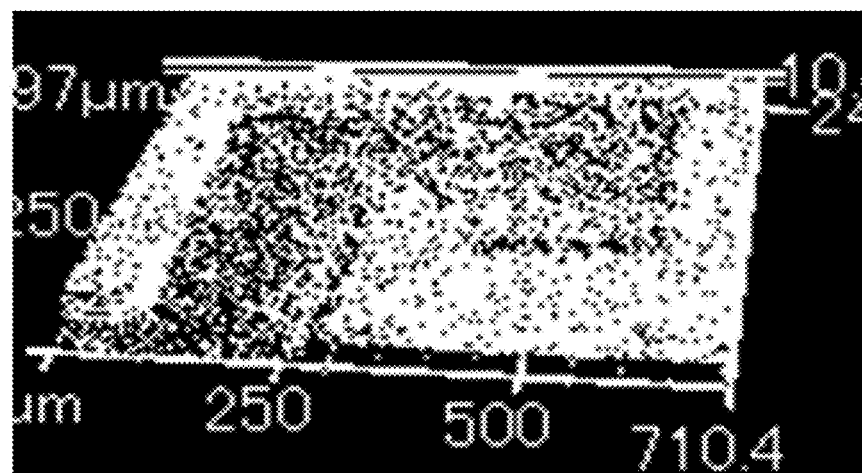
FIG. 86 shows an image of a portion enclosed by a broken circle shown in FIG. 84, which was obtained by a laser microscope.
Figure 87:
FIG. 87 shows an image of a cross section of a groove structure, which was obtained by a laser microscope.

After the plurality of first grooves were formed, the sample of Reference Example 4-1 was produced in the same way as the sample of Example 4-1 except that none of the plurality of first recesses and the plurality of second grooves was formed. FIG. 84 shows a bottom surface of a light-emitting structure after the groove structure formation step was performed but before the wiring formation step was performed. FIG. 85 shows a SEM image of part of a bottom portion of a groove structure. FIG. 86 shows an image of a portion enclosed by a broken circle shown in FIG. 84, which was obtained by a laser microscope. FIG. 87 shows an image of a cross section of a groove structure, which was obtained by a laser microscope. FIG. 85 and FIG. 87 each shows a cross section of a portion formed in the light-reflective member of the groove structure as does FIG. 77.

Figure 88:
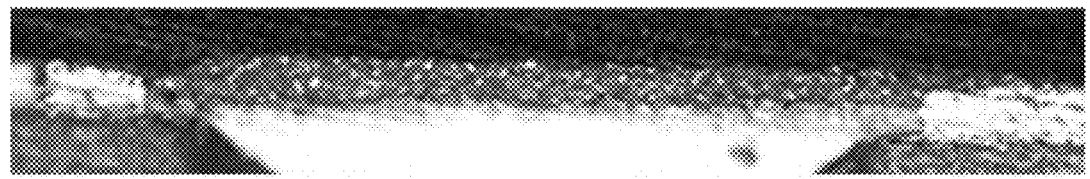
FIG. 88 shows a microscopic image of a cross section of the sample of Reference Example 4-1 after the electrically-conductive paste was cured.

After the groove structure was formed, the groove structure was filled with an electrically-conductive paste, and the electrically-conductive paste was cured, whereby a wiring was formed in the groove structure as in the sample of Example 4-1. FIG. 88 shows a cross section after the groove structure was filled with the electrically-conductive paste and the electrically-conductive paste was cured.

As seen from the cross-sectional image of the sample of Example 4-1 shown in FIG. 78, part of the wiring was present inside the first grooves and inside the first recesses in the sample of Example 4-1. Also, as seen from the cross-sectional image of the sample of Example 4-2 shown in FIG. 83, part of the wiring was present inside the first grooves and inside the second grooves in the sample of Example 4-2. That is, in these samples, the shape of the wiring closely followed the shape of the bottom portion of the groove structure. Thus, a high anchoring effect between the wiring and the bottom portion of the groove structure can be expected.

It was found from FIG. 85 and FIG. 86 that, in the sample of Reference Example 4-1, the bottom surface of the groove structure had a relatively smooth shape. As seen from FIG. 88, also in the sample of Reference Example 4-1, no void occurred between the wiring and the bottom portion of the groove structure.

According to the embodiments of the present disclosure, a substrate which has complicated wiring patterns is basically unnecessary, and a light-emitting device which can be easily mounted is provided. The embodiments of the present disclosure are broadly applicable to various light sources for lighting purposes, on-board light sources, light sources for backlights, etc.

While certain embodiments of the present invention has been described above, it will be apparent to those skilled in the art that the invention may be modified in numerous ways and may assume many embodiments other than those specifically described above. Accordingly, it is intended by the appended claims to cover all modifications of the invention that fall within the spirit and scope of the invention.

What is claimed is:

1. A light-emitting device comprising:
a light-emitting module including one or more light-emitting elements and a package covering the one or more light-emitting elements, each of the one or more light-emitting elements having a first electrode and a second electrode, the light-emitting module having a groove structure on a lower surface side of the light-emitting module; and
a first wiring and a second wiring which are partially or entirely present in the groove structure,
wherein at least part of the first electrode and at least part of the second electrode are in contact with an inside of the groove structure,
the first wiring is electrically connected with the first electrode, and
the second wiring is electrically connected with the second electrode.

2. The light-emitting device of claim 1, wherein the groove structure has a bottom surface which has surface unevenness.

3. The light-emitting device of claim 2, wherein the bottom surface of the groove structure includes a set of a plurality of first grooves.

4. The light-emitting device of claim 3, wherein the bottom surface of the groove structure is formed by the set of the plurality of first grooves, and further defines a plurality of second grooves each extending in a direction different from an extending direction of the plurality of first grooves.

5. The light-emitting device of claim 1, wherein a surface of the first wiring and a surface of the second wiring are substantially coplanar with a lower surface of the package.

6. The light-emitting device of claim 1, wherein part of the first electrode which is in contact with the inside the groove structure and part of the second electrode which is in contact with the inside the groove structure each have a stepped portion.

7. The light-emitting device of claim 1, wherein
the package includes
a covering member covering the one or more light-emitting elements except for part of the first electrode and part of the second electrode, and
a resin layer provided on a side of the covering member which is closer to a lower surface of the package, the resin layer defining an opening,
the groove structure is a structure defined by the opening of the resin layer, and part of the first wiring and part of the second wiring are present inside the opening of the resin layer.

* * * * *